US012769253B2

(12) United States Patent
Lin et al.

(10) Patent No.: US 12,769,253 B2
(45) Date of Patent: Oct. 20, 2026

(54) WATER-RESISTANT ASSEMBLY AND ELECTRONIC DEVICE

(71) Applicant: HUAWEI TECHNOLOGIES CO., LTD., Shenzhen (CN)

(72) Inventors: Nan Lin, Dongguan (CN); Menglong Zhao, Xi'an (CN); Wenjian Yang, Dongguan (CN); Zhuang Liu, Dongguan (CN); Kemin Zhang, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 184 days.

(21) Appl. No.: 18/837,859

(22) PCT Filed: Jan. 29, 2023

(86) PCT No.: PCT/CN2023/073682

§ 371 (c)(1),
(2) Date: Aug. 12, 2024

(87) PCT Pub. No.: WO2023/151470

PCT Pub. Date: Aug. 17, 2023

(65) Prior Publication Data

US 2025/0199479 A1 Jun. 19, 2025

(30) Foreign Application Priority Data

Feb. 12, 2022 (CN) ......................... 202210130974.6

(51) Int. Cl.
*G04B 37/08* (2006.01)
*G04G 17/08* (2006.01)
(Continued)

(52) U.S. Cl.
CPC ............. *G04B 37/08* (2013.01); *G04G 17/08* (2013.01); *H01H 15/102* (2013.01);
(Continued)

(58) Field of Classification Search
CPC ...... G04B 37/08; G04B 37/081; G04G 17/08; H01H 15/102; A45C 11/22
See application file for complete search history.

(56) References Cited

U.S. PATENT DOCUMENTS 1,295,023 A * 2/1919 Golden ................ G04B 37/103
968/340
1,910,908 A * 5/1933 Weingartner ........ G04B 37/103
968/340

(Continued)

FOREIGN PATENT DOCUMENTS

CN 105390631 B 10/2018

*Primary Examiner* — Sean Kayes

(74) *Attorney, Agent, or Firm* — Leydig, Voit & Mayer, Ltd.

(57) ABSTRACT

A water-resistant assembly is provided which, is mounted to a housing of an electronic device. A switch in the water-resistant assembly can move under an external force, so that an inner cavity of the electronic device is connected to or disconnected from outside. The electronic device includes a housing, a water-resistant and breathable film, and the water-resistant assembly. The housing encloses a housing space, the housing has a housing through hole, and one end of the housing through hole is connected to the housing space through the water-resistant and breathable film. The water-resistant assembly is located at one end that is of the housing through hole and that is far away from the water-resistant and breathable film. According to the application, the electronic device is enabled to operate reliably in both a daily scenario and a high water pressure scenario.

20 Claims, 67 Drawing Sheets

(51) Int. Cl.

| | |
|---|---|
| ***H01H 15/10*** | (2006.01) |
| ***H05K 5/06*** | (2006.01) |
| *H04R 1/02* | (2006.01) |
| *H04R 1/08* | (2006.01) |

(52) U.S. Cl.
CPC ............. *H05K 5/069* (2013.01); *H04R 1/023* (2013.01); *H04R 1/028* (2013.01); *H04R 1/086* (2013.01); *H04R 2499/15* (2013.01)

(56) References Cited

U.S. PATENT DOCUMENTS

| | | | | |
|---|---|---|---|---|
| 2,705,738 | A * | 4/1955 | Triplett | G01R 1/02<br>968/313 |
| 11,516,934 | B2 * | 11/2022 | Yang | H05K 5/03 |
| 2018/0352928 | A1 | 12/2018 | Wright et al. | |
| 2019/0191580 | A1 * | 6/2019 | Yang | H05K 5/03 |

* cited by examiner

WATER-RESISTANT ASSEMBLY AND ELECTRONIC DEVICE

CROSS-REFERENCE TO RELATED APPLICATIONS

This application is a national stage of International Application No. PCT/CN2023/073682, filed on Jan. 29, 2023, which claims priority to Chinese Patent Application No. 202210130974.6, filed on Feb. 12, 2022. Both of the aforementioned applications are hereby incorporated by reference in their entireties.

TECHNICAL FIELD

Embodiments of this application relate to the field of electronic device technologies, and in particular, to a water-resistant assembly and an electronic device.

BACKGROUND

A through hole often needs to be provided in a housing of an electronic device to connect an internal space of the housing of the device to external air, so as to implement a specific function. For example, a microphone in the housing of the electronic device needs to collect external sound by using a sound pickup hole. For another example, a component sensitive to air pressure in the electronic device, for example, a speaker, needs to be provided with a through hole in the housing of the device, so as to be breathable and balance air pressure inside and outside the electronic device. In addition, the electronic device has water-resistant requirements. Therefore, a water-resistant and breathable film may be usually provided on one side of the through hole. Because the water-resistant and breathable film can allow gas to pass through and prevent liquid from passing through, such performance can meet breathable and water-resistant requirements of the electronic device in daily use.

When used in a high water pressure scenario like swimming or diving, the electronic device needs to have higher water-resistant performance. However, the water-resistant and breathable film is prone to damage in the high water pressure scenario, which leads to water leakage into the electronic device, and therefore cannot meet a use requirement in such scenario. There is need to design a water-resistant assembly for the electronic device to protect a water-resistant and breathable film in the high water pressure scenario.

SUMMARY

To resolve a problem that a conventional electronic device is prone to water leakage in a high water pressure scenario and cannot work reliably, embodiments of this application provide a water-resistant assembly and an electronic device, so as to make a product water-resistant in a high water pressure scenario and meet a use requirement in the high water pressure scenario.

According to a first aspect, an embodiment of this application provides a water-resistant assembly. The water-resistant assembly is mounted to a housing of the electronic device. The housing has a housing through hole that connects inside to outside of the housing. The water-resistant assembly includes a switch, a clamping bar, a sealing member, and an elastic member. After the water-resistant assembly is mounted to the housing, the switch, the clamping bar, the sealing member, and the elastic member are sequentially disposed from the outside to the inside of the housing. Two ends of the elastic member respectively press against the clamping bar and the housing. The sealing member, the housing through hole, and a water-resistant and breathable film on a side that is of the housing through hole and that is far away from the sealing member are disposed opposite to each other. The switch is capable of moving in a first direction under an external force, so that the clamping bar moves in a second direction under a joint action of the switch and the elastic member, so as to drive the sealing member to approach and block the housing through hole or keep away from the housing through hole.

In this solution, the switch and the clamping bar may be directly connected, or may be in indirect contact by using another component. A movement of the switch may be transmitted to the clamping bar. A movement mode of the switch is not limited to the movement and rotation. The first direction of the switch and the second direction of the clamping bar each are bidirectional, including a forward direction and a reverse direction. For example, the first direction may be a left-right direction and include a left direction (for example, a forward direction) and a right direction (for example, a reverse direction). Alternatively, the first direction may be a rotation direction and include a clockwise direction (for example, a forward direction) and an anticlockwise direction (for example, a reverse direction). A relationship between the first direction and the second direction may not be limited. For example, the first direction and the second direction may intersect (including perpendicular) or be parallel. There may be at least one clamping bar and at least one sealing member. The sealing member may be directly fastened to the clamping bar or connected to the clamping bar by another component. One clamping bar may be directly connected or indirectly connected to at least one sealing member, and one sealing member may correspond to one housing through hole. The elastic member may provide an elastic restoring force for the clamping bar.

In this solution, a component sensitive to air pressure, for example, a speaker, and a component that needs to connect to outside atmosphere, for example, a microphone, may be disposed in the housing. In a daily scenario, the switch drives the clamping bar and the sealing member to move to unblock the housing through hole, so that an inner cavity of the housing can be connected to the outside atmosphere, to balance air pressure inside and outside the electronic device and meet an operating requirement of the component. Because the water-resistant and breathable film exists, external liquid cannot enter the electronic device, so that the electronic device can be breathable and water-resistant in a daily scenario. When a user wears the electronic device during swimming and diving, the electronic device is in a high water pressure scenario. In this case, the switch drives the clamping bar and the sealing member to move to block the housing through hole, so as to disconnect the inner cavity of the housing from the outside, and ensure that external gas and liquid cannot enter the electronic device through the housing through hole. In this way, the water-resistant and breathable film at a housing through hole side does not need to withstand high pressure, and is not prone to damage, so that the electronic device can operate reliably in the high water pressure scenario.

In an implementation of the first aspect, the first direction is perpendicular or parallel to the second direction; and the switch is capable of moving in the first direction under the external force. In this solution, the switch can basically move (translated) on a same plane, or can move in a three-dimensional space (a compound movement, for example, moving on a horizontal plane and lifting on a vertical plane). In this solution, a mechanism design is simple, a motion transfer requirement can be met, and a smaller structure space is occupied.

In an implementation of the first aspect, the first direction is perpendicular to the second direction. The clamping bar has a clamping bar slope. The switch is in sliding contact with the clamping bar slope. In this solution, the mechanism design is simple, a mechanism movement is reliable, the motion transfer requirement can be met, and the smaller structure space is occupied.

In an implementation of the first aspect, the clamping bar has a limiting groove. When the switch is translated to a first limit position in the first direction, the sealing member approaches and blocks the housing through hole, and the switch is clamped into the limiting groove, so that the switch is locked at the first limit position. In this solution, the switch is reliably kept at a locking position, and sealing performance of the sealing member is ensured, so that the electronic device can operate reliably in the high water pressure scenario.

In an implementation of the first aspect, the water-resistant assembly includes a limiting post, and the limiting post is mounted to the housing. A limiting groove is provided on a surface that is of the switch and that faces the limiting post. When the switch is translated to a first limit position in the first direction, the sealing member approaches and blocks the housing through hole, and the limiting groove is clamped with the limiting post, so that the switch is locked at the first limit position. In this solution, the limiting post itself may be elastically deformed (for example, elastically scaled), to implement detachable clamping of the limiting post and the limiting groove based on the elastic deformation of the limiting post. Alternatively, the limiting post itself cannot be elastically deformed, but can be lifted and lowered relative to the housing by using the elastic member or the like, to implement detachable clamping of the limiting post and the limiting groove. In this solution, the switch is reliably kept at a locking position, and sealing performance of the sealing member is ensured, so that the electronic device can operate reliably in the high water pressure scenario.

In an implementation of the first aspect, after the limiting post is mounted to the housing, the limiting post is capable of moving relative to the housing in the second direction. In a process in which the switch is translated to the first limit position in the first direction, the switch is capable of pressing the limiting post toward the housing until the limiting groove is clamped with the limiting post. This solution provides another locking design for the switch. In this solution, the switch is reliably kept at the locking position, and the sealing performance of the sealing member is ensured, so that the electronic device can operate reliably in the high water pressure scenario.

In an implementation of the first aspect, the water-resistant assembly includes a loading frame and a limiting post elastic member. The loading frame is mounted to the housing, and is located between the housing and the switch. The loading frame has an accommodation groove, a bottom wall of the accommodation groove faces the switch, and an accommodation through hole connected to the accommodation groove is provided in the bottom wall. The limiting post includes a post body and a limiting skirt that surrounds an outer circumferential surface of the post body. A part of the post body is accommodated in the accommodation groove. One end of the post body is exposed from the accommodation through hole. The limiting skirt is accommodated in the accommodation groove and is in contact with the bottom wall. The limiting post elastic member is located in the accommodation groove. The limiting post elastic member presses against the limiting skirt and applies an elastic force to the limiting skirt. In the process in which the switch is translated to the first limit position in the first direction, the switch is capable of squeezing the end, to press the limiting post toward the housing until the limiting groove is clamped with the end. This solution provides a specific mounting structure for the limiting post. The limiting post has a simple and reliable structure design and high mass production, and can meet a product requirement.

In an implementation of the first aspect, the switch has a switch slope, and the switch slope is in sliding contact with the clamping bar slope. In this solution, the switch also has a slope, and the sliding contact between the switch slope and the clamping bar slope has advantages of a smooth movement and small wear on the clamping bar.

In an implementation of the first aspect, the switch is capable of rotating in the first direction under the external force, and the clamping bar is in sliding contact with the switch. In this solution, a mechanism design is simple, a mechanism movement is reliable, and a motion transfer requirement and a specific product requirement can be met.

In an implementation of the first aspect, the switch has a cam surface, cam radii of positions on the cam surface are different, and the cam surface is in sliding contact with the clamping bar. In a process in which the switch rotates in the first direction, the cam radii of the positions that are on the cam surface and that are in sequential contact with the clamping bar gradually increase, so that the sealing member approaches and blocks the housing through hole; or the cam radii of the positions that are on the cam surface and that are in sequential contact with the clamping bar gradually decrease, so that the sealing member is far away from the housing through hole. In this solution, the switch and the clamping bar can form a cam mechanism, the mechanism design is simple, the mechanism movement is reliable, and the motion transfer requirement and the specific product requirement can be met.

In an implementation of the first aspect, the water-resistant assembly includes a bracket and a pin shaft. A partial region of the bracket is hollowed out to form an accommodation space, and the bracket is fastened to the housing. The pin shaft passes through the accommodation space and is fastened to the bracket, and the pin shaft passes through the switch and is rotatably connected to the switch. When the switch rotates in the first direction to a limit position, the switch is in contact with the bracket, and a position that is on the switch and in contact with the bracket and a position that is on the switch and in contact with the clamping bar are respectively located on two sides of the pin shaft. In this solution, when the switch rotates to the limit position (the sealing member blocks the housing through hole or is far away from the housing through hole), the bracket and the clamping bar apply reverse torque to the switch, so that the switch can be kept at a balanced state and is reliably locked at the limit position. Therefore, in this solution, sealing performance of the sealing member can be ensured, so that the electronic device can operate reliably in a high water pressure scenario.

In an implementation of the first aspect, when the switch moves in the first direction until the sealing member is enabled to approach and block the housing through hole, at least a part of projection of a force-bearing position on the clamping bar along a center line of the housing through hole falls into the housing through hole, where a force is exerted on the force-bearing position to cause the clamping bar to move in the second direction. In this solution, the switch and the clamping bar may be in direct contact or indirect contact. For a direct contact manner, when the switch is at a water-resistant limit position, a force-bearing position on the clamping bar is a force-applying position of the switch on the clamping bar. At least a part of projection of the force-applying position of the switch along the center line of the housing through hole falls into the housing through hole, so that the force-applying position may be opposite to (for example, directly opposite to) a position of a sealing head in a direction of the center line of the housing through hole, and the sealing head is not prone to tilt. For an indirect contact manner, when the switch is at a water-resistant limit position, a force-bearing position on the clamping bar is a force-applying position of an intermediate component between the switch and the clamping bar on the clamping bar. At least a part of projection of the force-applying position of the intermediate component along the center line of the housing through hole falls into the housing through hole, so that the force-applying position may be opposite to (for example, directly opposite to) a position of a sealing head in a direction of the center line of the housing through hole, and the sealing head is not prone to tilt.

In an implementation of the first aspect, the water-resistant assembly includes the bracket, and the bracket is fastened to the housing, to mount the entire water-resistant assembly to the housing. The bracket has a function of accommodating another component in the water-resistant assembly, so that the structure of the water-resistant assembly is compact, and integrity of a structure and an appearance of the electronic device is ensured. The bracket may further have a function of bearing and fastening another component in the water-resistant assembly.

According to a second aspect, an embodiment of this application provides a water-resistant assembly of an electronic device. The water-resistant assembly is mounted to a housing of the electronic device. The housing has a housing through hole, and the housing through hole is connected to inside of the housing through a water-resistant and breathable film. The water-resistant assembly includes a tube, a switch, and a switch sealing ring. The tube has a tube inner cavity and a tube connection hole connected to the tube inner cavity. The switch is capable of being movably mounted into the tube inner cavity, and the switch has a switch connection hole connected to outside of the switch. The switch sealing ring is fastened to a periphery of the switch, is located in the tube inner cavity, and presses against a cavity wall of the tube inner cavity. After the water-resistant assembly is mounted to the housing, the tube connection hole is connected to one end that is of the housing through hole and that is far away from the water-resistant and breathable film. The switch is configured to move relative to the tube under an external force, so that the switch connection hole is connected to the tube connection hole, or the switch connection hole is displaced from the tube connection hole and the switch sealing ring is blocked between the switch connection hole and the tube connection hole. In this solution, the water-resistant assembly can be switched between a turned-on state and a turned-off state through a movement of the switch, to ensure reliable operation of the electronic device in a daily scenario and a high water pressure scenario. This solution may be applied to a smartwatch, where a switch may serve as a knob key of the smartwatch.

In an implementation of the second aspect, the switch has an axial switch connection hole and a radial switch connection hole. The axial switch connection hole intersects the radial switch connection hole. The axial switch connection hole is connected to the radial switch connection hole and the outside of the switch. The switch is configured to move relative to the tube under the external force, so that the radial switch connection hole is connected to the tube connection hole, or the radial switch connection hole is displaced from the tube connection hole and the switch sealing ring is blocked between the radial switch connection hole and the tube connection hole. The foregoing internal structure of the switch can meet a structure design requirement of the electronic device, so that the entire device has a compact structure and a small size, and can be lighter and thinner.

In an implementation of the second aspect, the tube is shaped like a rotary body. The tube has a first matching groove, a second matching groove, and a third matching groove that are sequentially connected. The first matching groove, the second matching groove, and the third matching groove are connected in an L shape. The first matching groove extends in an axial direction of the tube. The second matching groove extends in a circumferential direction of the tube. The switch has a matching protrusion. In a process in which the switch is configured to move to a first limit position relative to the tube, the matching protrusion sequentially moves in the third matching groove, the second matching groove, and the first matching groove. In a process in which the switch moves in a reverse direction to a second limit position relative to the tube, the matching protrusion sequentially moves in the first matching groove, the second matching groove, and the third matching groove. When the switch is located at the first limit position, the radial switch connection hole is displaced from the tube connection hole, and the switch sealing ring is blocked between the radial switch connection hole and the tube connection hole. When the switch is located at the second limit position, the radial switch connection hole is connected to the tube connection hole. The structure above in which the tube and the switch match each other so that the switch is able to move and rotate can meet the structure design requirement of the electronic device.

In an implementation of the second aspect, the tube includes a head and a tube body that are connected. The head and the tube body enclose the tube inner cavity. The first matching groove, the second matching groove, and the third matching groove are provided on the head. The tube connection hole is provided in the tube body. The tube body is configured to pass through and be fastened to the housing. The head is located outside the housing. The tube has a simple structure and good mass production, and can meet the structure design requirement of electronic device.

In an implementation of the second aspect, the water-resistant assembly includes a tube sealing ring. The tube sealing ring is configured to seal a gap between the head and the housing. In this solution, external liquid can be prevented from entering the device through the tube and the housing. This enhances water-resistant performance of the device.

In an implementation of the second aspect, an accommodation groove is provided at one end that is of the tube body and that is far away from the head, and the accommodation groove is a part of the tube inner cavity. The water-resistant assembly includes a switch limiting member. The switch limiting member is fastened to a part that is of the switch and that is close to the accommodation groove. The switch limiting member protrudes from an outer circumferential surface of the switch. When the switch moves to the first limit position, the switch limiting member presses against a bottom wall of the accommodation groove. When the switch moves to the second limit position, a part of the switch is located in the accommodation groove, and the switch limiting member is spaced from the bottom wall of the accommodation groove. The switch limiting member may be, for example, a snap spring. The switch limiting member can limit the switch to prevent the switch from being released from the tube.

In an implementation of the second aspect, the water-resistant assembly includes an elastic member, and two opposite ends of the elastic member respectively press against the switch and the tube. The elastic member can provide resilience for the switch, so that the user can experience a touch feeling feedback when operating the switch.

According to a third aspect, an embodiment of this application provides an electronic device, including a housing, a water-resistant and breathable film, and any one of the foregoing water-resistant assemblies. The housing encloses a housing space. The housing has a housing through hole. One end of the housing through hole is connected to the housing space through the water-resistant and breathable film. The water-resistant assembly is mounted to the housing, and is located at one end that is of the housing through hole and that is far away from the water-resistant and breathable film. In this solution, the electronic device can operate reliably in a daily scenario and a high water pressure scenario.

In an implementation of the third aspect, the electronic device includes a magnet, a magnetic field sensor, and a controller. The magnet is fastened to the clamping bar in the water-resistant assembly, or is fastened to the switch in the water-resistant assembly. Both the magnetic field sensor and the controller are disposed in the housing space. The magnetic field sensor is configured to: sense a magnetic flux of the magnet and generate a detection signal. The controller is configured to determine a status of the water-resistant assembly based on the detection signal. In this solution, the status of the water-resistant assembly may include a turned-on state and a turned-off state. The status of the electronic device can be determined based on a magnetic field detection design, to facilitate a user to learn of the status of the electronic device, and ensure that the user correctly operates the electronic device according to a use scenario. This improves user experience.

In an implementation of the third aspect, a speaker hole is provided in the housing, and the speaker hole is connected to the housing space and outside of the housing. The electronic device includes a microphone and a sound-emitting component. Both the microphone and the sound-emitting component are located in the housing space. The microphone is configured to pick up a sound signal that is transmitted through the housing through hole and the water-resistant and breathable film. The sound-emitting component is configured to send a sound signal that is transmitted to the outside of the housing through the speaker hole. The housing through hole may serve as a sound pickup through hole of the microphone. The sound-emitting component is an electroacoustic component, and is configured to produce a sound, for example, may be a speaker or a buzzer. In this solution, water-resistant performance of the microphone and the sound-emitting component in the electronic device can be ensured, to ensure normal operation at high water pressure.

In an implementation of the third aspect, the electronic device includes the controller disposed in the housing space. The controller is configured to: control the sound-emitting component to send a set sound signal, and determine a status of the water-resistant assembly based on strength of the set sound signal received by the microphone. If the strength of the signal received by the microphone is high, it indicates that the water-resistant assembly is in a turned-on state. If the strength of the signal received by the microphone is low; it indicates that the water-resistant assembly is in an intermediate state. If the strength of the signal received by the microphone is almost zero, it indicates that the water-resistant assembly is in a turned-off state. The status of the electronic device can be determined based on a sound signal detection design, to facilitate a user to learn of the status of the electronic device, and ensure that the user correctly operates the electronic device according to a use scenario. This improves user experience.

In an implementation of the third aspect, the electronic device includes a depth gauge. The controller is configured to: when it is determined that a detection result of the depth gauge reaches a threshold, control the sound-emitting component to send the set sound signal, and determine the status of the water-resistant assembly based on the strength of the set sound signal received by the microphone. After the electronic device enters the high water pressure scenario, the status of the water-resistant assembly may change due to high pressure or another abnormality, and liquid may enter the electronic device. To prompt the user with the risk in a timely manner and avoid liquid leakage damage to the electronic device, a depth at which the electronic device is underwater may be detected by using the depth gauge, and status detection of the water-resistant assembly is triggered based on a detection result of the depth gauge.

In an implementation of the third aspect, the electronic device displays prompt information, and the prompt information is used to notify a user of a current status of the water-resistant assembly. In this solution, the user can learn of the status of the electronic device, to ensure that the user correctly operates the electronic device according to a use scenario. This improves user experience.

BRIEF DESCRIPTION OF DRAWINGS

FIG. 120 is a schematic diagram of a structure of a first end cover shown in FIG. 115;

FIG. 121 is a schematic diagram of another exploded structure of the water-resistant assembly according to Embodiment 8;

FIG. 122 is a schematic diagram of an assembly structure including the housing and the water-resistant assembly of the electronic device according to Embodiment 8;

FIG. 123 is a schematic diagram of an E-E sectional structure of the structure shown in FIG. 122;

FIG. 124 is a schematic diagram of a partially enlarged structure at a position H in FIG. 123;

FIG. 125 is a schematic diagram of an F-F sectional structure of the structure shown in FIG. 122;

FIG. 126 is a schematic diagram of a D-D sectional structure of the structure shown in FIG. 122;

FIG. 127 is a schematic diagram of a partially enlarged structure at a position G in FIG. 126;

FIG. 128 is a schematic diagram of another sectional assembly structure including the housing and the water-resistant assembly of the electronic device according to Embodiment 8; and FIG. 129 is a schematic diagram of a three-dimensional assembly structure including the corresponding housing and the corresponding water-resistant assembly shown in FIG. 128.

DESCRIPTION OF EMBODIMENTS

The following embodiments of this application provide an electronic device, including but not limited to a wearable device like a smartwatch, a smart band, a smart helmet, or a smart garment, and a mobile phone, a tablet computer, or another electronic product.

Embodiment 1

Figure 1:
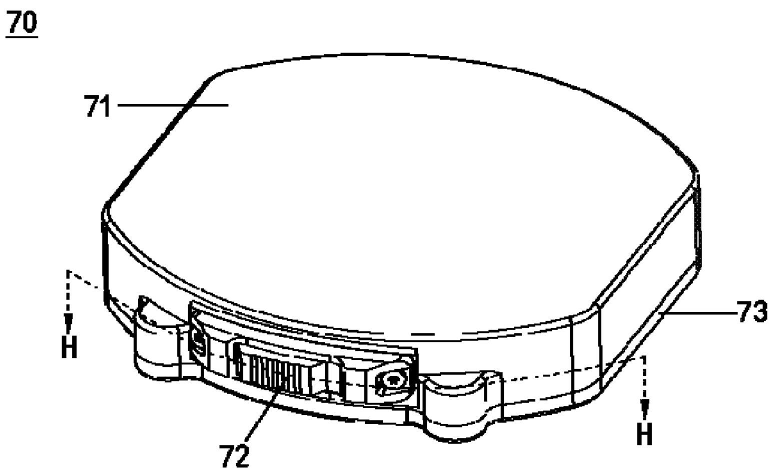
FIG. 1 is a schematic diagram of an assembly structure of an electronic device according to Embodiment 1.
Figure 2:
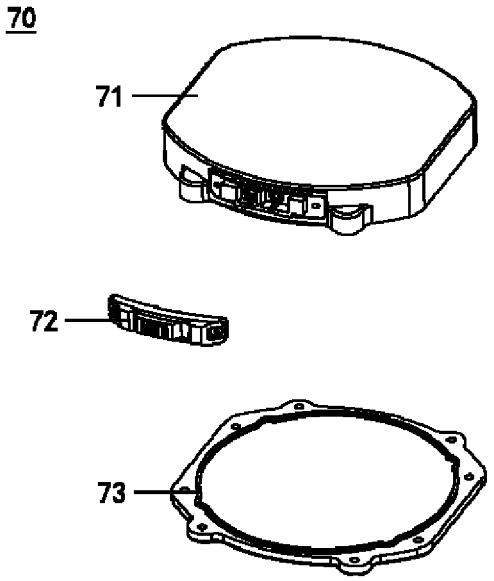
FIG. 2 is a schematic diagram of an exploded structure of the electronic device in FIG. 1.
Figure 3:
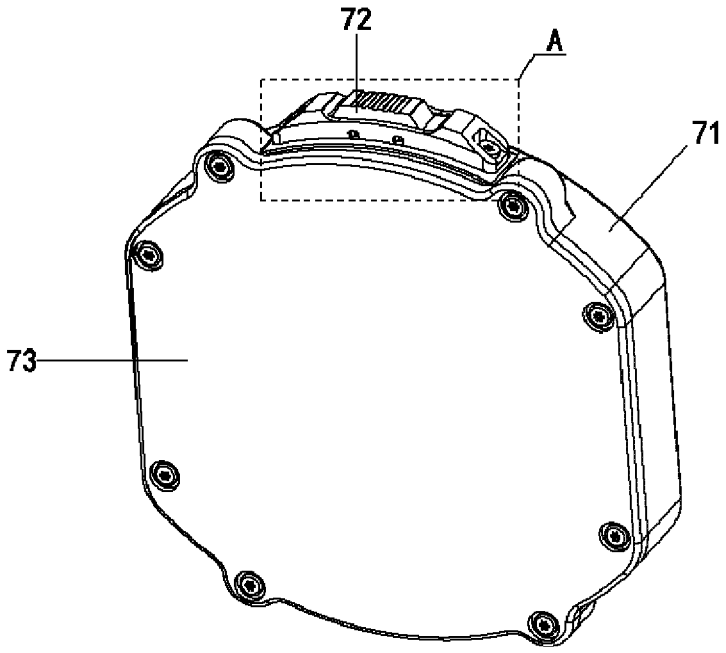
FIG. 3 is a schematic diagram of an assembly structure of the electronic device according to Embodiment 1.

As shown in FIG. 1, FIG. 2, and FIG. 3, an electronic device 70 in Embodiment 1 may include a housing 71, a water-resistant assembly 72, and a housing 73. The housing 71 and the housing 73 may be assembled to enclose an internal space of the electronic device 70, and the water-resistant assembly 72 may be mounted on the housing 71.

Figure 4:
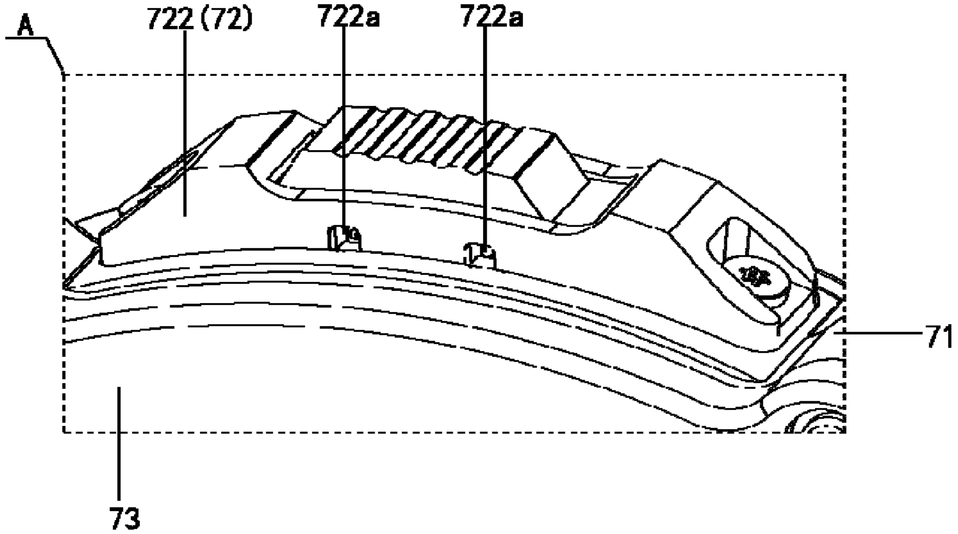
FIG. 4 is a schematic diagram of a partially enlarged structure at a position A in FIG. 3.

FIG. 4 is a schematic diagram of a partially enlarged structure at a position A in FIG. 3. As shown in FIG. 4, openings 722*a* may be designed for a bracket 722 in the water-resistant assembly 72. The openings 722*a* connect the internal space to an external space of the housing 71. In other words, the openings 722*a* connect the internal space to the external space of the electronic device 70. The electronic device 70 may further include a microphone, a speaker, a water-resistant and breathable film, a magnetic field sensor, a controller, and the like. Detailed descriptions are provided below.

Figure 5:
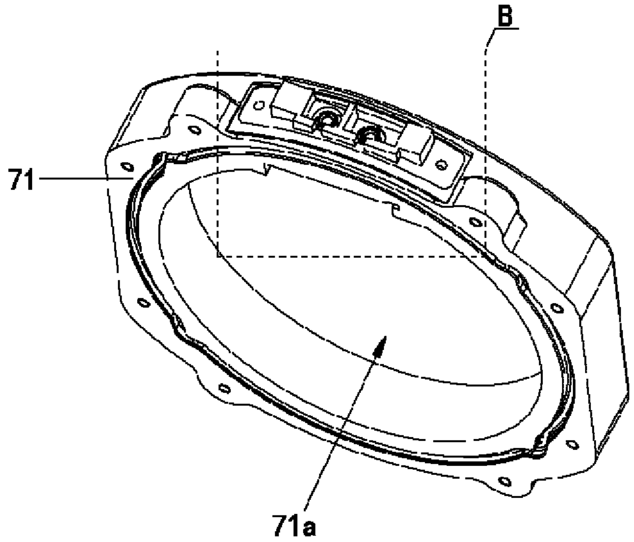
FIG. 5 is a schematic diagram of a structure of a housing of the electronic device according to Embodiment 1.

As shown in FIG. 5, the housing 71 may be approximately in a cover shape. The housing 71 has a bottom wall and a circumferential side wall that surrounds a circumferential edge of a bottom. The bottom wall and the circumferential side wall may enclose a housing space 71*a*, and the housing space 71*a* is the internal space of the electronic device 70.

Figure 6:
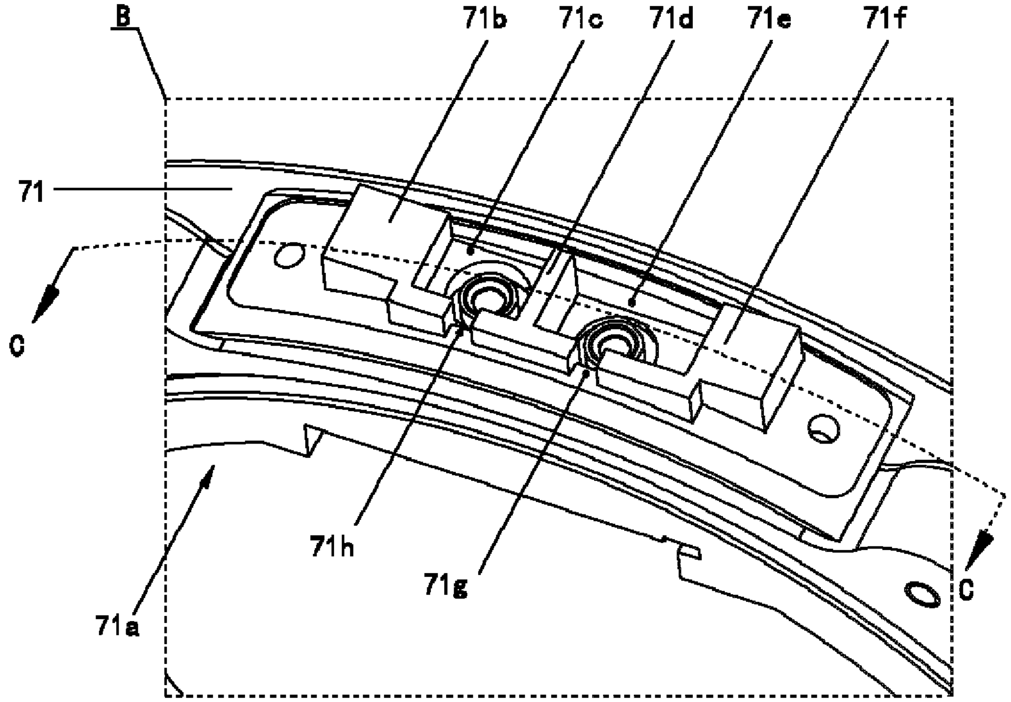
FIG. 6 is a schematic diagram of a partially enlarged structure at a position B in FIG. 5.

FIG. 6 is a partially enlarged view at a position B in FIG. 5. As shown in FIG. 6, a protrusion 71*b*, a protrusion 71*d*, and a protrusion 71*f* may be provided on an outer surface of the circumferential side wall of the housing 71, and every two of the protrusion 71*b*, the protrusion 71*d*, and the protrusion 71*f* are spaced apart. For example, there is a spacing 71*h* between the protrusion 71*b* and the protrusion 71*d*, and there is a spacing 71*g* between the protrusion 71*d* and the protrusion 71*f*. The protrusion 71*b* and the protrusion 71*d* may enclose a second accommodation groove 71*c*, and the spacing 71*h* is connected to the second accommodation groove 71*c*. The protrusion 71*d* and the protrusion 71*f* may enclose a first accommodation groove 71*e*, and the spacing 71*g* is connected to the first accommodation groove 71*e*. The spacing 71*h* and the spacing 71*g* may also be referred to as air vents.

Figure 7:
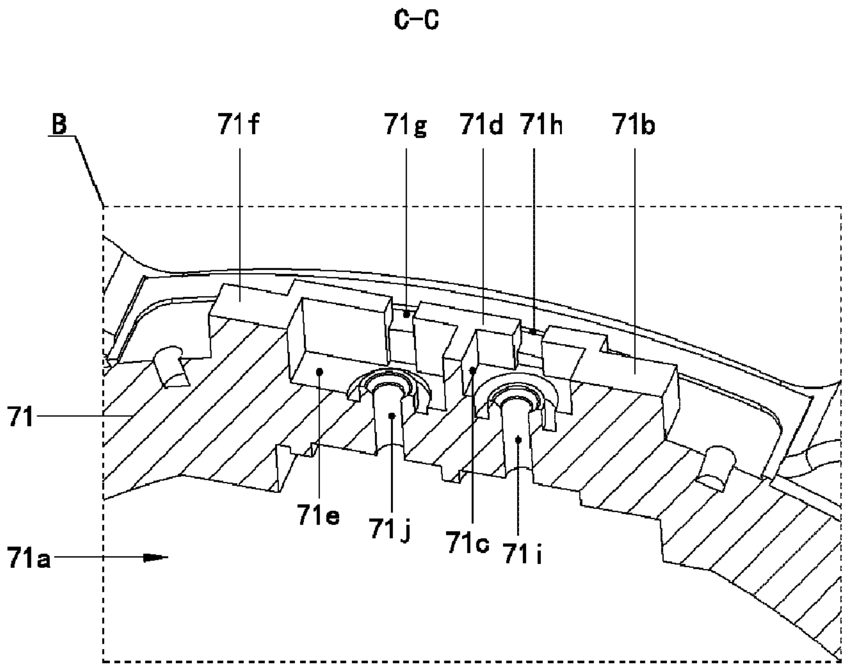
FIG. 7 is a schematic diagram of a C-C sectional structure of the structure shown in FIG. 6.

FIG. 7 is a schematic diagram of a C-C sectional structure of a structure shown in FIG. 6. As shown in FIG. 7, a structure of the first accommodation groove 71*e* is similar to that of the second accommodation groove 71*c*, but an opening area and a depth of the first accommodation groove 71*e* may be larger than those of the second accommodation groove 71*c*, so that design requirements of the first accommodation groove 71*e*, the second accommodation groove 71*c*, and an electroacoustic module can be met (further descriptions are provided below). In another embodiment, structure sizes of the first accommodation groove and the second accommodation groove may be designed as required, and are not limited to those in this embodiment. For example, the structure sizes of the first accommodation groove and the second accommodation groove may be consistent.

As shown in FIG. 7, a housing through hole 71*j* may be provided in a bottom wall of the first accommodation groove 71*e*. Because the housing through hole 71*j* connects the first accommodation groove 71*e* to the housing space 71*a*, the spacing 71*g*, the first accommodation groove 71*e*, the housing through hole 71*j*, and the housing space 71*a* are sequentially connected. A housing through hole 71*i* may be provided in a bottom wall of the second accommodation groove 71*c*. Because the housing through hole 71*i* connects the second accommodation groove 71*c* to the housing space 71*a*, the spacing 71*h*, the second accommodation groove 71*c*, the housing through hole 71*i*, and the housing space 71*a* are sequentially connected. As shown in FIG. 7, for example, a periphery of the housing through hole 71*j* and a periphery of the housing through hole 71*i* each may form an annular groove structure. The annular groove structure is used to mount an elastic member in the water-resistant assembly 72 (descriptions are provided below). In another embodiment, a periphery of the housing through hole 71*j* and a periphery of the housing through hole 71*i* each may alternatively be a flat surface, and an annular groove structure does not need to be designed.

The foregoing internal and external structures of the housing 71 are merely examples, and this embodiment of this application is not limited thereto. For example, the housing in another embodiment may have only one accommodation groove and one housing through hole. Alternatively, for example, the housing may have a plurality of accommodation grooves and housing through holes corresponding to the accommodation grooves, to seal the plurality of housing through holes.

Figure 8:
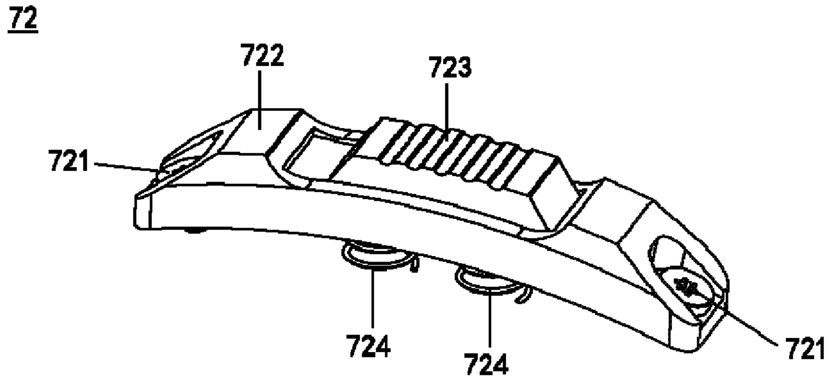
FIG. 8 is a schematic diagram of an assembly structure of a water-resistant assembly according to Embodiment 1 from a perspective.
Figure 9:
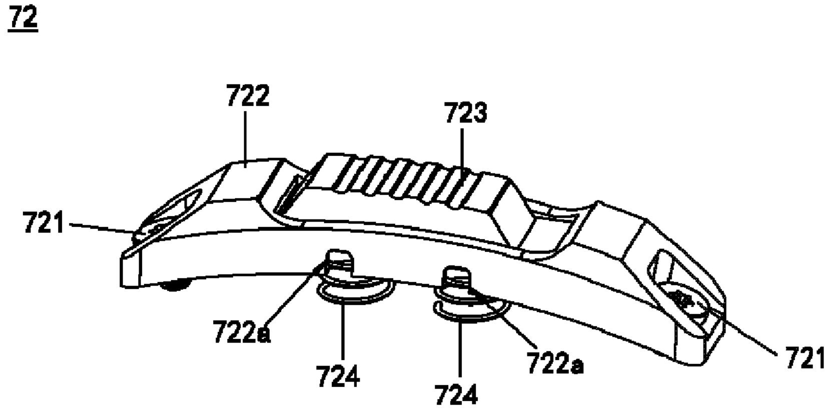
FIG. 9 is a schematic diagram of an assembly structure of the water-resistant assembly according to Embodiment 1 from another perspective.
Figure 10:
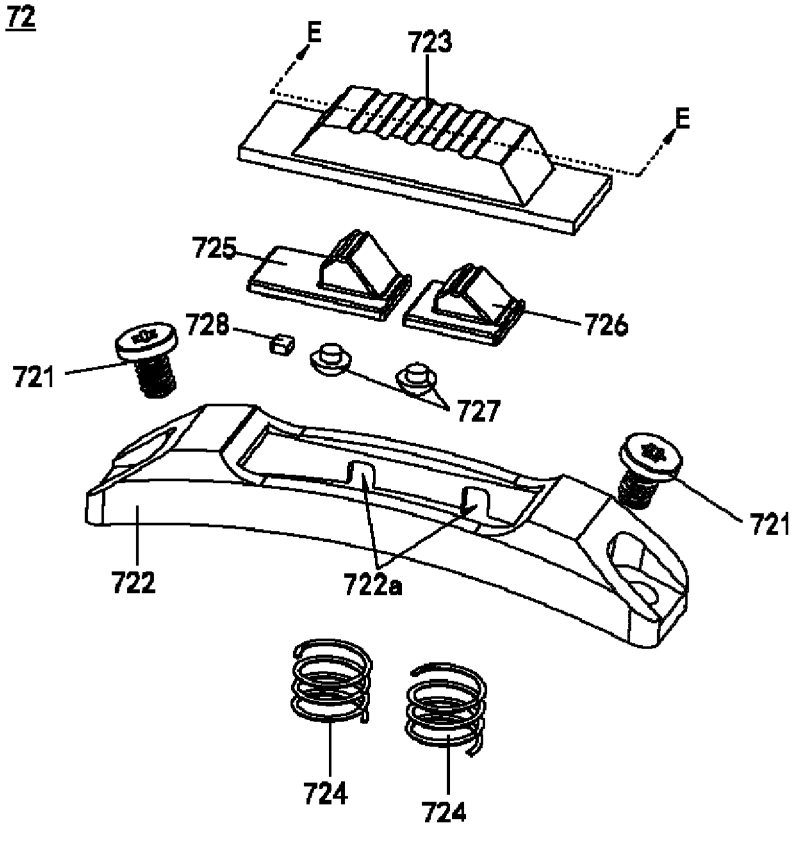
FIG. 10 is a schematic diagram of an exploded structure of the water-resistant assembly in FIG. 8.

As shown in FIG. 8. FIG. 9, and FIG. 10, the water-resistant assembly 72 may include the bracket 722, connecting members 721, a switch 723, a first clamping bar 725, a second clamping bar 726, sealing members 727, a magnet 728, and elastic members 724. Detailed descriptions are provided one by one.

Figure 11:
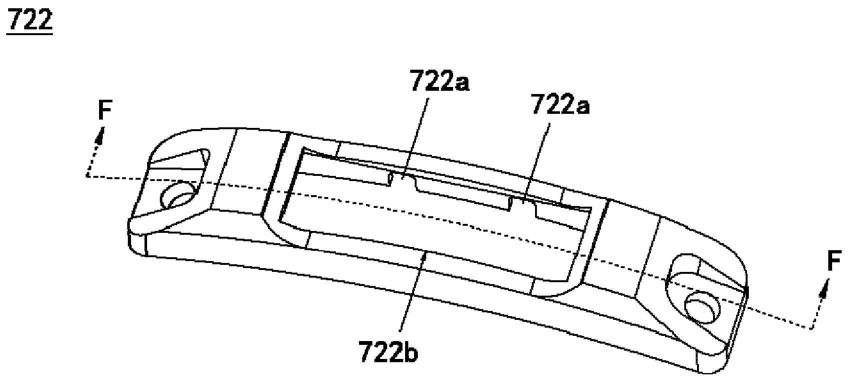
FIG. 11 is a schematic diagram of a structure of a bracket in FIG. 10.
Figure 12:
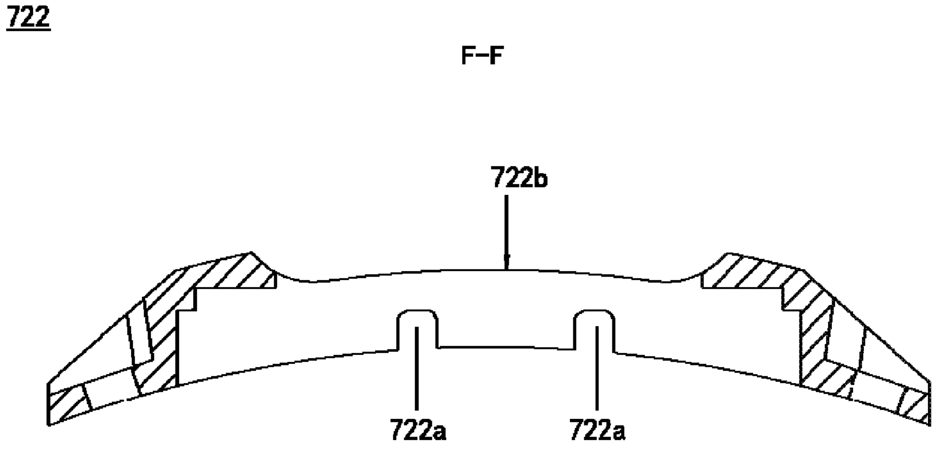
FIG. 12 is a schematic diagram of an F-F sectional structure of the bracket in FIG. 11.

As shown in FIG. 11 and FIG. 12, the bracket 722 may be roughly a strip-shaped and cover-like structure, the bracket 722 has an inner cavity and an opening 722*b*, and the opening 722*b* connects the inner cavity to outside of the bracket 722. Two openings 722*a* may be provided in a wall (for example, a side wall) of one side of the bracket 722, and the openings 722*a* connect the inner cavity to the outside of the bracket 722.

With reference to FIG. 4. FIG. 6, and FIG. 9, when the water-resistant assembly 72 is mounted to the housing 71, the bracket 722 is fixedly connected to the housing 71. For example, the bracket 722 may be fixedly connected to the housing 71 by using the connecting members 721 (for example, threaded connecting members). The two openings 722*a* of the bracket 722 are respectively connected to the spacing 71*h* and the spacing 71*g* of the housing 71. Therefore, one opening 722*a*, the spacing 71*h*, the second accommodation groove 71*c*, the housing through hole 71*i*, and the housing space 71*a* are connected. In other words, the one opening 722*a*, the spacing 71*h*, the second accommodation groove 71*c*, and the housing through hole 71*i* form a channel (which may be referred to as a second channel) that connects outside of the housing 71 to the housing space 71*a*. The other opening 722*a*, the spacing 71*g*, the first accommodation groove 71*e*, the housing through hole 71*j*, and the housing space 71*a* are connected. In other words, the other opening 722*a*, the spacing 71*g*, the first accommodation groove 71*e*, and the housing through hole 71*j* form another channel (which may be referred to as a first channel) that connects the outside of the housing 71 to the housing space 71*a*.

Figure 13:
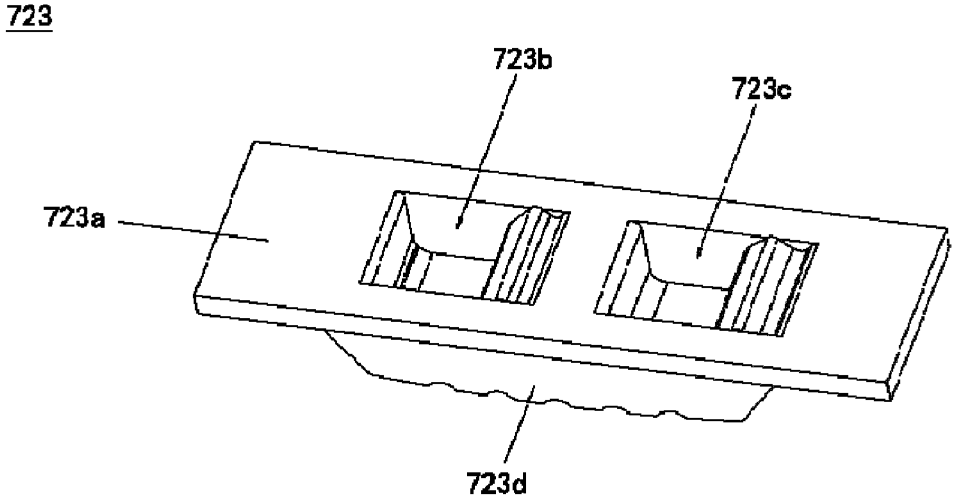
FIG. 13 is a schematic diagram of a structure of a switch in the water-resistant assembly according to Embodiment 1.
Figure 14:
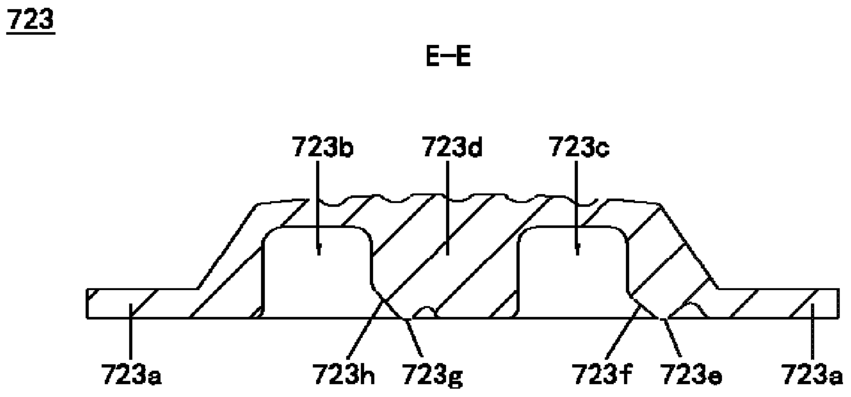
FIG. 14 is a schematic diagram of an E-E sectional structure of the switch in FIG. 10.

As shown in FIG. 10, FIG. 13, and FIG. 14, the switch 723 may be roughly a strip-shaped and cover-like structure. The switch 723 may include sliding parts 723*a* and a force-applying part 723*d*. The sliding parts 723*a* may be shaped like a flat plate, there may be two sliding parts 723*a*, and the two sliding parts 723*a* may be basically located on the same plane. The force-applying part 723*d* may be connected between the two sliding parts 723*a*, and protrudes relative to the sliding parts 723*a*. A partial region of the force-applying part 723*d* is concave to form a first accommodation space 723*b* and a second accommodation space 723*c*, and the first accommodation space 723*b* and the second accommodation space 723*c* are spaced apart. Sizes of the first accommodation space 723*b* and the second accommodation space 723*c* may be consistent.

As shown in FIG. 14, a first switch slope 723*h* is included on an inner surface of the first accommodation space 723*b*, and the first switch slope 723*h* is closer to inside of the first accommodation space 723*b*. A first protrusion 723*g* may be further provided at an opening of the first accommodation space 723*b*. A surface of the first protrusion 723*g* may be an arc surface, and the surface of the first protrusion 723*g* may be smoothly connected to the first switch slope 723*h*.

As shown in FIG. 14, similarly, a second switch slope 723*f* is included on an inner surface of the second accommodation space 723*c*, and the second switch slope 723*f* is closer to inside of the second accommodation space 723*c*. The second switch slope 723*f* may be parallel to the first switch slope 723*h*. A second protrusion 723*e* may be further provided at an opening of the second accommodation space 723*c*. A surface of the second protrusion 723*e* may be an arc surface, and the surface of the second protrusion 723*e* may be smoothly connected to the second switch slope 723*f*.

The foregoing internal and external structures of the switch 723 are merely examples, and this embodiment of this application is not limited thereto. For example, the switch in another embodiment may have only one accommodation space.

Figure 15:
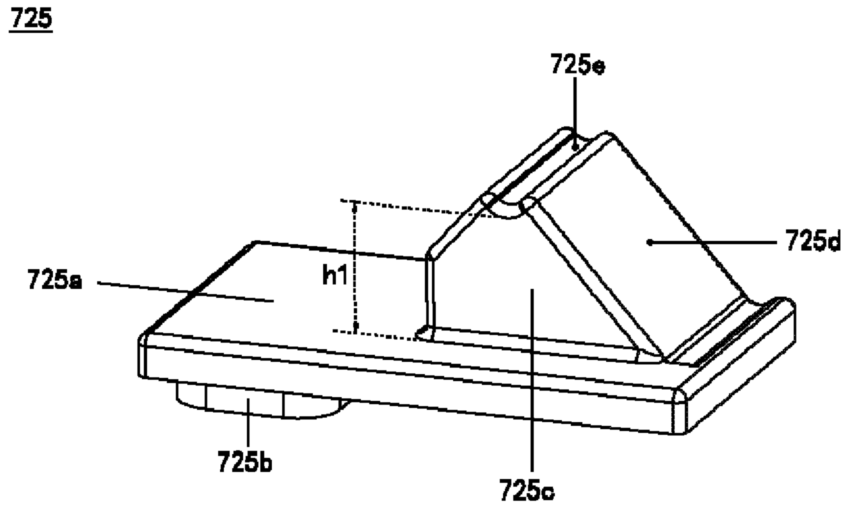
FIG. 15 is a schematic diagram of a structure of a first clamping bar in the water-resistant assembly according to Embodiment 1.
Figure 16:
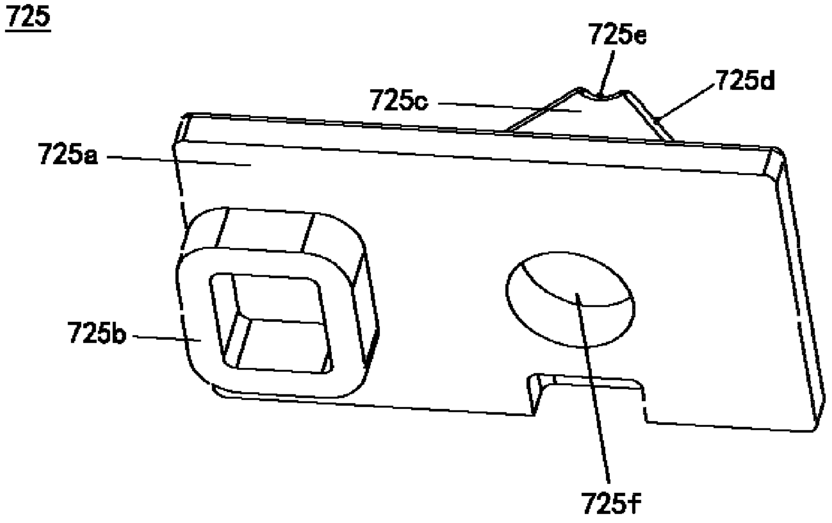
FIG. 16 is a schematic diagram of a structure of the first clamping bar in FIG. 15 from another perspective.

As shown in FIG. 15 and FIG. 16, the first clamping bar 725 may include a substrate 725*a*, an accommodation part 725*b*, and a clamping bar matching part 725*c*. The substrate 725*a* may be roughly shaped like a flat plate. An accommodation groove 725*f* may be provided on a surface of one side of the substrate 725*a* (a normal of the surface may be in a thickness direction of the substrate 725*a*). The accommodation part 725*b* and the accommodation groove 725*f* may be located on a same side of the substrate 725*a*, and the accommodation part 725*b* may enclose an annular structure. The clamping bar matching part 725*c* may be connected to the other side of the substrate 725*a*, and the accommodation part 725*b* may be displaced from the clamping bar matching part 725*c*.

As shown in FIG. 15, the clamping bar matching part 725*c* may be roughly shaped like a prismatic structure having a trapezoidal cross section. The clamping bar matching part 725*c* has a first clamping bar slope 725*d*. Slopes of the first clamping bar slope 725*d* and the first switch slope 723*h* may be consistent. In addition, when the first clamping bar 725 and the switch 723 are assembled, the first clamping bar slope 725*d* may be parallel to the first switch slope 723*h*. An approximately sharp angle may be formed at one end that is of the clamping bar matching part 725*c* and that is far away from the substrate 725*a*, and a first limiting groove 725*e* may be provided at a top end of the sharp angle. A distance from a lowest point of a bottom surface of the first limiting groove 725*e* to the substrate 725*a* is h1. As shown in FIG. 16, the first limiting groove 725*e* may be aligned with the accommodation groove 725*f* in a thickness direction of the substrate 725*a*. A part of orthographic projection of the first limiting groove 725*e* on the substrate 725*a* may fall into orthographic projection of the accommodation groove 725*f* on the substrate 725*a*.

Figure 17:
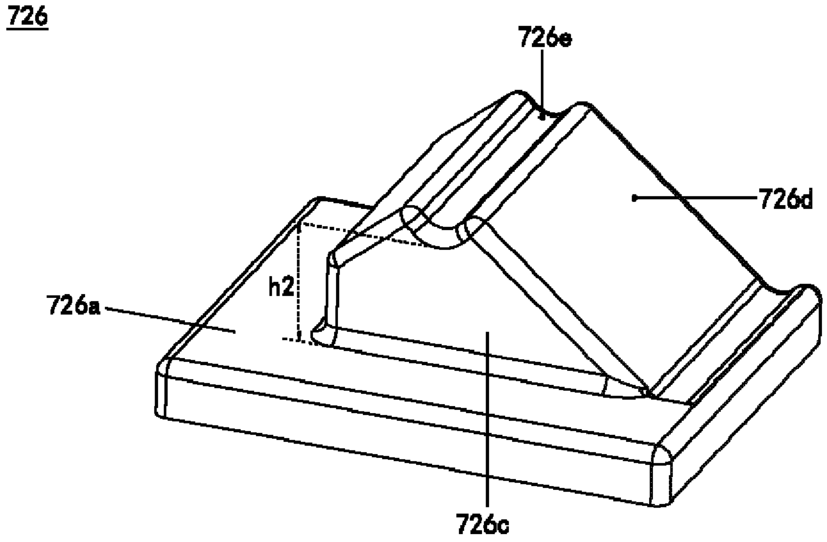
FIG. 17 is a schematic diagram of a structure of a second clamping bar in the water-resistant assembly according to Embodiment 1.

As shown in FIG. 17, the structure of the second clamping bar 726 is similar to that of the first clamping bar 725. For example, the second clamping bar 726 may include a substrate 726*a* and a clamping bar matching part 726*c*. An accommodation groove (not shown in FIG. 17) may also be provided on a surface of one side of the substrate 726*a*. The clamping bar matching part 726*c* has a second clamping bar slope 726*d*. Slopes of the second clamping bar slope 726*d* and the second switch slope 723*f* may be consistent. In addition, when the second clamping bar 726 and the switch 723 are assembled, the second clamping bar slope 726*d* may be parallel to the second switch slope 723*f*. An approximately sharp angle may be formed at one end that is of the clamping bar matching part 726*c* and that is far away from the substrate 726*a*, and a second limiting groove 726*e* may be provided at a top end of the sharp angle. A distance from a lowest point of a bottom surface of the second limiting groove 726*e* to the substrate 725*a* is h2.

With reference to FIG. 15 and FIG. 17, different from the first clamping bar 725, the second clamping bar 726 does not have an accommodation part, and the distance h2 in the second clamping bar 726 may be smaller than the distance h1 in the first clamping bar 725. Because the distance h2 is small, a movement stroke of the second clamping bar 726 can be adapted to the shallower second accommodation groove 71*c*. Because the distance h1 is large, a movement stroke of the first clamping bar 725 can be adapted to the deeper first accommodation groove 71*e* (further descriptions are provided below). In another embodiment, the water-resistant assembly may include only the first clamping bar 725, without the second clamping bar 726.

Refer to FIG. 10. The sealing members 727 may be rotary bodies. The sealing members 727 may be made of sealing materials that are prone to elastic deformation, for example, rubber or silica gel. There may be two sealing members 727. With reference to FIG. 10 and FIG. 16, one sealing member 727 may be fastened in the accommodation groove 725*f* of the first clamping bar 725, and the other sealing member 727 may be fastened in the accommodation groove of the second clamping bar 726. In another embodiment, when there is only one clamping bar, only one sealing member may be provided.

With reference to FIG. 10 and FIG. 16, the magnet 728 may be fastened in the accommodation part 725*b* of the first clamping bar 725. In another embodiment, the magnet may be alternatively fastened to a side that is of the substrate 726*a* of the second clamping bar 726 and that is far away from the clamping bar matching part 726*c*.

As shown in FIG. 10, the elastic members 724 may be springs. There may be two elastic members 724. In another embodiment, the spring may alternatively be replaced by another component that can provide an elastic force. When there is only one clamping bar, only one elastic member may be provided.

Figure 18:
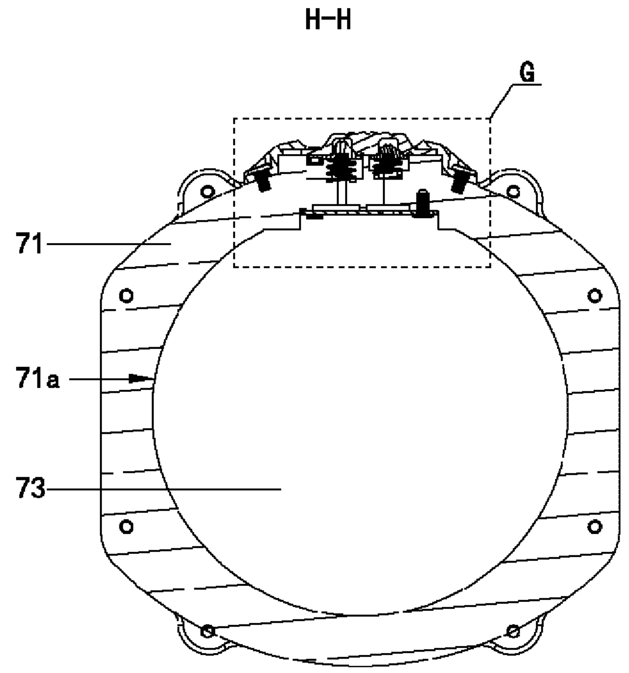
FIG. 18 is a schematic diagram of an H-H sectional structure of the electronic device shown in FIG. 1.
Figure 19:
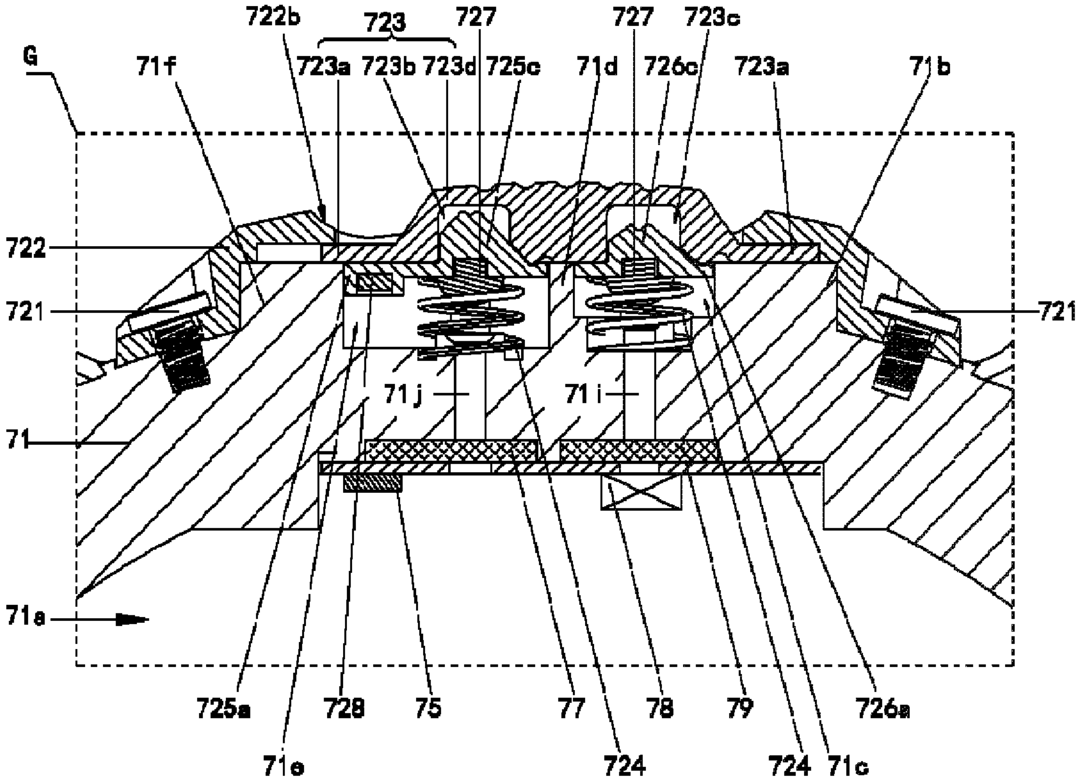
FIG. 19 is a schematic diagram of a partially enlarged structure at a position G in FIG. 18.

FIG. 18 is a schematic diagram of an H-H sectional structure of the electronic device 70 in FIG. 1. FIG. 19 is a schematic diagram of a partially enlarged structure at a position G in FIG. 18, and may represent an assembly structure including the water-resistant assembly 72 and the housing 71. Detailed descriptions are provided below.

As shown in FIG. 19, a first water-resistant and breathable film 77 and a second water-resistant and breathable film 79 may be mounted in the housing space 71*a* of the housing 71. For example, the first water-resistant and breathable film 77 may cover one end of the housing through hole 71*j*, and the second water-resistant and breathable film 79 may cover one end of the housing through hole 71*i*. Both the first water-resistant and breathable film 77 and the second water-resistant and breathable film 79 are breathable and have specific water-resistant performance (can prevent liquid from permeating and prevent liquid from passing through).

As shown in FIG. 19, a microphone 78 may be further mounted in the housing space 71*a* of the housing 71. The microphone 78 may correspond to the housing through hole 71*i*, and a sound that enters the housing space 71*a* through the second channel may pass through the second water-resistant and breathable film 79 and be picked up by the microphone 78. A depth of the second accommodation groove 71*c* is small, and can meet a sound cavity design requirement of the microphone 78.

In this embodiment, the speaker and the controller (not shown in FIG. 19) may be further mounted in the internal space of the electronic device 70, and specific positions of the speaker and the controller may be designed as required. A speaker hole may be provided in the housing 71 or the housing 73, and a sound emitted by the speaker may be transmitted to outside of the electronic device 70 via the speaker hole. The housing through hole 71*j* may serve as an air pressure balancing hole of the speaker, and is used to balance internal and external air pressure of a sound cavity of the speaker. As shown in FIG. 19, a depth of the first accommodation groove 71*e* is large, and can meet an air pressure balance requirement of the speaker. The controller may be a central processing unit or a microcontroller unit (MCU).

In another embodiment, functions of the housing through hole 71*j* and/or the housing through hole 71*i* are not limited to those described above. For example, a second microphone may be further mounted in the housing space 71*a*. The second microphone corresponds to the housing through hole 71*j*, and a sound entering the housing space 71*a* through the first channel may pass through the first water-resistant and breathable film 77 and be picked up by the second microphone.

As shown in FIG. 19, a magnetic field sensor 75 may be further mounted in the housing space 71*a* of the housing 71, and the magnetic field sensor 75 is configured to: sense a magnetic flux of the magnet 728 and generate a detection signal. The magnetic flux of the magnet 728 detected by the magnetic field sensor 75 may be in direct proportion to a distance between the magnetic field sensor 75 and the magnet 728. The magnetic field sensor 75 may be a Hall effect sensor or a magnetometer. The Hall effect sensor can sense a change of the magnetic flux. When the Hall effect sensor detects that the magnetic flux exceeds a hardware threshold of the Hall effect sensor, the Hall effect sensor can generate a corresponding detection signal and report the signal to the controller of the electronic device 70. The controller may process the detection signal sent by the Hall effect sensor. Different from the Hall effect sensor, the magnetometer can detect a value of the magnetic flux and send a detection signal to the controller. The controller may determine, based on the detection signal sent by the magnetometer, whether the magnetic flux exceeds a built-in software threshold, and perform corresponding processing based on a determining result. A detection design related to the magnetic field sensor 75 continues to be described below:

With reference to FIG. 6. FIG. 11, and FIG. 19, the bracket 722 may be mounted to the housing 71, for example, fastened to the housing 71 by using the connecting members 721. The bracket 722 may surround the protrusion 71*b*, the protrusion 71*d*, and the protrusion 71*f* on the housing 71. Assembly gaps are formed between the bracket 722 and top surfaces of the protrusions. For example, from a perspective of FIG. 19, the assembly gaps are formed between a top region of an inner surface of the bracket 722 and a top surface of the protrusion 71*f* and between the top region of the inner surface of the bracket 722 and a top surface of the protrusion 71*b*. In addition, one opening 722*a* of the bracket 722 is connected to the spacing 71*h* in the housing 71, and the other opening 722*a* of the bracket 722 is connected to the spacing 71*g* in the housing 71 (the openings and spacings are not shown in FIG. 19 due to a perspective reason).

As shown in FIG. 19, the switch 723 is carried on the protrusion 71*f*, the protrusion 71*d*, and the protrusion 71*b*. The two sliding parts 723*a* at two ends of the switch 723 may be located in the assembly gaps, and the sliding parts 723*a* may slide along the top surface of the protrusion 71*f*, a top surface of the protrusion 71*d*, and the top surface of the protrusion 71*b*. In a state shown in FIG. 19, the sliding parts 723*a* may be at right limit positions. The force-applying part 723*d* of the switch 723 may be exposed from the opening 722*b* of the bracket 722. The force-applying part 723*d* may be used by a user to apply a force. When the user pushes and pulls the force-applying part 723*d*, the switch 723 may slide.

With reference to FIG. 15 and FIG. 19, the clamping bar matching part 725*c* of the first clamping bar 725 may be accommodated in the first accommodation space 723*b* of the switch 723. With reference to FIG. 14. FIG. 15, and FIG. 19, the first clamping bar slope 725*d* of the clamping bar matching part 725*c* is in contact with and parallel to the first switch slope 723*h* of the switch 723. A bottom (one end away from the first limiting groove 725*e*) of the first clamping bar slope 725*d* is in contact with the first protrusion 723*g*.

With reference to FIG. 15 and FIG. 19, the substrate 725*a* of the first clamping bar 725 may be located in the first accommodation groove 71*e*, and the substrate 725*a* may be in contact with the switch 723. The magnet 728 on the substrate 725*a* is located in the first accommodation groove 71*e*. The magnet 728 may be aligned with the magnetic field sensor 75 in position, so that the magnetic field sensor 75 detects the magnetic flux of the magnet 728.

As shown in FIG. 19, a sealing member 727 on the left may be fastened to the clamping bar matching part 725*c*, and a head of the sealing member 727 may be located in the first accommodation groove 71*e*. The sealing member 727 may be aligned with and spaced from the housing through hole 71*j*. One end of an elastic member 724 on the left may abut against the substrate 725*a*, and the other end may abut against the bottom wall of the first accommodation groove 71*e*. The elastic member 724 may surround a periphery of the sealing member 727. Due to elastic support from the elastic member 724, the substrate 725*a* can be kept in contact with the switch 723.

Similarly, with reference to FIG. 17 and FIG. 19, the clamping bar matching part 726*c* of the second clamping bar 726 may be accommodated in the second accommodation space 723c of the switch 723. With reference to FIG. 14, FIG. 17, and FIG. 19, the second clamping bar slope 726d of the clamping bar matching part 726c is in contact with and parallel to the second switch slope 723f of the switch 723. A bottom (one end away from the second limiting groove 726e) of the second clamping bar slope 726d is in contact with the second protrusion 723e.

With reference to FIG. 17 and FIG. 19, the substrate 726a of the second clamping bar 726 may be located in the second accommodation groove 71c, and the substrate 726a may be in contact with the switch 723.

As shown in FIG. 19, a sealing member 727 on the right may be fastened to the clamping bar matching part 726c, and a head of the sealing member 727 may be located in the second accommodation groove 71c. The sealing member 727 may be aligned with and spaced from the housing through hole 71i. One end of an elastic member 724 on the right may abut against the substrate 726a, and the other end may abut against the bottom wall of the second accommodation groove 71c. The elastic member 724 may surround a periphery of the sealing member 727. Due to elastic support from the elastic member 724, the substrate 726a can be kept in contact with the switch 723.

A state of the water-resistant assembly 72 shown in FIG. 4 is consistent with that of the water-resistant assembly 72 shown in FIG. 19, and the state may be referred to as a turned-on state. In the turned-on state, with reference to FIG. 4 and FIG. 19, one opening 722a, the spacing 71g, the first accommodation groove 71e, the housing through hole 71j, and the housing space 71a are connected. In other words, the first channel formed by the other opening 722a, the spacing 71g, the first accommodation groove 71e, and the housing through hole 71j is in the turned-on state, and the first channel connects the outside of the housing 71 to the housing space 71a. Similarly, the second channel formed by the other opening 722a, the spacing 71h, the second accommodation groove 71c, and the housing through hole 71i is in the turned-on state, and the second channel connects the outside of the housing 71 to the housing space 71a.

Therefore, a sound from the outside of the electronic device 70 can enter the electronic device 70 through the second channel and be picked up by the microphone 78. External air can also enter the electronic device 70 through the first channel, to balance air pressure inside and outside the electronic device 70. Because the first water-resistant and breathable film 77 and the second water-resistant and breathable film 79 exist, external liquid cannot enter the electronic device 70, so that the electronic device 70 can be breathable and water-resistant in a daily scenario. In an implementation, the first channel may serve as an air pressure balancing channel of the electronic device, and a microphone is disposed in an internal space of a housing corresponding to the second channel, so that the second channel forms a sound pickup channel of the electronic device. In this case, when the water-resistant assembly 72 is in the turned-on state, gas inside and outside the housing can be exchanged through the water-resistant and breathable film, to achieve an objective of balancing the internal and external air pressure and performing audio transmission.

Refer to FIG. 14. FIG. 15, and FIG. 19. When the user pushes the force-applying part 723d to the left, the sliding parts 723a slide to the left. At this time, the first switch slope 723h exerts pressure on the first clamping bar slope 725d, to increase an elastic force of the elastic member 724 on the left against the substrate 725a. Under a joint action of the pressure and the elastic force, the first clamping bar 725 moves downward, the first clamping bar slope 725d and the first switch slope 723h slide relative to each other, and the sealing members 727 gradually approach the housing through hole 71j. Similarly, as shown in FIG. 14. FIG. 17, and FIG. 19, the second switch slope 723f exerts pressure on the second clamping bar slope 726d, to increase the elastic force of the elastic member 724 on the right against the substrate 726a. Under a joint action of the pressure and the elastic force, the second clamping bar 726 moves downward, the second clamping bar slope 726d and the second switch slope 723f slide relative to each other, and the sealing members 727 gradually approach the housing through hole 71i.

Figure 20:
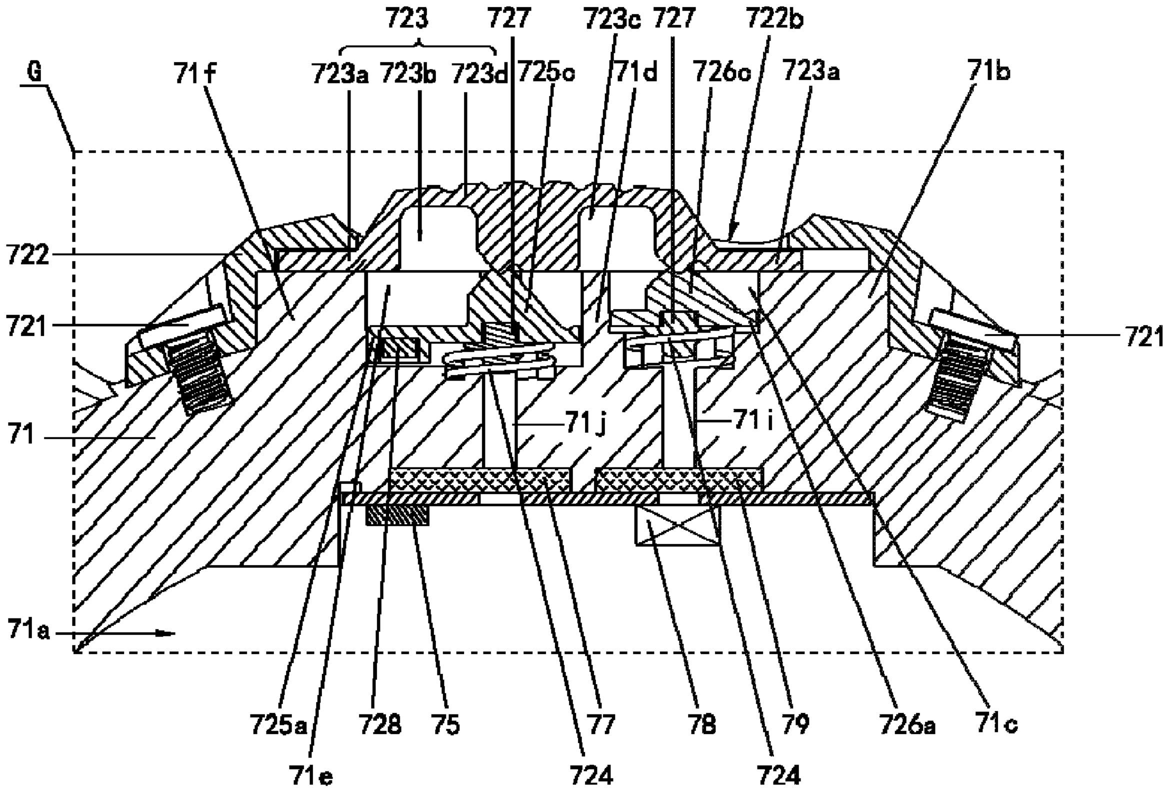
FIG. 20 is a schematic diagram of another sectional assembly structure including the water-resistant assembly and the housing according to Embodiment 1.

A state in FIG. 20 indicates that the two sealing members 727 respectively press against an opening of the housing through hole 71j and an opening of the housing through hole 71i, and block the housing through hole 71j and the housing through hole 71i. In this case, the water-resistant assembly 72 is in a turned-off state.

With reference to FIG. 14. FIG. 15, and FIG. 20, in the turned-off state, the sliding parts 723a slide to left limit positions, and the first protrusion 723g enters the first limiting groove 725e and is clamped with the first limiting groove 725e. Further, the first protrusion 723g may be basically located directly above the sealing member 727 on the left. In other words, the switch 723 may press the first clamping bar 725 directly above the sealing member 727 on the left, so that the sealing member 727 on the left can be reliably pressed against the opening of the housing through hole 71j. In this way, the sealing member 727 on the left is not tilted to affect a sealing effect. Similarly, with reference to FIG. 14. FIG. 17, and FIG. 20, the second protrusion 723e enters the second limiting groove 726e and is clamped with the second limiting groove 726e. Similarly, the second protrusion 723e may be basically located directly above the sealing member 727 on the right. In other words, the switch 723 may press the second clamping bar 726 directly above the sealing member 727 on the right, so that the sealing member 727 on the right can be reliably pressed against the opening of the housing through hole 71i. In this way, the sealing member 727 on the right is not tilted to affect a sealing effect.

Therefore, the switch 723 is locked at the left limit position, and the first clamping bar 725 and the second clamping bar 726 are locked at corresponding positions, so that the water-resistant assembly 72 remains in the turned-off state.

In the turned-off state, both the first channel and the second channel are obstructed, and the outside of the housing 71 is disconnected from the housing space 71a, so that external liquid cannot enter the electronic device 70. Because the sealing members 727 have stable and reliable sealing performance, even if the external liquid has high pressure, it is difficult or impossible for the external liquid to enter the electronic device 70.

To use the electronic device 70 in a high water pressure scenario, the user may push the switch 723 of the electronic device 70 in advance, so that the water-resistant assembly 72 is in the turned-off state, and then the user may carry the electronic device 70 into the high water pressure scenario. Because the water-resistant assembly 72 has blocked a large amount of high-pressure liquid, the first water-resistant and breathable film 77 and the second water-resistant and breathable film 79 do not need to withstand high pressure, and therefore are not prone to damage. Therefore, the electronic device 70 can operate reliably in the high water pressure scenario.

To sum up, the switch 723 can be pushed to switch the water-resistant assembly 72 between the turned-on state and the turned-off state, so that the electronic device 70 can be breathable and water-resistant in the daily scenario, and the electronic device 70 can operate safely and reliably in the high water pressure scenario.

With reference to FIG. 19 and FIG. 20, it can be learned that, in a process of switching from the turned-on state to the turned-off state, the movement stroke of the second clamping bar 726 is roughly equal to the distance h2 in the second clamping bar 726. Because the distance h2 is small, the movement stroke of the second clamping bar 726 can be adapted to the shallower second accommodation groove 71*c*. The movement stroke of the first clamping bar 725 is roughly equal to the distance h1 in the first clamping bar 725. Because the distance h1 is large, the movement stroke of the first clamping bar 725 can be adapted to the deeper first accommodation groove 71.

With reference to FIG. 19 and FIG. 20, in a process in which the water-resistant assembly 72 is switched from the turned-on state to the turned-off state, a distance between the magnet 728 and the magnetic field sensor 75 gradually decreases, and a magnetic flux around the magnetic field sensor 75 gradually increases. When the water-resistant assembly 72 is in the turned-off state, the magnetic flux around the magnetic field sensor 75 reaches a maximum value, and the magnetic field sensor 75 may generate a first detection signal. Conversely, in a process in which the water-resistant assembly 72 is switched from the turned-off state to the turned-on state, the distance between the magnet 728 and the magnetic field sensor 75 gradually increases, and the magnetic flux around the magnetic field sensor 75 gradually decreases. When the water-resistant assembly 72 is in the turned-on state, the magnetic flux around the magnetic field sensor 75 reaches a minimum value, and the magnetic field sensor 75 may generate a second detection signal.

In this embodiment, a status of the water-resistant assembly 72 can be determined based on the detection signal of the magnetic field sensor 75.

When the magnetic field sensor 75 generates the first detection signal, the controller of the electronic device 70 determines, based on the first detection signal, that the water-resistant assembly 72 is in the turned-off state. When the magnetic field sensor 75 is a Hall effect sensor, the Hall effect sensor may generate the first detection signal when the magnetic flux is greater than or equal to a first threshold. The first threshold may be determined according to an actual situation. For example, the first threshold is the maximum value. The first detection signal may be, for example, a low-level signal. Alternatively, when the magnetic field sensor 75 is a magnetometer, the magnetometer may generate the first detection signal, to report the detected magnetic flux to the controller.

When the magnetic field sensor 75 generates the second detection signal, the controller of the electronic device 70) determines, based on the second detection signal, that the water-resistant assembly 72 is in the turned-on state. When the magnetic field sensor 75 is a Hall effect sensor, the Hall effect sensor may generate the second detection signal when the magnetic flux is less than or equal to a second threshold. The second threshold may be determined according to an actual situation. For example, the second threshold is the minimum value. The second detection signal may be, for example, a high-level signal. Alternatively, when the magnetic field sensor 75 is a magnetometer, the magnetometer may generate the second detection signal, to report the detected magnetic flux to the controller.

In this embodiment, after the controller determines the status of the water-resistant assembly 72, the controller may control a related function module in the electronic device 70) to generate prompt information. The prompt information is used to notify the user of a current state of the water-resistant assembly 72 (namely, a current state of the electronic device 70). A form of the prompt information includes but is not limited to at least one of an image, a character, an audio, light, and vibration. For example, the controller may control a display to display an image and/or a character, control the speaker to output an audio, control an indicator to emit light, control a motor to generate vibration, or the like. Specific content of the prompt information may be designed as required. A design of detecting the status of the water-resistant assembly 72 and sending the prompt information enables the user to learn of a status of the electronic device 70, and ensures that the user correctly operates the electronic device 70 according to a use scenario. This improves user experience.

Figure 21:
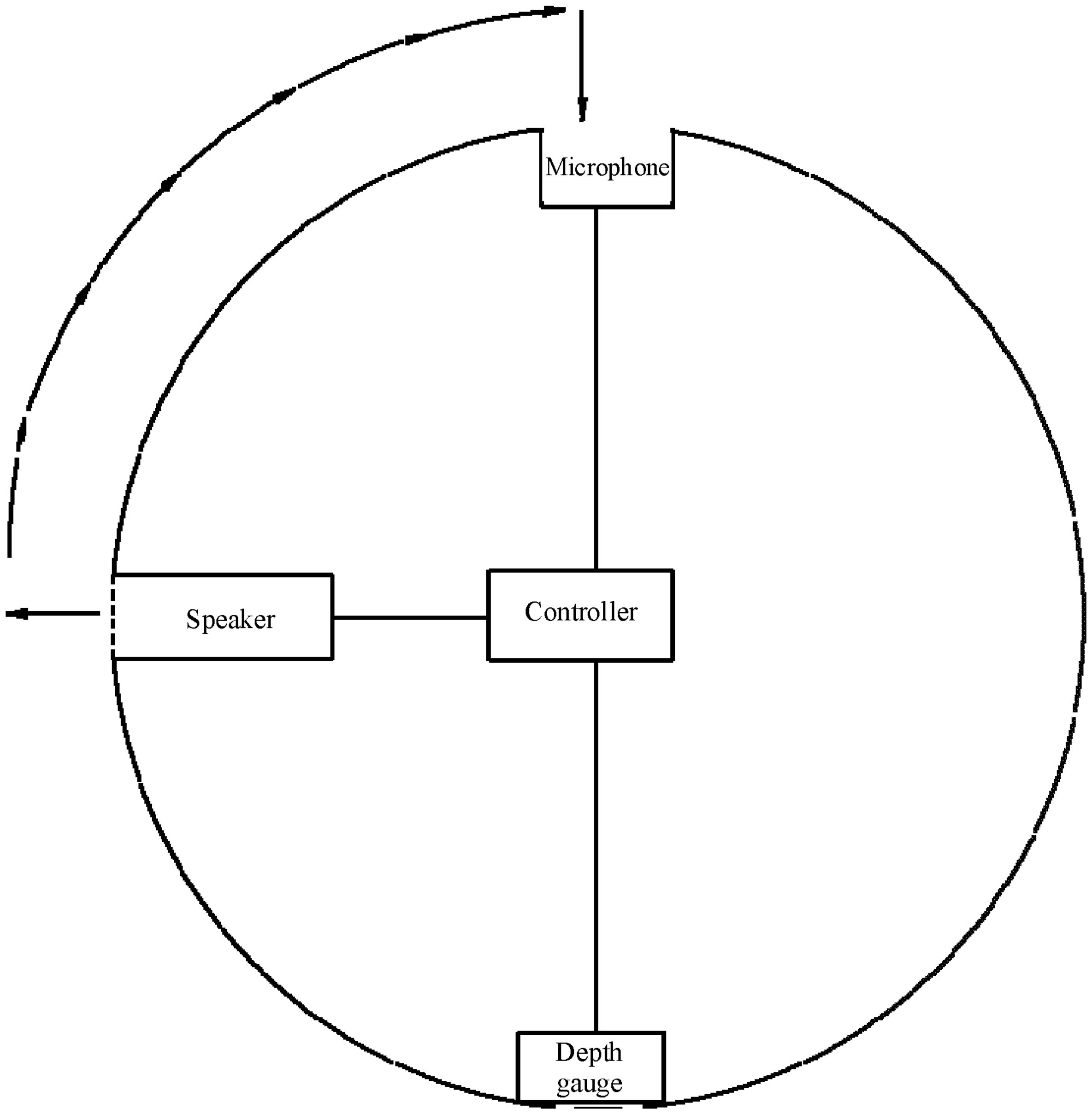
FIG. 21 is a schematic principle diagram of performing status detection on the water-resistant assembly by using a microphone, a speaker, and a depth gauge according to Embodiment 1.

Different from the foregoing solution, in another embodiment, the status of the water-resistant assembly 72 may be determined by using a microphone and a speaker. Descriptions are provided below;

FIG. 21 is a schematic principle diagram of determining the status of the water-resistant assembly 72 in another embodiment. A microphone in FIG. 21 may be the microphone 78. A speaker in FIG. 21 may be the foregoing speaker, or may be replaced by a buzzer (both the buzzer and the speaker can be referred to as a sound-emitting component). A depth gauge in FIG. 21 is configured to measure a depth at which the electronic device 70 is underwater. With reference to FIG. 21, a principle of determining the status of the water-resistant assembly 72 is as follows:

The controller may control the speaker to output a set sound signal (for example, a sound signal of a specific frequency), and the sound signal may be propagated to the outside of the electronic device and may be picked up by the microphone. When the water-resistant assembly 72 is in the turned-off state, the sound signal cannot enter the electronic device through the first channel or the second channel, and therefore the microphone cannot pick up the sound signal. When the controller determines that the microphone does not pick up the sound signal, the controller determines that the water-resistant assembly 72 is in the turned-off state. Conversely, when the water-resistant assembly 72 is in a non-turned-off state (including the turned-on state and an intermediate state between the turned-on state and the turned-off state, where the water-resistant assembly 72 is in the intermediate state when the first channel or the second channel is not completely obstructed), the sound signal may enter the electronic device through the first channel or the second channel, and is picked up by the microphone. When the controller determines that the microphone picks up the sound signal and strength of the sound signal is high, the controller determines that the water-resistant assembly 72 is in the turned-on state. When the controller determines that the microphone picks up the sound signal and strength of the sound signal is low, the controller determines that the water-resistant assembly 72 is in the intermediate state.

Before the electronic device enters the high water pressure scenario, the user may manually switch the water-resistant assembly 72 to the turned-off state. In this case, the electronic device automatically completes status detection of the water-resistant assembly 72, or the user may manually trigger status detection of the water-resistant assembly 72 on a user interface of the electronic device. When the electronic device gives a prompt that the water-resistant assembly 72 is in the turned-off state, the user may carry the electronic device into the high water pressure scenario. Optionally, the user may be given, on the user interface of the electronic device, a prompt of manually switching the water-resistant assembly 72 to the turned-off state. For example, the electronic device is a smartwatch. The user selects "Swimming" or "Diving" on a user interface of the smartwatch, and the watch automatically pops up a prompt window, to display prompt information "Turn off a switch on the side of the watch". Alternatively, if the user does not switch the water-resistant assembly 72 to the turned-on state (that is, does not turn on the switch on the side of the watch) after swimming or diving last time, the water-resistant switch of the watch is already in the turned-off state. When the user selects "Swimming" or "Diving" on a user interface of the smartwatch, the watch may detect, by sending an audio by using the speaker, and picking up the audio by the microphone or detecting the audio by the magnetic field sensor, that the water-resistant assembly 72 is in the turned-off state, or the watch may automatically pop up a prompt window to display prompt information "A water-resistant switch on the side of the watch is turned off".

After the electronic device enters the high water pressure scenario, the status of the water-resistant assembly 72 may change due to high pressure or another abnormality, and liquid may enter the electronic device. To prompt the user with the risk in a timely manner, and avoid liquid leakage damage to the electronic device, the electronic device may perform the status detection on the water-resistant assembly 72 again. For example, the depth at which the electronic device is underwater may be detected by using the depth gauge, and a detection result of the depth gauge may be used as a trigger condition for the status detection. For example, when the controller determines that the depth detected by the depth gauge is a first depth (for example, 0.5 m), the controller may start the status detection. When the controller determines that the depth detected by the depth gauge is a second depth (for example, 5 m), the controller may start the status detection again. It is easy to understand that the status detection performed based on depth information may be triggered only once, or may be triggered several times. A specific quantity of detection times is designed as required, and is not limited to the foregoing descriptions.

In another embodiment, the status detection may not be triggered by using the depth gauge, but the status detection may be triggered according to another preconfigured trigger condition. For example, the status detection may be triggered periodically.

In another embodiment, the status of the water-resistant assembly 72 may alternatively be determined comprehensively with reference to the foregoing magnetic field detection manner and microphone and speaker detection manner. Alternatively, in another embodiment, the status of the water-resistant assembly 72 may be detected.

Embodiment 2

Figure 22:
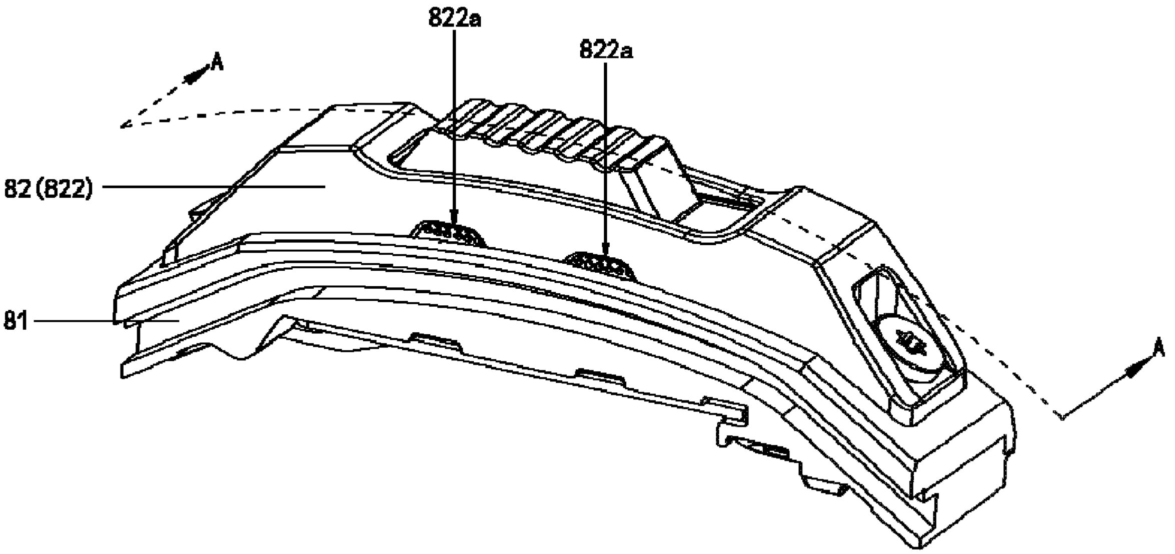
FIG. 22 is a schematic diagram of an assembly structure including a water-resistant assembly and a housing according to Embodiment 2.
Figure 23:
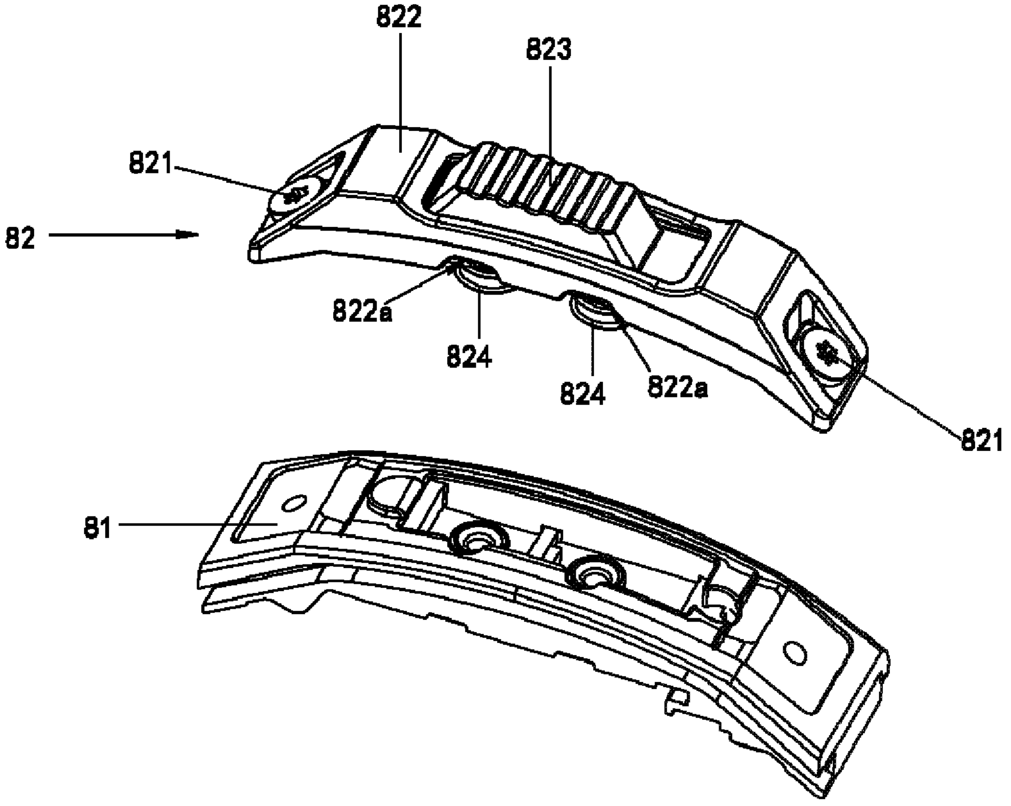
FIG. 23 is a schematic diagram of an exploded structure of the structure shown in FIG. 22.

FIG. 22 is a schematic diagram of a partial assembly structure including a water-resistant assembly 82 and a housing 81 in an electronic device according to Embodiment 2. FIG. 23 is a schematic diagram of an exploded structure of the structure shown in FIG. 22. As shown in FIG. 22 and FIG. 23, the water-resistant assembly 82 may be mounted on the housing 81.

Figure 24:
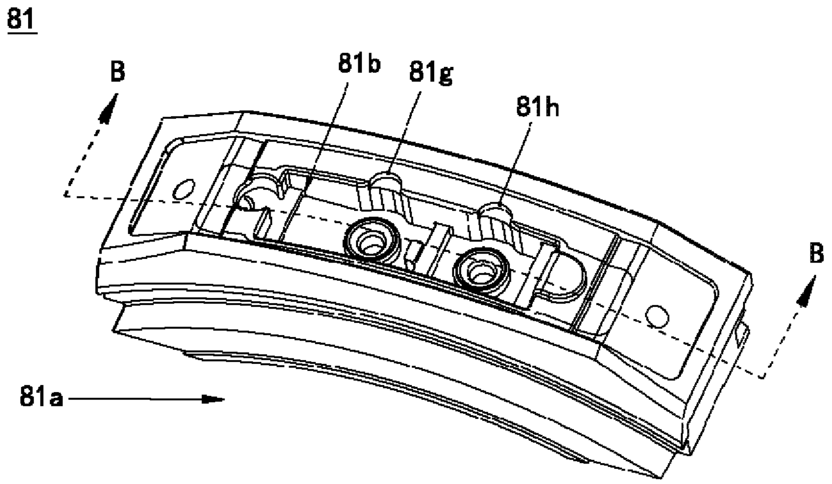
FIG. 24 is a schematic diagram of a structure of the housing in FIG. 23.
Figure 25:
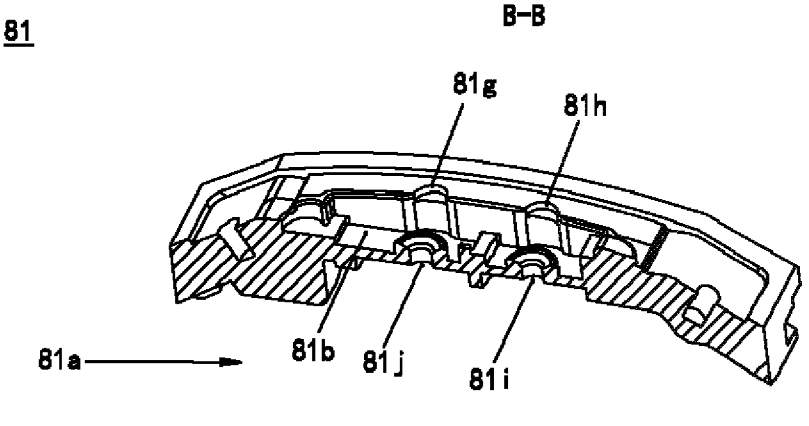
FIG. 25 is a schematic diagram of a B-B sectional structure of the housing in FIG. 24.

As shown in FIG. 24 and FIG. 25, the housing 81 has a housing space 81*a*, and the housing space 81*a* is an internal space of the electronic device in Embodiment 2. An accommodation groove 81*b*, a vent groove 81*g*, and a vent groove 81*h* are provided on the housing 81. Both the vent groove 81*g* and the vent groove 81*h* are opened on a surface on which an opening of the accommodation groove 81*b* is located. Both the vent groove 81*g* and the vent groove 81*h* are connected to the accommodation groove 81*b*. The vent groove 81*g* and the vent groove 81*h* may also be referred to as vents.

As shown in FIG. 25, a housing through hole 81*j* and a housing through hole 81*i* may be provided in a bottom wall of the accommodation groove 81*b*, and both the housing through hole 81*j* and the housing through hole 81*i* are connected to the accommodation groove 81*b* and the housing space 81*a*. As shown in FIG. 25, for example, a periphery of the housing through hole 81*j* and a periphery of the housing through hole 81*i* each may form an annular groove structure. The annular groove structure is used to mount an elastic member in the water-resistant assembly 82 (descriptions are provided below). In another embodiment, a periphery of the housing through hole 81*j* and a periphery of the housing through hole 81*i* each may alternatively be a flat surface, and an annular groove structure does not need to be designed.

It can be learned by comparing FIG. 24 and FIG. 25 with FIG. 6 and FIG. 7 that a structure of the housing 81 is similar to that of the housing 71, and a main difference lies in that the housing 81 does not have a boss. The foregoing internal and external structures of the housing 81 are merely examples, and this embodiment of this application is not limited thereto. For example, the housing in another embodiment may have only one vent groove and one housing through hole.

Figure 26:
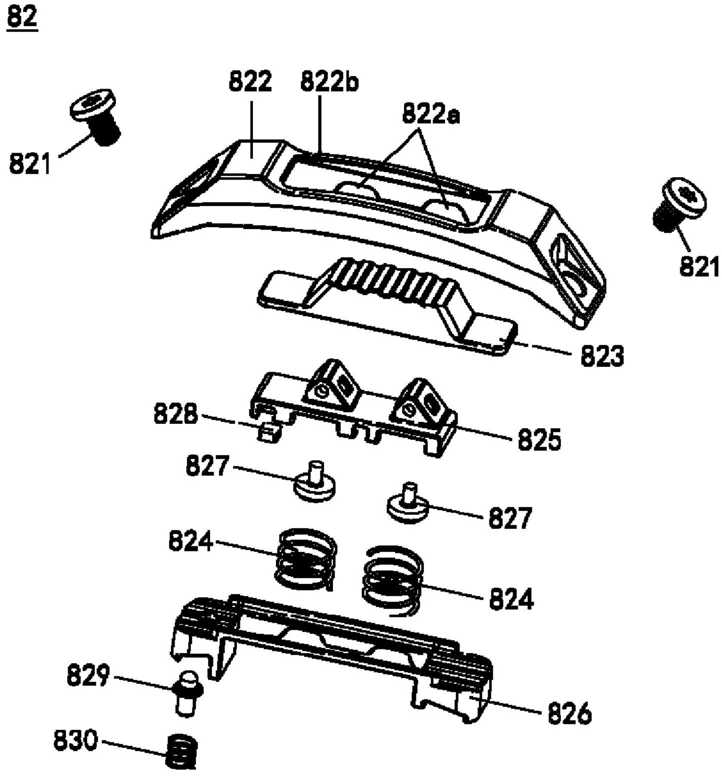
FIG. 26 is a schematic diagram of an exploded structure of the water-resistant assembly in FIG. 24.

As shown in FIG. 26, the water-resistant assembly 82 may include a bracket 822, connecting members 821, a switch 823, a clamping bar 825, sealing members 827, a magnet 828, first elastic members 824, a loading frame 826, a limiting post 829, and a limiting post elastic member 830. Detailed descriptions are provided one by one.

It can be learned by comparing FIG. 11 with FIG. 26 that a structure of the bracket 822 is similar to that of the bracket 722. The bracket 822 may also be roughly a strip-shaped and cover-like structure, the bracket 822 has an inner cavity and an opening 822*b*, and the opening 822*b* is connected to the inner cavity and outside of the bracket 822. Two openings 822*a* may be provided in a wall (for example, a side wall) of one side of the bracket 822, and the openings 822*a* connect the inner cavity to the outside of the bracket 822.

With reference to FIG. 22 to FIG. 25, when the water-resistant assembly 82 is mounted to the housing 81, the bracket 822 is fixedly connected to the housing 81. For example, the bracket 822 may be fixedly connected to the housing 81 by using the connecting members 821 (for example, threaded connecting members). The two openings 822*a* of the bracket 822 are respectively connected to the vent groove 81*g* and the vent groove 81*h* of the housing 81. Therefore, one opening 822*a*, the vent groove 81*g*, the accommodation groove 81*b*, the housing through hole 81*j*, and the housing space 81*a* are sequentially connected. In other words, the opening 822*a*, the vent groove 81*g*, the accommodation groove 81*b*, and the housing through hole 81*j* form a first channel, and the first channel connects outside of the housing 81 and the housing space 81*a*. The other opening 822*a*, the vent groove 81*h*, the accommodation groove 81*b*, the housing through hole 81*i*, and the housing space 81*a* are connected. In other words, the other opening 822*a*, the vent groove 81*h*, the accommodation groove 81*b*, and the housing through hole 81*i* form a second channel, and the second channel connects the outside of the housing 81 to the housing space 81*a*.

Figure 27:
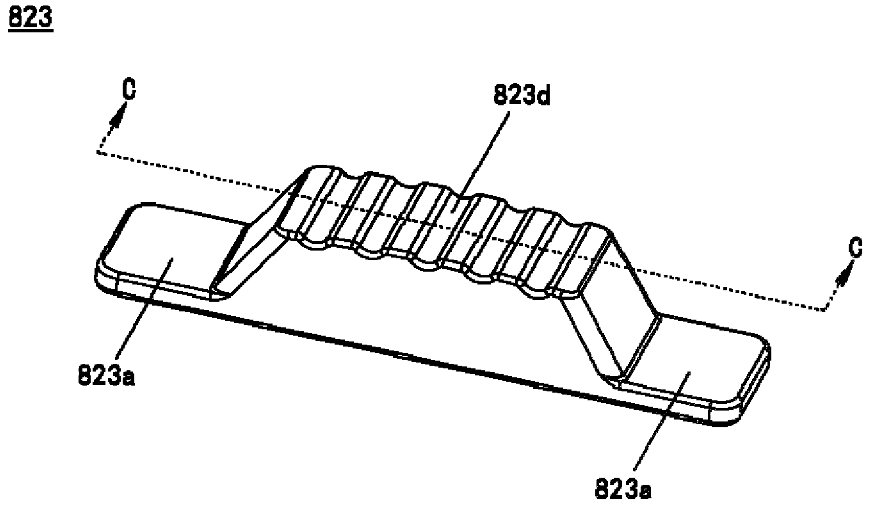
FIG. 27 is a schematic diagram of a structure of a switch in FIG. 26 from a perspective.
Figure 28:
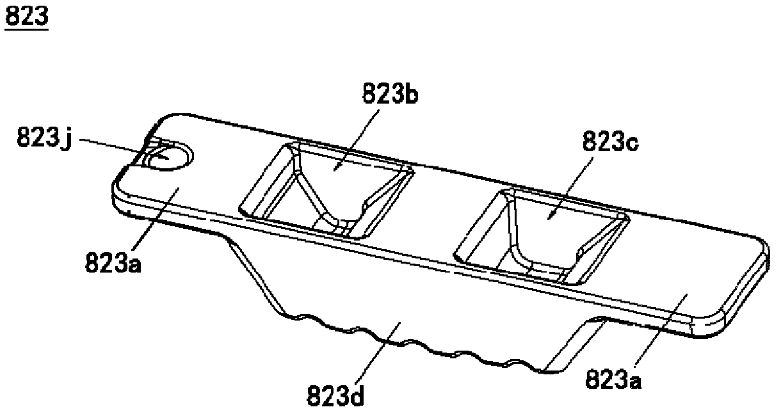
FIG. 28 is a schematic diagram of a structure of the switch in FIG. 27 from another perspective.
Figure 29:
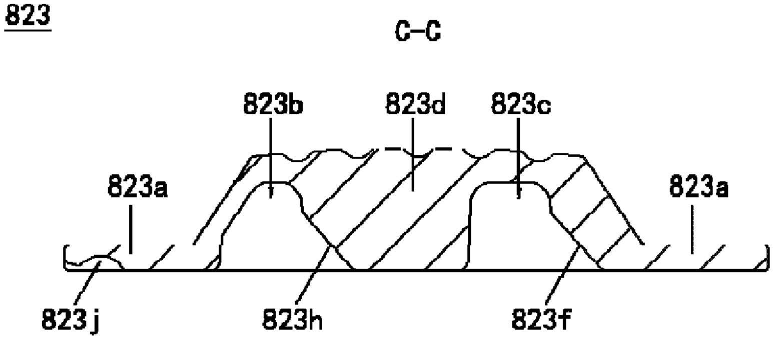
FIG. 29 is a schematic diagram of a C-C sectional structure of the switch in FIG. 27.

As shown in FIG. 27, FIG. 28, and FIG. 29, the switch 823 may be roughly a strip-shaped and cover-like structure. The switch 823 may include sliding parts 823*a* and a force-applying part 823*d*. The sliding parts 823*a* may be in a shaped like a flat plate, there may be two sliding parts 823*a*, and the two sliding parts 823*a* may be basically located on the same plane. The force-applying part 823*d* may be connected between the two sliding parts 823*a*, and protrudes relative to the sliding parts 823*a*. A partial region of the force-applying part 823*d* is concave to form a first accommodation space 823*b* and a second accommodation space 823*c*, and the first accommodation space 823*b* and the second accommodation space 823*c* are spaced apart. Sizes of the first accommodation space 823*b* and the second accommodation space 823*c* may be consistent.

As shown in FIG. 29, a first switch slope 823*h* is included on an inner surface of the first accommodation space 823*b*, a second switch slope 823*f* is included on an inner surface of the second accommodation space 823*c*, and the second switch slope 823*f* may be parallel to the first switch slope 823*h*.

As shown in FIG. 29, a limiting groove 823*j* may be further provided on each of the sliding parts 823*a*. For example, the limiting groove 823*j* may be located on a side that is of the first accommodation space 823*b* and that is away from the second accommodation space 823*c*. An opening of the limiting groove 823*j* and an opening of the first accommodation space 823*b* face a same direction.

It can be learned by comparing FIG. 27 to FIG. 29 with FIG. 13 and FIG. 14 that a structure of the switch 823 is similar to that of the switch 723, and a difference lies in that the switch 823 does not have a first protrusion and a second protrusion, but the limiting groove 823*j* is designed. The foregoing internal and external structures of the switch 823 are merely examples, and this embodiment of this application is not limited thereto. For example, the switch in another embodiment may have only one accommodation space.

Figure 30:
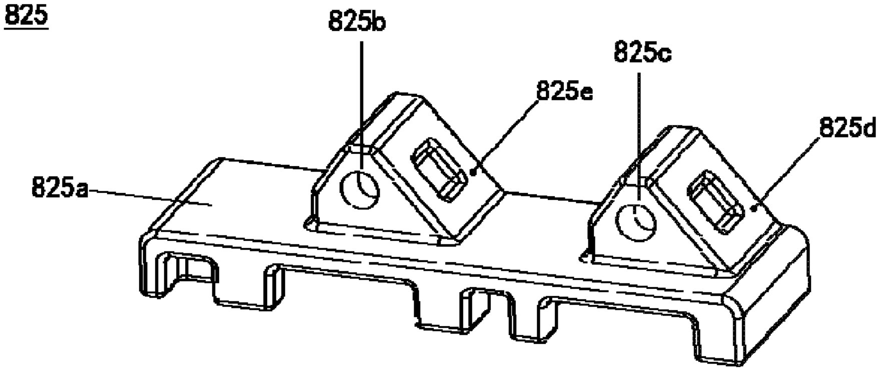
FIG. 30 is a schematic diagram of a structure of a clamping bar in FIG. 26 from a perspective.
Figure 31:
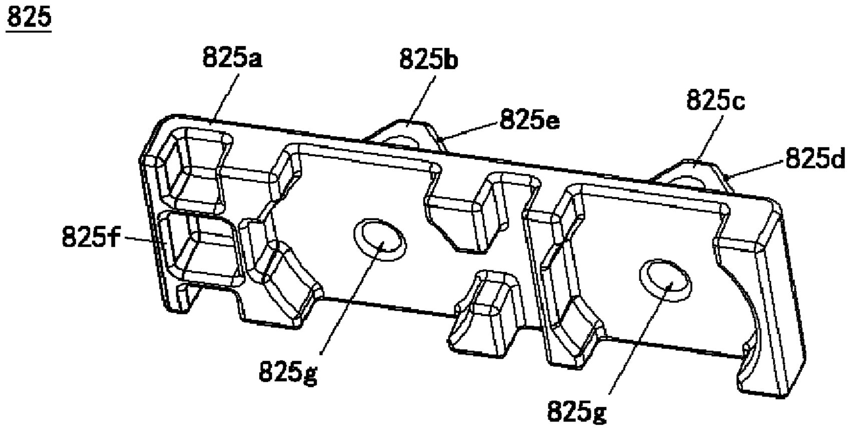
FIG. 31 is a schematic diagram of a structure of the clamping bar in FIG. 30 from another perspective.

As shown in FIG. 30 and FIG. 31, the clamping bar 825 may include a substrate 825*a*, an accommodation part 825*f*, a clamping bar matching part 825*b*, and a clamping bar matching part 825*c*. The substrate 825*a* may be roughly in a shaped like a flat plate. Two accommodation grooves 825*g* may be provided on a surface of one side of the substrate 825*a* (a normal of the surface may be in a thickness direction of the substrate 825*a*). The accommodation part 825*f* and the accommodation grooves 825*g* may be located on a same side of the substrate 825*a*. The clamping bar matching part 825*b* and the clamping bar matching part 825*c* may be connected to the other side of the substrate 825*a*, and the clamping bar matching part 825*b* is spaced from the clamping bar matching part 825*c*.

As shown in FIG. 30, shapes of the clamping bar matching part 825*b* and the clamping bar matching part 825*c* may be basically consistent, and both may be roughly prismatic structures having trapezoidal cross sections. The clamping bar matching part 825*b* has a first clamping bar slope 825*e*. Slopes of the first clamping bar slope 825*e* and the first switch slope 823*h* may be consistent. When the clamping bar 825 and the switch 823 are assembled, the first clamping bar slope 825*e* may be parallel to the first switch slope 823*h*. The clamping bar matching part 825*c* has a second clamping bar slope 825*d*. Slopes of the second clamping bar slope 825*d* and the second switch slope 823*f* may be consistent. When the clamping bar 825 and the switch 823 are assembled, the second clamping bar slope 825*d* may be parallel to the second switch slope 823*f*.

It can be learned by comparing FIG. 30 and FIG. 31 with FIG. 15 to FIG. 17 that a structure of the clamping bar 825 is similar to that of the first clamping bar 725 and the second clamping bar 726, and a difference lies in that the clamping bar 825 is equivalent to a combination of the first clamping bar 725 and the second clamping bar 726. The single clamping bar 825 has better movement stability.

Different from Embodiment 2, in another embodiment, the clamping bar may include only one matching part.

Refer to FIG. 26. The sealing members 827 may be rotary bodies. The sealing members 827 may be made of sealing materials that are prone to elastic deformation, for example, rubber or silica gel. There may be two sealing members 827. With reference to FIG. 26 and FIG. 31, one sealing member 827 may be fastened in one accommodation groove 825*g* of the clamping bar 825, and the other sealing member 827 may be fastened in the other accommodation groove 825*g*. In another embodiment, when a clamping bar has only one matching part, only one sealing member may be provided.

With reference to FIG. 26 and FIG. 31, the magnet 828 may be fastened in the accommodation part 825*f* of the clamping bar 825.

As shown in FIG. 26, the first elastic members 824 may be springs. There may be two first elastic members 824. In another embodiment, the spring may alternatively be replaced by another component that can provide an elastic force. When a clamping bar has only one matching part, only one first elastic member may be provided.

Figure 32:
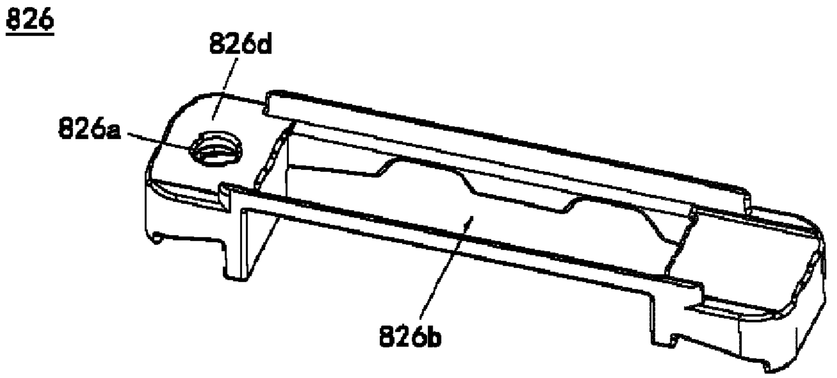
FIG. 32 is a schematic diagram of a structure of a loading frame in FIG. 26 from a perspective.
Figure 33:
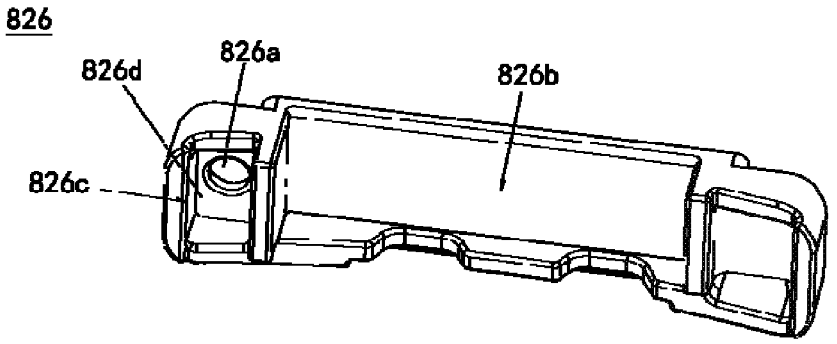
FIG. 33 is a schematic diagram of a structure of the loading frame in FIG. 32 from another perspective.

As shown in FIG. 32 and FIG. 33, the loading frame 826 may be roughly a frame structure, and a specific structure of the loading frame 826 may be designed based on product requirements. The loading frame 826 may have an accommodation groove 826*c*, an accommodation through hole 826*a* may be provided in a bottom wall 826*d* of the accommodation groove 826*c*, and the accommodation through hole 826*a* is connected to the accommodation groove 826*c*. The loading frame 826 may also have a hollow region 826*b*, and the hollow region 826*b* may be considered as a space formed by removing a material.

Figure 34:
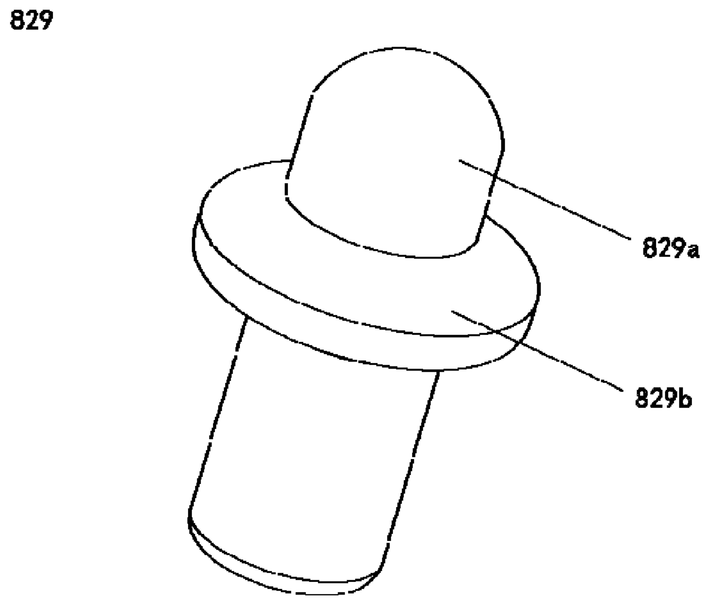
FIG. 34 is a schematic diagram of a structure of a limiting post in FIG. 26.

As shown in FIG. 34, the limiting post 829 may include a post body 829*a* and a limiting skirt 829*b* that surrounds an outer circumferential surface of the post body 829*a*. The post body 829*a* may be roughly a cylindrical structure, and one end of the post body 829*a* may roughly form a spherical surface.

As shown in FIG. 26, the limiting post elastic member 830 may be a spring. In another embodiment, the spring may alternatively be replaced by another component that can provide an elastic force.

Figure 35:
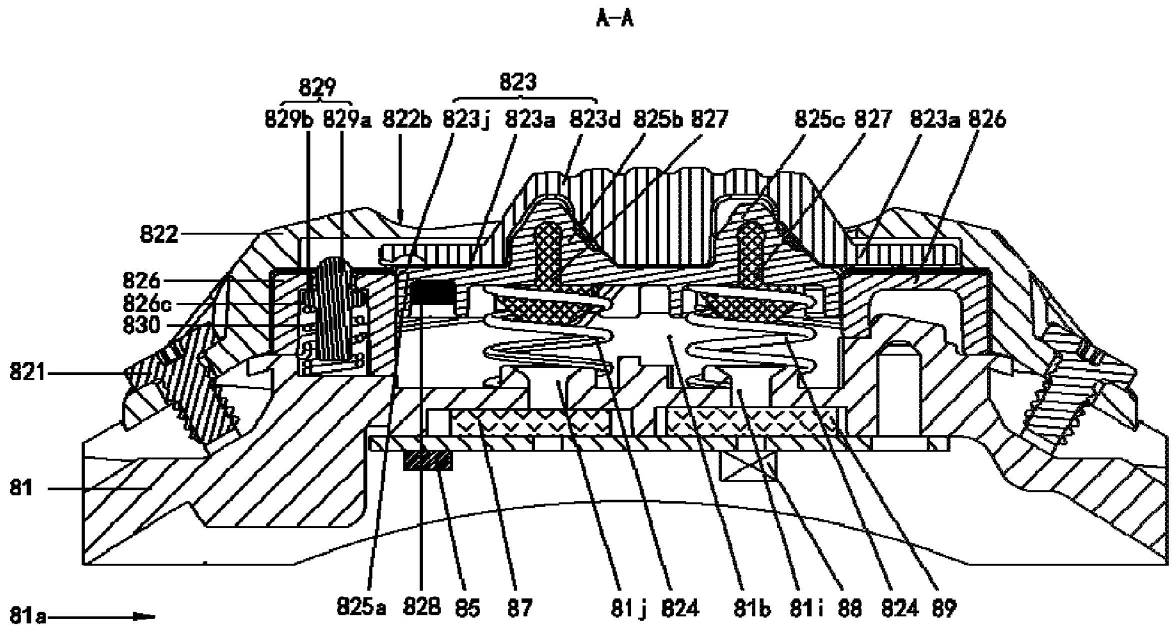
FIG. 35 is a schematic diagram of an A-A sectional structure including the water-resistant assembly and the housing according to Embodiment 2.

FIG. 35 is a schematic diagram of an A-A sectional structure of the structure of the electronic device in FIG. 22. FIG. 35 may represent an assembly structure including the water-resistant assembly 82 and the housing 81. Detailed descriptions are provided below.

As shown in FIG. 35, a first water-resistant and breathable film 87 and a second water-resistant and breathable film 89 may be mounted in the housing space 81*a* of the housing 81. For example, the first water-resistant and breathable film 87 may cover one end of the housing through hole 81*j*, and the second water-resistant and breathable film 89 may cover one end of the housing through hole 81*i*. Both the first water-resistant and breathable film 87 and the second water-resistant and breathable film 89 are breathable and have specific water-resistant performance (can prevent liquid from permeating and prevent liquid from passing through).

As shown in FIG. 35, a microphone 88 may be further mounted in the housing space 81*a* of the housing 81. The microphone 88 may correspond to the housing through hole 81*i*, and a sound that enters the housing space 81*a* through the second channel may pass through the second water-resistant and breathable film 89 and be picked up by the microphone 88.

In this embodiment, a speaker and a controller (not shown in FIG. 35) may be further mounted in the internal space of the electronic device, and specific positions of the speaker and the controller may be designed as required. A sound emitted by the speaker may be transmitted to outside of the electronic device. The housing through hole 81*j* may serve as an air pressure balancing hole of the speaker. The controller may be a central processing unit or a microcontroller unit (MCU).

In another embodiment, functions of the housing through hole 81*j* and/or the housing through hole 81*i* are not limited to those described above. For example, a second microphone may be further mounted in the housing space 81*a*. The second microphone corresponds to the housing through hole 81*j*, and a sound entering the housing space 81*a* through the first channel may pass through the first water-resistant and breathable film 88 and be picked up by the second microphone.

As shown in FIG. 35, a magnetic field sensor 85 may be further mounted in the housing space 81*a* of the housing 81, and the magnetic field sensor 85 is configured to: sense a magnetic flux of the magnet 828 and generate a detection signal. A type and an operating principle of the magnetic field sensor 85 may be the same as those of the magnetic field sensor 75. Details are not described herein again.

With reference to FIG. 24. FIG. 32, and FIG. 35, the loading frame 826 may be mounted to the housing 81, and the hollow region 826*b* of the loading frame 826 corresponds to and is connected to the accommodation groove 81*b* of the housing 81. In another embodiment, the water-resistant assembly may not include the loading frame 826, and the loading frame 826 may be considered as a part of the housing of the electronic device.

As shown in FIG. 35, the limiting post 829 may be mounted in the accommodation groove 826*c* of the loading frame 826. With reference to FIG. 32 and FIG. 35, the post body 829*a* of the limiting post 829 may protrude from the accommodation through hole 826*a* of the loading frame 826, and the limiting skirt 829*b* of the limiting post 829 may be in contact with the bottom wall 826*d* of the accommodation groove 826*c*. The limiting post elastic member 830 may be located in the accommodation groove 826*c*. One end of the limiting post elastic member 830 may abut against the housing 81, and the other end may abut against the limiting skirt 829*b*. An elastic force of the limiting post elastic member 830 toward the limiting skirt 829*b* may keep the limiting skirt 829*b* in contact with the bottom wall 826*d* of the accommodation groove 826*c*, and further expose one end of the post body 829*a* outside the loading frame 826.

As shown in FIG. 35, the bracket 822 may be fastened to the housing 81 by using the connecting members 821. The bracket 822 encloses the loading frame 826 and forms an assembly gap with the loading frame 826. With reference to FIG. 32 and FIG. 35, the opening 822*b* of the bracket 822 may be basically aligned with the hollow region 826*b* of the loading frame 826, and the accommodation groove 826*c* of the loading frame 826 may be covered by the bracket 822.

As shown in FIG. 35, the switch 823 is carried on the loading frame 826, the two sliding parts 823*a* at two ends of the switch 823 may be located in the assembly gap, and the sliding parts 823*a* may slide along a top surface of the loading frame 826. In a state shown in FIG. 35, the sliding parts 823*a* may be at right limit positions. The force-applying part 823*d* of the switch 823 may be exposed from the opening 822*b* of the bracket 822. The force-applying part 823*d* may be used by a user to apply a force. When the user pushes and pulls the force-applying part 823*d*, the switch 823 may slide.

With reference to FIG. 29, FIG. 30, and FIG. 35, the clamping bar matching part 825*b* of the clamping bar 825 may be accommodated in the first accommodation space 823*b* of the switch 823. The first clamping bar slope 825*e* of the clamping bar matching part 825*b* is in contact with and parallel to the first switch slope 823*h* of the switch 823, and a bottom of the first clamping bar slope 825*e* (one end that is of the first clamping bar slope 825*e* and that is connected to the substrate 825*a*) is in contact with a top of the first switch slope 823*h* (one end that is of the first switch slope 823*h* and that is located at the opening of the first accommodation space 823*b*). Similarly, the clamping bar matching part 825*c* of the clamping bar 825 may be accommodated in the second accommodation space 823*c* of the switch 823. The second clamping bar slope 825*d* of the clamping bar matching part 825*c* is in contact with and parallel to the second switch slope 823*f* of the switch 823, and a bottom of the second clamping bar slope 825*d* (one end that is of the second clamping bar slope 825*d* and that is connected to the substrate 825*a*) is in contact with a top of the second switch slope 823*f* (one end that is of the second switch slope 823*f* and that is located at an opening of the second accommodation space 823*c*).

With reference to FIG. 29 and FIG. 35, the substrate 825*a* of the clamping bar 825 may be located in the accommodation groove 81*b*, and the substrate 825*a* may be in contact with the switch 823. The magnet 828 on the substrate 825*a* is located in the accommodation groove 81*b*. The magnet 828 may be aligned with the magnetic field sensor 85 in position, so that the magnetic field sensor 85 detects the magnetic flux of the magnet 828.

As shown in FIG. 35, the two sealing members 827 may be respectively fastened to the clamping bar matching part 825*b* and the clamping bar matching part 825*c*, and heads of the two sealing members 827 may be located in the accommodation groove 81*b*. One sealing member 827 may be aligned with and spaced from the housing through hole 81*j*, and the other sealing member 827 may be aligned with and spaced from the housing through hole 81*i*. One end of each of the two first elastic members 824 may abut against the substrate 825*a*, and the other end may abut against the bottom wall of the accommodation groove 81*b*. One first elastic member 824 may surround a periphery of one sealing member 827, and the other first elastic member 824 may surround a periphery of the other sealing member 827. Due to elastic support from the first elastic members 824, the substrate 825*a* can be kept in contact with the switch 823.

The water-resistant assembly in FIG. 22 and FIG. 35 is in a turned-on state. The first channel formed by one opening 822*a*, the vent groove 81*g*, the accommodation groove 81*b*, and the housing through hole 81*j* is in the turned-on state, and the first channel connects the outside of the housing 81 to the housing space 81*a*. The second channel formed by the other opening 822*a*, the vent groove 81*h*, the accommodation groove 81*b*, and the housing through hole 81*i* is in the turned-on state, and the second channel connects the outside of the housing 81 to the housing space 81*a*.

Therefore, a sound from the outside of the electronic device can enter the electronic device through the second channel and be picked up by the microphone 88. External air can also enter the electronic device through the first channel, to balance air pressure inside and outside the electronic device. Because the first water-resistant and breathable film 87 and the second water-resistant and breathable film 89 exist, external liquid cannot enter the electronic device, so that the electronic device can be breathable and water-resistant in a daily scenario.

Refer to FIG. 35. When the user pushes the force-applying part 823*d* to the left, the sliding parts 823*a* slide to the left. In this case, with reference to FIG. 29 and FIG. 30, the first switch slope 823*h* exerts pressure on the first clamping bar slope 825*e*, to increase an elastic force of an elastic member 824 on the left against the substrate 825*a*; and the second switch slope 823*f* exerts pressure on the second clamping bar slope 825*d*, to increase an elastic force of an elastic member 824 on the right against the substrate 825*a*. Under a joint action of the pressure and the elastic force, the clamping bar 825 moves downward, the first clamping bar slope 825*e* and the first switch slope 823*h* slide relative to each other, the second clamping bar slope 825*d* and the second switch slope 823*f* slide relative to each other, a sealing member 827 on the left gradually approaches the housing through hole 81*j*, and a sealing member 827 on the right gradually approaches the housing through hole 81*i*.

Figure 36:
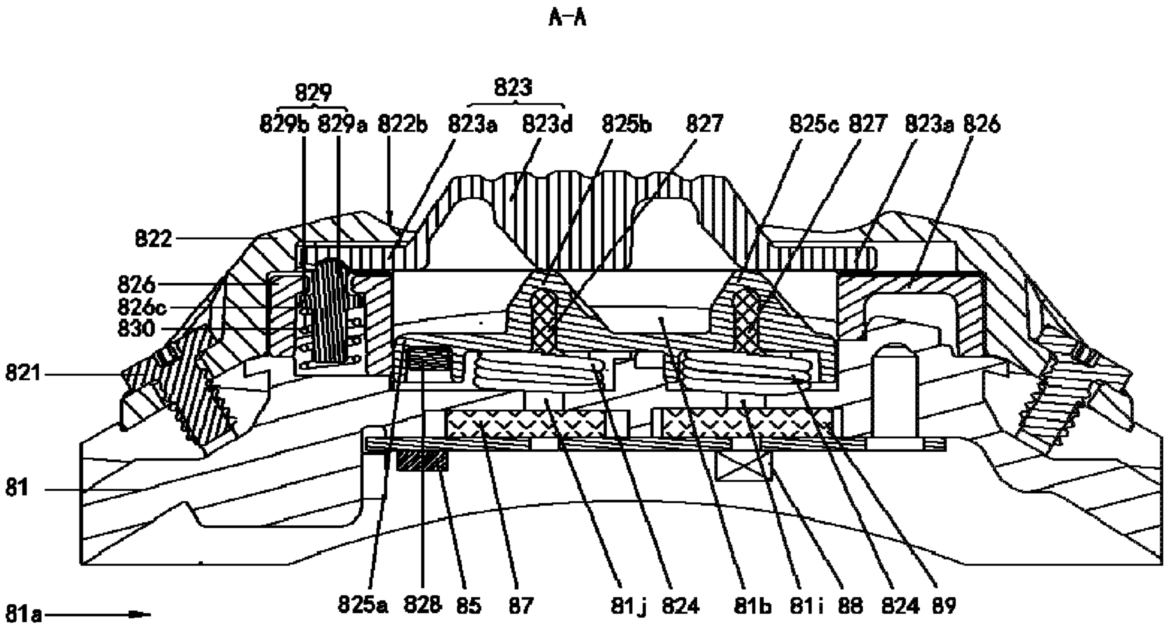
FIG. 36 is a schematic diagram of another A-A sectional structure including the water-resistant assembly and the housing according to Embodiment 2.

A state in FIG. 36 indicates that the two sealing members 827 respectively press against an opening of the housing through hole 81*j* and an opening of the housing through hole 81*i*, and block the housing through hole 81*j* and the housing through hole 81*i*. In this case, the water-resistant assembly 82 is in a turned-off state.

In the turned-off state, with reference to FIG. 29. FIG. 30, and FIG. 36, the top of the first switch slope 823*h* is in contact with a top of the first clamping bar slope 825*e* (one end that is of the first clamping bar slope 825*e* and that is away from a bottom 825*a*), and a top of the second clamping bar slope 825*d* (one end that is of the second clamping bar slope 825*d* and that is away from the bottom 825*a*) is in contact with the top of the second switch slope 823*f*. As shown in FIG. 36, the switch 823 may separately press the clamping bar 825 directly above the two sealing members 827, so that the two sealing members 827 can be reliably pressed against the opening of the housing through hole 81*j* and the opening of the housing through hole 81*i*. In this way, the two sealing members 827 are not tilted to affect a sealing effect.

In the turned-off state, with reference to FIG. 29. FIG. 34, and FIG. 36, the sliding parts 823*a* slide to left limit positions. Because the limiting post elastic member 830 elastically supports the limiting skirt 829*b*, the end of the post body 829*a* is clamped into the limiting groove 823*j*, so that the switch 823 is locked at the left limit position and the water-resistant assembly 82 is further kept in the turned-off state.

In the turned-off state, both the first channel and the second channel are obstructed, and the outside of the housing 81 is disconnected from the housing space 81*a*, so that external liquid cannot enter the electronic device 70. Because the sealing members 827 have stable and reliable sealing performance, even if the external liquid has high pressure, it is difficult or impossible for the external liquid to enter the electronic device.

To use the electronic device in a high water pressure scenario, the user may push the switch 823 in advance, so that the water-resistant assembly 82 is in the turned-off state, and then the user may carry the electronic device into the high water pressure scenario. Because the water-resistant assembly 82 has blocked a large amount of high-pressure liquid, the first water-resistant and breathable film 87 and the second water-resistant and breathable film 89 do not need to withstand high pressure, and therefore are not prone to damage. Therefore, the electronic device can operate reliably in the high water pressure scenario.

To sum up, the switch 823 can be pushed to switch the water-resistant assembly 82 between the turned-on state and the turned-off state, so that the electronic device can be breathable and water-resistant in the daily scenario, and the electronic device can operate safely and reliably in the high water pressure scenario.

Similarly to Embodiment 1, in Embodiment 2, status detection of the water-resistant assembly 82 may also be implemented by using the magnetic field sensor 85 and the magnet 828 and/or by using a microphone and a speaker (or by using a depth gauge), and prompt information is sent based on a status detection result of the water-resistant assembly 82. A specific principle is the same as that described above. Details are not described herein again.

In another embodiment, a status of the water-resistant assembly 82 may alternatively not be detected.

In another embodiment, several alternative variant designs may be made for the solution of Embodiment 2 based on product requirements.

In an embodiment, a clamping bar may be connected to two sealing members, but the clamping bar has only one clamping bar matching part. Correspondingly, a switch may have only one accommodation space and one switch slope. Matching between the switch and the clamping bar is similar to those described in Embodiment 1 and Embodiment 2, and motion transfer is implemented through slope matching. In other words, a movement direction of the switch is basically perpendicular to a movement direction of the clamping bar. In addition, when the switch moves to a limit position at which the sealing members are enabled to block housing through holes, a bracket may lock the switch. For example, the bracket and the switch may lock the switch through matching between a protrusion and a groove.

In another implementation, motion transfer between a switch and a clamping bar is not implemented through slope matching (a movement direction of the switch is perpendicular to a movement direction of the clamping bar), and the movement direction of the switch and the movement direction of the clamping bar may be consistent. For example, the switch may be directly or indirectly connected to the clamping bar, the switch may move in a direction of a center line of a housing through hole, and the clamping bar may move in the direction of the center line of the housing through hole driven by the switch. In this embodiment, the clamping bar may be connected to at least one sealing member.

In another embodiment, a movement direction of a switch is perpendicular to a movement direction of a clamping bar, and a movement of the switch may be transmitted to the clamping bar by using an intermediate component. For example, the intermediate component may be disposed between the switch and the clamping bar, and the intermediate component may include a rotating shaft part and a cam part that are connected. A curved chute may be provided on the rotating shaft part, and the switch may slidably match the chute. The cam part may be in sliding contact with the clamping bar, and a diameter of the cam part is not uniform. A part with a smaller diameter is in sliding contact with the clamping bar, so that the clamping bar is away from a housing through hole; or a part with a larger diameter is in sliding contact with the clamping bar, so that the clamping bar is close to a housing through hole. When the switch moves, because the switch matches the chute, the switch may drive the rotating shaft part to rotate, so that the rotating shaft part drives the cam part to rotate, and further the clamping bar can approach or keep away from the housing through hole. In this embodiment, the clamping bar may be connected to at least one sealing member.

Embodiment 3

Figure 37:
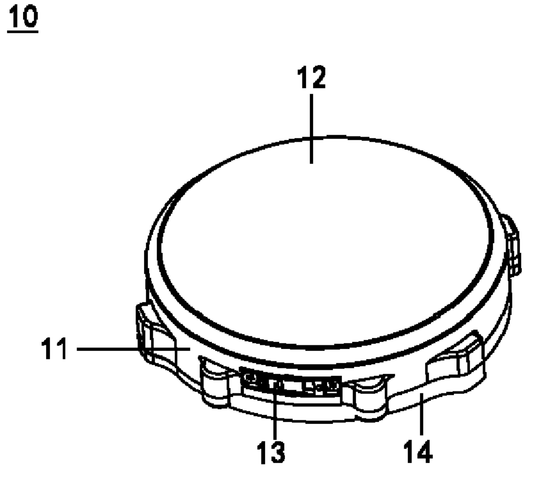
FIG. 37 is a schematic diagram of an assembly structure of an electronic device according to Embodiment 3.
Figure 38:
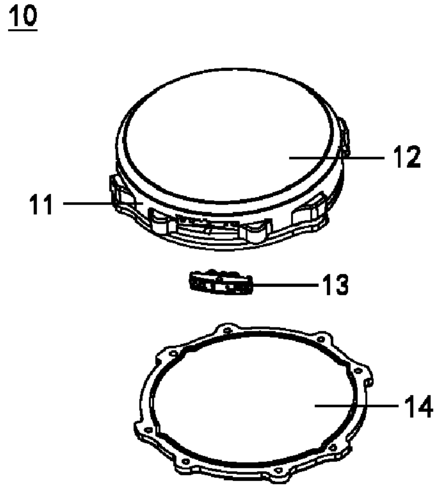
FIG. 38 is a schematic diagram of an exploded structure of the electronic device shown in FIG. 37.

As shown in FIG. 37 and FIG. 38, an electronic device 10 in Embodiment 3 may be, for example, a smartwatch. The electronic device 10 may include a display 12, a housing 11 (may be referred to as, for example, a middle frame), a housing 14 (may be referred to as, for example, a rear housing), and a water-resistant assembly 13. The display 12 and the housing 14 are respectively mounted on two opposite sides of the housing 11. The display 12, the housing 11, and the housing 14 may enclose an inner cavity of the electronic device 10. The water-resistant assembly 13 may be mounted on the housing 11.

Figure 39:
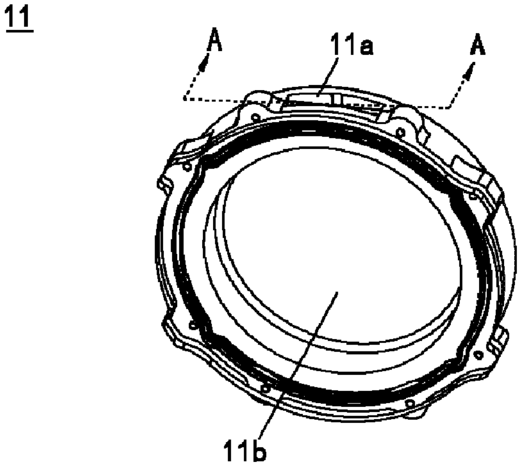
FIG. 39 is a schematic diagram of a structure of a housing of the electronic device according to Embodiment 3.
Figure 40:
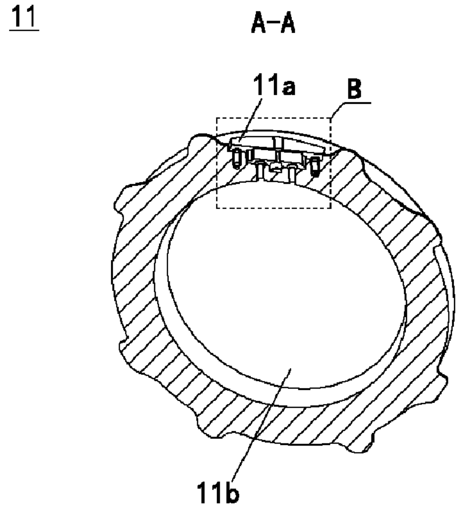
FIG. 40 is a schematic diagram of an A-A sectional structure of the housing shown in FIG. 39.

As shown in FIG. 39 and FIG. 40, for example, the housing 11 may be approximately in a ring shape. The housing 11 has a housing space 11*b*, and the housing space 11*b* is a part of the inner cavity of the electronic device 10. A groove 11*a* is provided on the housing 11, and an opening of the groove 11*a* is located on an outer circumferential side surface of the housing 11. The groove 11*a* is used to mount the water-resistant assembly 13.

Figure 41:
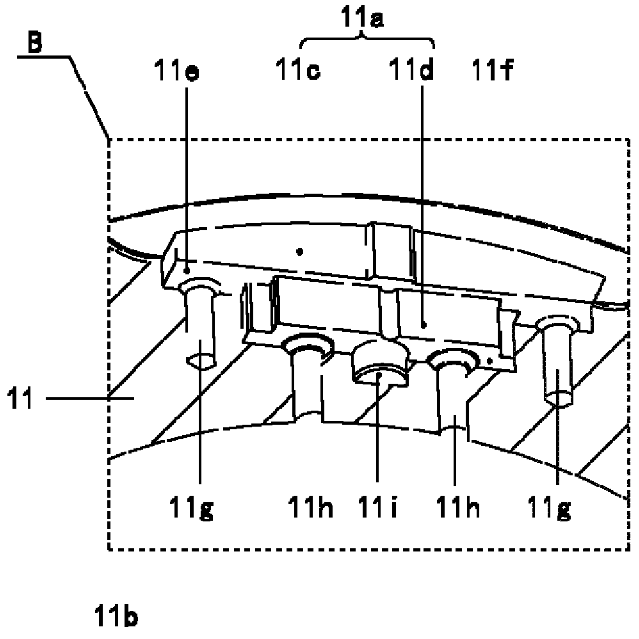
FIG. 41 is a schematic diagram of a partially enlarged structure at a position B in FIG. 40.

As shown in FIG. 40 and FIG. 41, the groove 11*a* on the housing 11 may be a stepped groove, the groove 11*a* may include a first groove 11*c* and a second groove 11*d*, and an opening of the first groove 11*c* may be greater than an opening of the second groove 11*d*.

As shown in FIG. 41, connection holes 11*g* may be provided in a bottom surface 11*e* of the first groove 11*c*, and the connection holes 11*g* may be blind holes. For example, there may be two connection holes 11*g*, and the two connection holes 11*g* are respectively located on two sides of the bottom surface 11*e*.

As shown in FIG. 41, two housing through holes 11*h* may be provided in a bottom surface 11*f* of the second groove 11*d*. The two housing through holes 11*h* may be spaced apart from a side surface of the second groove 11*d*. The two housing through holes 11*h* may pass through a bottom wall of the second groove 11*d* and are connected to the housing space 11*b* of the housing 11. In other words, the groove 11*a* may be connected to the housing space 11*b* through the two housing through holes 11*h*. A mounting groove 11*i* may be further provided on the bottom surface 11*f* of the second groove 11*d*, and the mounting groove 11*i* may be located between the two housing through holes 11*h*.

Figure 42:
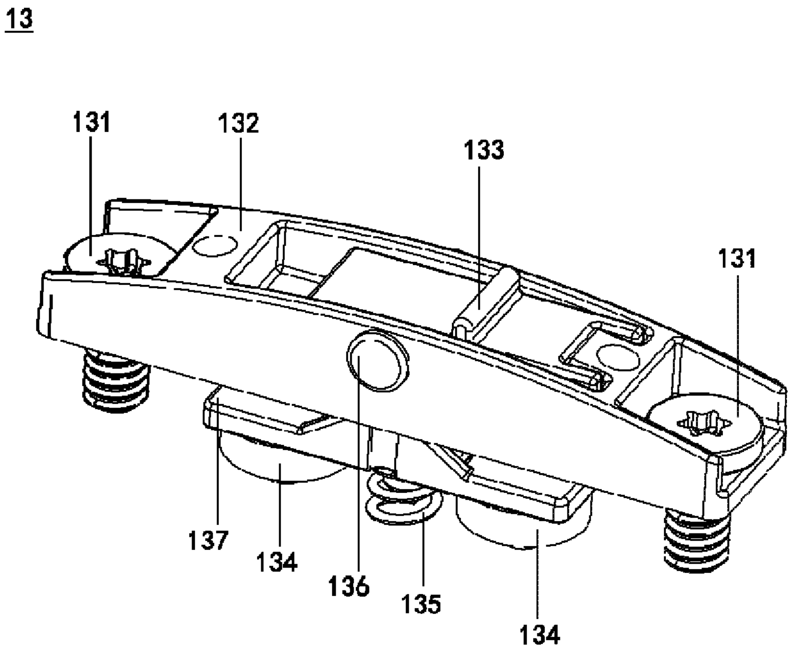
FIG. 42 is a schematic diagram of an assembly structure of a water-resistant assembly according to Embodiment 3.
Figure 43:
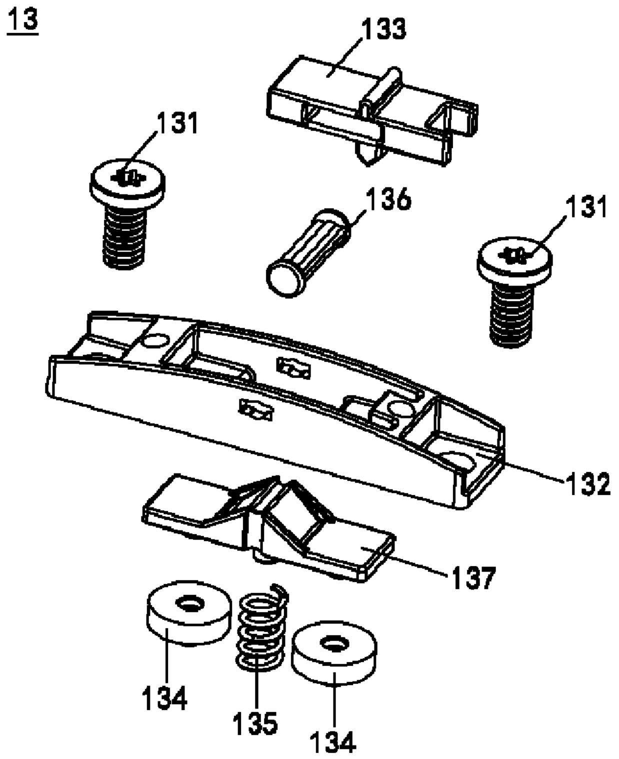
FIG. 43 is a schematic diagram of an exploded structure of the water-resistant assembly shown in FIG. 42.

As shown in FIG. 42 and FIG. 43, the water-resistant assembly 13 may include a bracket 132, a pin shaft 136, a switch 133, connecting members 131 (which may be, for example, screws), a clamping bar 137, sealing members 134, and an elastic member 135.

Figure 44:
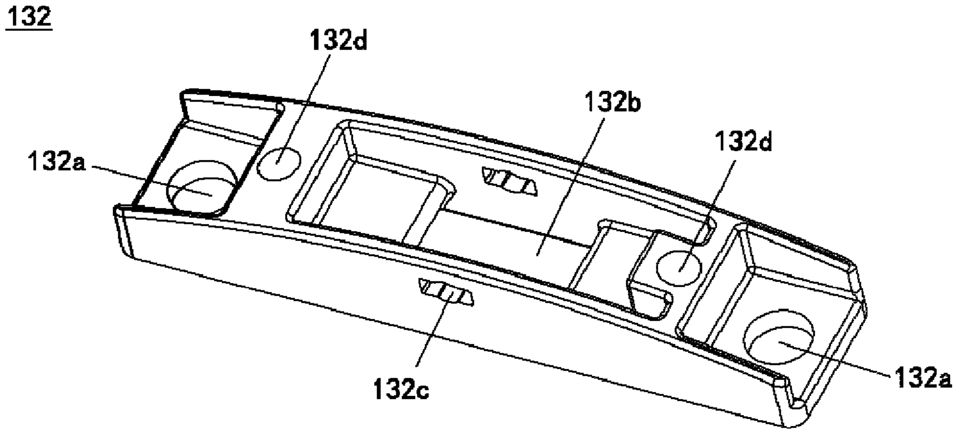
FIG. 44 is a schematic diagram of a structure of a bracket in FIG. 43.

As shown in FIG. 44, the bracket 132 may be approximately an elongated frame structure. Connection holes 132*a* may be provided in the bracket 132, and the connection holes 132*a* are through holes. For example, there may be two connection holes 132*a*, and the two connection holes 132*a* are respectively located at two ends of the bracket 132. The connection holes 132*a* are used to mount the connecting members 131. Bracket through holes 132*d* may be further provided in the bracket 132. There may be two bracket through holes 132*d*, and the two bracket through holes 132*d* may be located between the two connection holes 132*a*. A region between the two bracket through holes 132*d* in the bracket 132 may be hollowed out to form an accommodation space 132*b*. A mounting hole 132*c* may be provided in a wall of the accommodation space 132*b*. The mounting hole 132*c* is also located between the two bracket through holes 132*d*. The mounting hole 132*c* may be a circular hole or a non-circular hole.

As shown in FIG. 43, the pin shaft 136 may be approximately shaped like a post or a rod. A body part of the pin shaft 136 may not be cylindrical, and a cross section of the body part may be irregular in shape. With reference to FIG. 43 and FIG. 44, the pin shaft 136 may match the mounting hole 132*c* in the bracket 132, so that the pin shaft 136 can be fastened in the mounting hole 132*c*.

Figure 45:
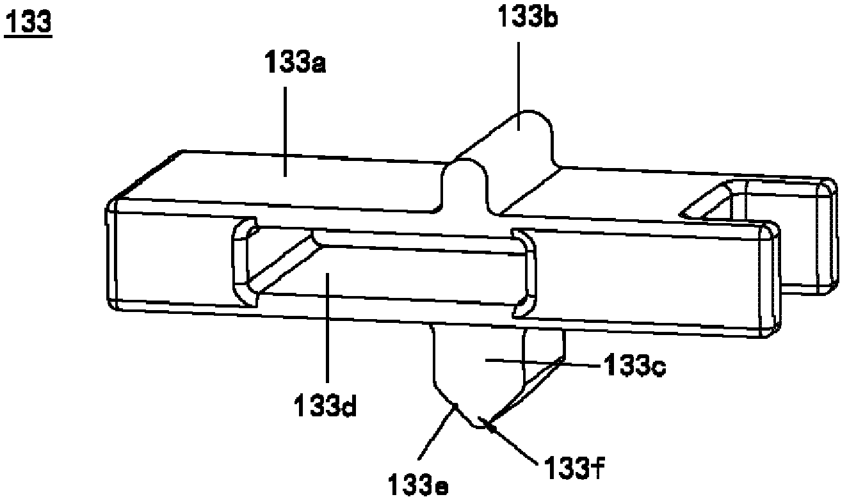
FIG. 45 is a schematic diagram of a structure of a switch in FIG. 43.

As shown in FIG. 45, the switch 133 may include a sliding part 133*a*, a force-applying part 133*b*, and a switch matching part 133*c*. The force-applying part 133*b* and the switch matching part 133*c* may be respectively located on two sides of the sliding part 133*a*.

As shown in FIG. 45, the sliding part 133*a* may be approximately shaped like a hollow square block, a sliding cavity 133*d* is provided in the sliding part 133*a*, and the sliding cavity 133*d* is used to match the pin shaft 136 through sliding. The force-applying part 133*b* may be approximately an arch. The force-applying part 133*b* is used by a user to apply a force, so that the user can turn the switch 133. One end that is of the switch matching part 133*c* and that is away from the sliding part 133*a* may be approximately in a V-shaped sharp angle, to match the clamping bar 137. The V-shaped sharp angle structure of the switch matching part 133*c* may have a switch slope 133*e*.

Figure 46:
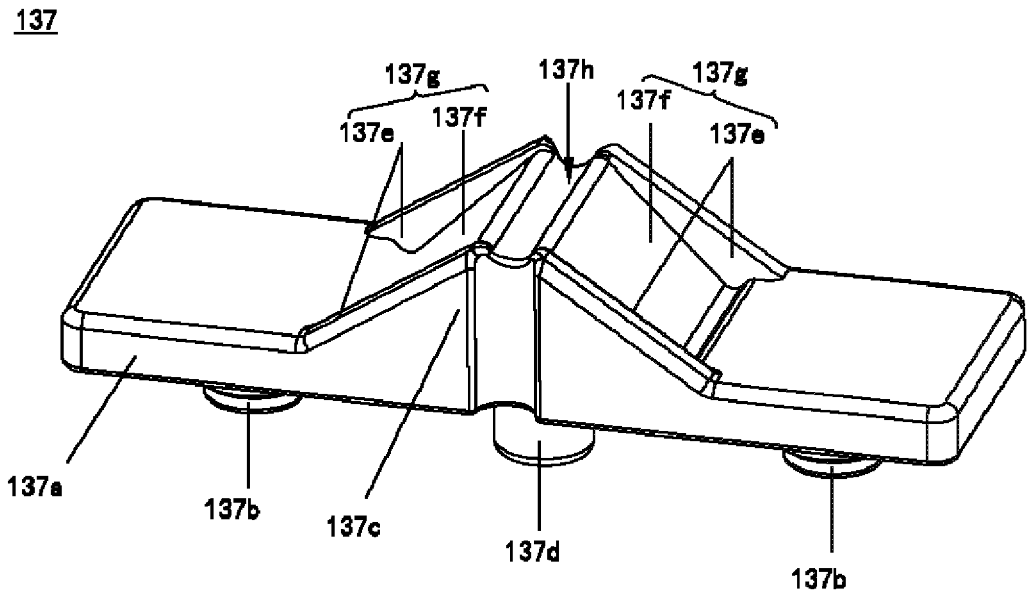
FIG. 46 is a schematic diagram of a structure of a clamping bar in FIG. 43.

As shown in FIG. 46, the clamping bar 137 may include a substrate 137*a*, a clamping bar matching part 137*c*, sealing member mounting parts 137*b*, and an elastic member limiting part 137*d*. The substrate 137*a* may be approximately shaped like a long strip. The clamping bar matching part 137*c* may be convexly disposed on one side (for example, one side in a thickness direction) of the substrate 137*a*, and the sealing member mounting parts 137*b* and the elastic member limiting part 137*d* may be located on the other side (for example, the other side in the thickness direction) of the substrate 137*a*.

As shown in FIG. 46, the clamping bar matching part 137*c* may be approximately a herringbone shape. The clamping bar matching part 137*c* may include two clamping bar slopes 137*f*, and the two clamping bar slopes 137*f* are connected to the substrate 137*a* and may form an obtuse angle with the substrate 137*a*. A side wall 137*e* is connected to opposite sides of each clamping bar slope 137*f*, and two side walls 137*e* and the clamping bar slope 137*f* enclose a matching groove 137*g*. There may be two matching grooves 137*g*. A limiting groove 137*h* may be provided on the top that is of the clamping bar matching part 137*c* and that is away from the substrate 137*a*, and the limiting groove 137*h* is also located between the two clamping bar slopes 137*f* (or between the two matching grooves 137*g*).

As shown in FIG. 46, both the sealing member mounting parts 137*b* and the elastic member limiting part 137*d* may be approximately cylindrical. There may be two sealing member mounting parts 137_b_, and the elastic member limiting part 137_d_ is located between the two sealing member mounting parts 137_b_.

The clamping bar 137 shown in FIG. 46 may be a symmetrical structure. The symmetrical plane may pass through the elastic member limiting part 137_d_. The two matching grooves 137_g_ are symmetrically distributed about the symmetrical plane, and the two sealing member mounting parts 137_b_ are also symmetrically distributed about the symmetrical plane.

The structure of the clamping bar 137 shown in FIG. 46 is merely an example, and Embodiment 3 is not limited thereto. Another variant structure of a clamping bar may be designed on the basis of FIG. 46. For example, the clamping bar may have two clamping bar slopes 137_f_, but no matching grooves 137_g_ are provided (that is, there are no side walls 137_e_); or the clamping bar may have only one clamping bar slope 137_f_, and the clamping bar may have or may not have a matching groove 137_g_.

Figure 47:
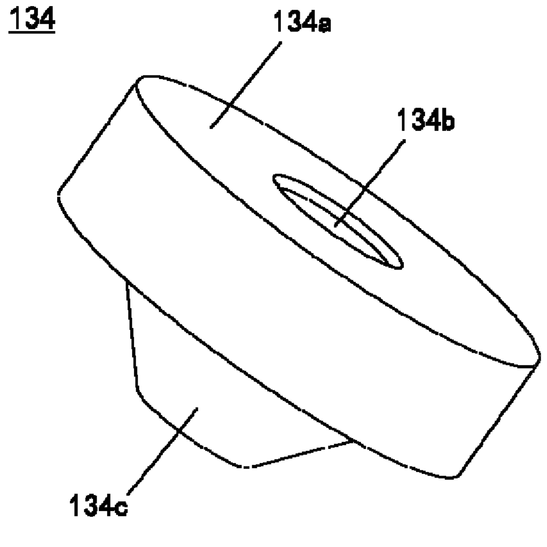
FIG. 47 is a schematic diagram of a structure of a sealing member in FIG. 43.

As shown in FIG. 47, each of the sealing member 134 may include a mounting part 134_a_ and a sealing part 134_c_ that are connected. The mounting part 134_a_ may be cylindrical. A mounting hole 134_b_ may be provided in the mounting part 134_a_, and the mounting hole 134_b_ may be a blind hole. The sealing part 134_c_ may be in a cone shape. One end that is of the sealing part 134_c_ and that is away from the mounting part 134_a_ is a small end with a smaller diameter, and one end connected to the mounting part 134_a_ is a large end with a larger diameter. The sealing members 134 may be made of elastic sealing materials, for example, rubber or silica gel.

As shown in FIG. 43, the elastic member 135 may be, for example, a spring or another component that can be elastically telescopic.

Figure 48:
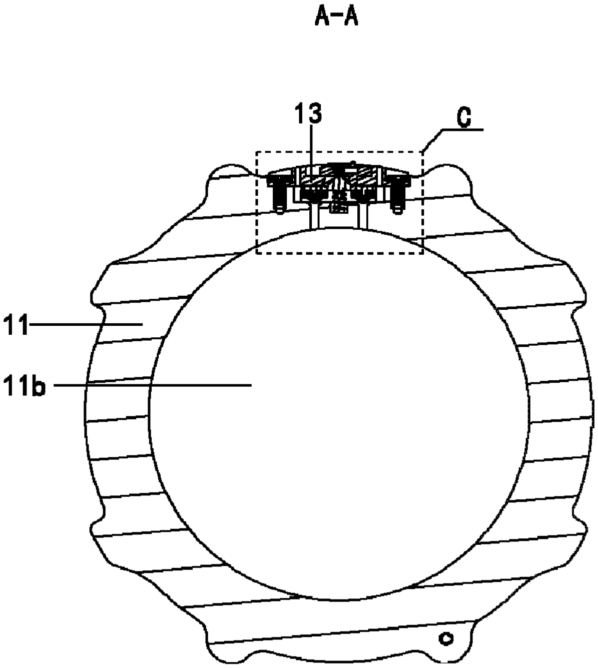
FIG. 48 is a schematic diagram of a sectional structure including the housing and the water-resistant assembly of the electronic device according to Embodiment 3.
Figure 49:
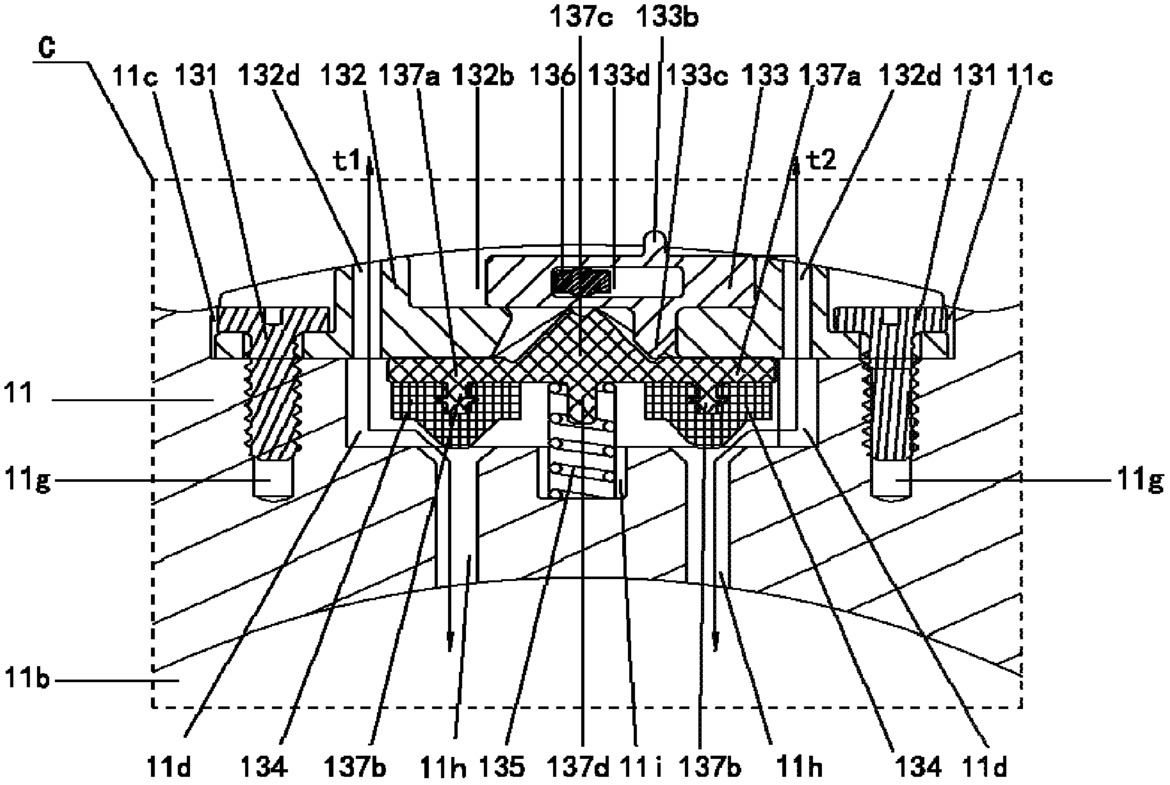
FIG. 49 is a schematic diagram of a partially enlarged structure at a position C in FIG. 48.

FIG. 48 and FIG. 49 may represent an assembly structure of the water-resistant assembly 13 and an assembly state of the water-resistant assembly 13 and the housing 11. FIG. 49 is a schematic diagram of a partially enlarged structure at a position C in FIG. 48.

A first water-resistant and breathable film and a second water-resistant and breathable film (not shown in FIG. 49) may be mounted in the housing space 11_b_ of the housing 11. For example, the first water-resistant and breathable film may cover one end of a housing through hole 11_h_ on the left, and the second water-resistant and breathable film may cover one end of a housing through hole 11_h_ on the right. Both the first water-resistant and breathable film and the second water-resistant and breathable film are breathable and have specific water-resistant performance (can prevent liquid from permeating and prevent liquid from passing through).

A microphone (not shown in FIG. 49) may also be mounted in the housing space 11_b_. The microphone may correspond to, for example, the housing through hole 11_h_ on the right.

A speaker and a controller (not shown in FIG. 49) may be further disposed in the electronic device 10, and specific positions of the speaker and the controller may be designed as required. A sound emitted by the speaker may be transmitted to outside of the electronic device 10. The housing through hole 11_h_ on the left may serve as an air pressure balancing hole of the speaker. The controller may be a central processing unit or a microcontroller unit (MCU). With reference to FIG. 41, FIG. 46, and FIG. 49, the substrate 137_a_, the sealing member mounting parts 137_b_, and the elastic member limiting part 137_d_ of the clamping bar 137 may be located in the second groove 11_d_ of the housing 11. One end of the elastic member 135 may be mounted into the mounting groove 11_i_ of the housing 11, and the other end of the elastic member 135 may be sleeved on a periphery of the elastic member limiting part 137_d_, and abut against the substrate 137_a_. The elastic member 135 is configured to apply an elastic force to the clamping bar 137. The sealing members 134 are fixedly connected to the sealing member mounting parts 137_b_. With reference to FIG. 47 and FIG. 49, the mounting hole 134_b_ in the mounting part 134_a_ of each of the sealing member 134 may match the sealing member mounting parts 137_b_, the sealing part 134_c_ of the sealing member 134 faces the housing through hole 11_h_ of the housing 11, and the sealing part 134_c_ is spaced from the housing through hole 11_h_.

With reference to FIG. 41, FIG. 44, and FIG. 49, the bracket 132 may be mounted into the first groove 11_c_ of the housing 11. The two ends of the bracket 132 are carried on the bottom surface 11_e_ of the first groove 11_c_, and the connection holes 132_a_ in the bracket 132 may be aligned with the connection holes 11_g_ in the bottom surface 11_e_. The connecting members 131 may match the connection holes 132_a_ and the connection holes 11_g_, so that the bracket 132 is fixedly connected to the housing 11. The bracket through holes 132_d_ in the bracket 132 are connected to the second groove 11_d_. Due to elastic support from the substrate 137_a_, the elastic member 135 can abut against the bracket 132. The clamping bar matching part 137_c_ of the clamping bar 137 may be located in the accommodation space 132_b_ of the bracket 132.

With reference to FIG. 41, FIG. 45, and FIG. 49, the pin shaft 136 passes through the sliding cavity 133_d_ of the switch 133 and the mounting hole 132_c_ in the bracket 132, so that the switch 133 is mounted on the bracket 132. The pin shaft 136 is fixedly connected to the mounting hole 132_c_ in the bracket 132. The switch 133 is located in a mounting space 132_b_ of the bracket 132, and the switch matching part 133_c_ of the switch 133 may be located at a junction of the clamping bar matching part 137_c_ and the substrate 137_a_ (or at the root of the clamping bar matching part 137_c_). With reference to FIG. 45 and FIG. 46, the switch slope 133_e_ of the switch 133 is parallel to and in contact with one clamping bar slope 137_f_ of the clamping bar matching part 137_c_.

The force-applying part 133_b_ may be used by the user to apply the force. When the user pushes and pulls the force-applying part 133_b_, the switch 133 may move relative to the bracket 132 and the pin shaft 136 in the mounting space 132_b_, and the pin shaft 136 may achieve guiding and limiting functions for the switch 133. In a state shown in FIG. 49, the switch 133 may be at a right limit position.

The water-resistant assembly 13 shown in FIG. 48 and FIG. 49 is in a turned-on state. In the turned-on state, as shown in FIG. 49, a bracket through hole 132_d_ on the left, the second groove 11_d_, and the housing through hole 11_h_ on the left are sequentially connected to form a first channel t1, and the first channel t1 connects an external environment to the housing space 11_b_. A bracket through hole 132_d_ on the right, the second groove 11_d_, and the housing through hole 11_h_ on the right are sequentially connected to form a second channel t2, and the second channel t2 connects the external environment to the housing space 11_b_.

Therefore, a sound from the outside of the electronic device 10 can enter the electronic device 10 through the second channel t2 and be picked up by the microphone. External air can also enter the electronic device 10 through the first channel t1, to balance air pressure inside and outside the electronic device 10. Because the first water-resistant and breathable film and the second water-resistant and breathable film exist, external liquid cannot enter the electronic device 10, so that the electronic device 10 can be breathable and water-resistant in a daily scenario.

Refer to FIG. 46 and FIG. 49. When the user pushes the force-applying part 133*b* to the left, the switch 133 moves to the left, and in the matching groove 137*g* of the clamping bar matching part 137*c*, the switch matching part 133*c* moves toward the top of the clamping bar matching part 137*c* along the clamping bar slope 137*f*. In addition, the clamping bar 137 moves downward under the pressure of the switch matching part 133*c*, so that the elastic member 135 is compressed and shortened, and the sealing members 134 gradually approach the housing through hole 11*h*.

Figure 50:
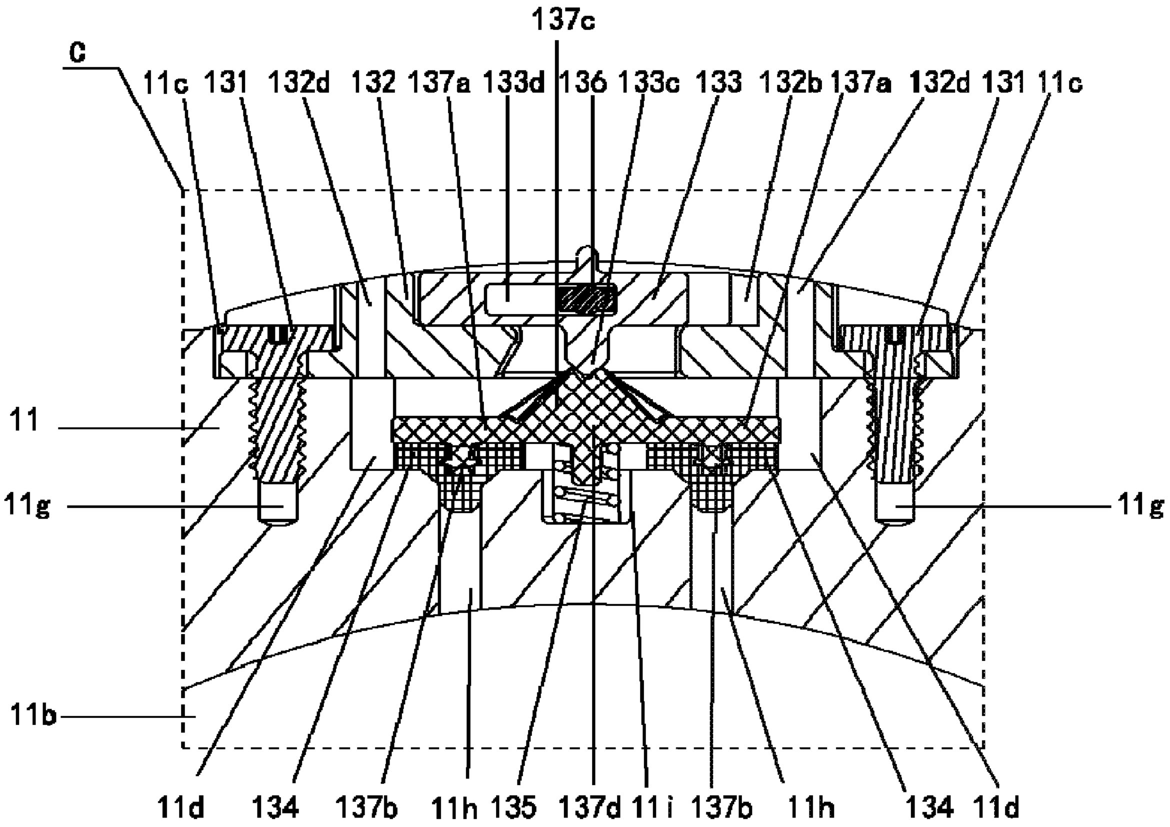
FIG. 50 is a schematic diagram of another sectional structure including the water-resistant assembly and the housing according to Embodiment 3.

A state in FIG. 50 indicates that two sealing members 134 respectively press against openings of the two housing through holes 11*h*, and respectively block the two housing through holes 11*h*. In this case, the water-resistant assembly 13 may be in a turned-off state.

In the turned-off state, as shown in FIG. 50, the switch 133 slides to a left limit position, and the switch matching part 133*c* moves to the top of the clamping bar matching part 137*c*. With reference to FIG. 46 and FIG. 50, the switch matching part 133*c* may be clamped into the limiting groove 137*h* at the top of the clamping bar matching part 137*c*. Therefore, the switch 133 is locked at the left limit position, and the clamping bar 137 is locked at corresponding position, so that the water-resistant assembly 13 remains in the turned-off state. In the turned-off state, both the first channel t1 and the second channel t2 are obstructed, and outside of the housing 11 is disconnected from the housing space 11*b*, so that external liquid cannot enter the electronic device 10. Because the sealing members 134 have stable and reliable sealing performance, even if the external liquid has high pressure, it is difficult or impossible for the external liquid to enter the electronic device 10.

To use the electronic device 10 in a high water pressure scenario, the user may push the switch 133 in advance, so that the water-resistant assembly 13 is in the turned-off state, and then the user may carry the electronic device 10 into the high water pressure scenario. Because the water-resistant assembly 13 has blocked a large amount of high-pressure liquid, the first water-resistant and breathable film and the second water-resistant and breathable film do not need to withstand high pressure, and therefore are not prone to damage. Therefore, the electronic device 10 can operate reliably in the high water pressure scenario.

To sum up, the switch 133 can be pushed to switch the water-resistant assembly 13 between the turned-on state and the turned-off state, so that the electronic device 10 can be breathable and water-resistant in the daily scenario, and the electronic device 10 can operate safely and reliably in the high water pressure scenario.

Same as Embodiment 1, in Embodiment 3, status detection of the water-resistant assembly 13 may be implemented by using a magnetic field sensor and a magnet, and prompt information is sent based on a status detection result of the water-resistant assembly 13. The magnetic field sensor and the magnet may be mounted at appropriate positions. For example, the magnetic field sensor may be mounted in the housing space 11*b*, and the magnet may be mounted on the clamping bar 137. And/or, status detection of the water-resistant assembly 13 may alternatively be implemented by using the microphone and the speaker (or by using a depth gauge), and prompt information is sent based on a status detection result of the water-resistant assembly 13. A specific principle is the same as that described above. Details are not described herein again.

In another embodiment, a status of the water-resistant assembly 13 may alternatively not be detected.

Embodiment 4

Figure 51:
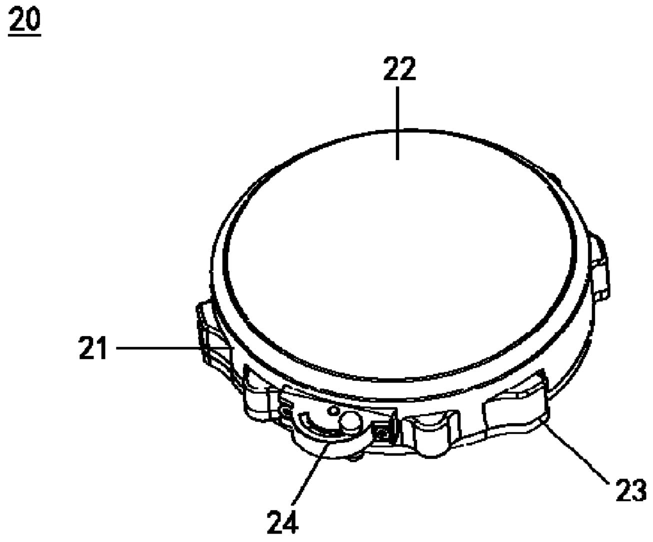
FIG. 51 is a schematic diagram of an assembly structure of an electronic device according to Embodiment 4.
Figure 52:
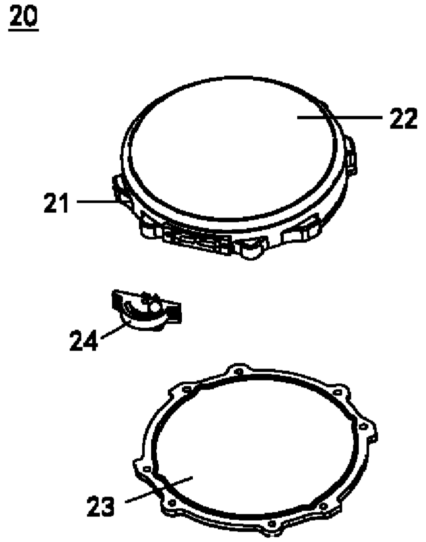
FIG. 52 is a schematic diagram of an exploded structure of the electronic device shown in FIG. 51.

As shown in FIG. 51 and FIG. 52, Embodiment 4 provides an electronic device 20. The electronic device 20 may be, for example, a smartwatch. The electronic device 20 may include a display 22, a housing 21 (may be referred to as, for example, a middle frame), a housing 23 (may be referred to as, for example, a rear housing), and a water-resistant assembly 24. The display 22 and the housing 23 are respectively mounted on two opposite sides of the housing 21. The display 22, the housing 21, and the housing 23 may enclose an inner cavity of the electronic device 20.

Figure 53:
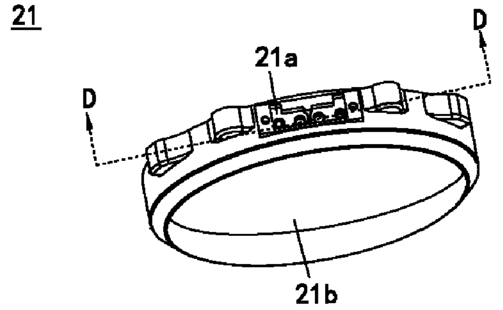
FIG. 53 is a schematic diagram of a structure of a housing of the electronic device according to Embodiment 4.
Figure 54:
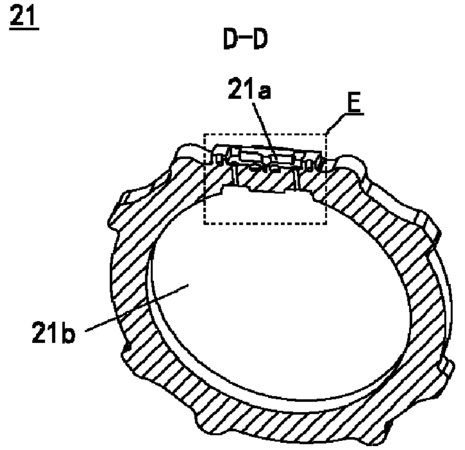
FIG. 54 is a schematic diagram of a D-D sectional structure of the housing in FIG. 53.

As shown in FIG. 53 and FIG. 54, structures of the housing 21 and the housing 11 may be basically consistent, the housing 21 has a housing space 21*b*, the housing space 21*b* is also the inner cavity of the electronic device 20, a groove 21*a* is provided on the housing 21, and an opening of the groove 21*a* is located on an outer circumferential side surface of the housing 21. The housing 21 differs from the housing 11 in a structure of the groove 21*a*. Descriptions are provided below.

Figure 55:
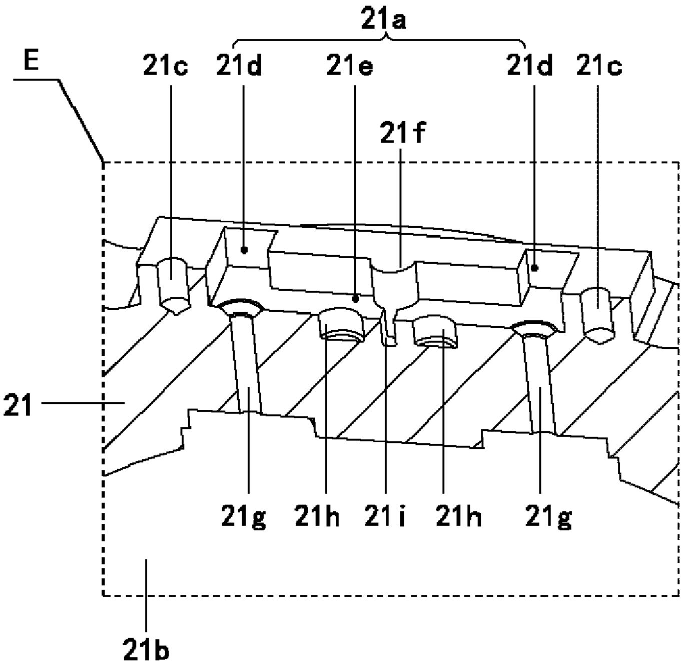
FIG. 55 is a schematic diagram of a partially enlarged structure at a position E in FIG. 54.

As shown in FIG. 54 and FIG. 55, the opening of the groove 21*a* of the housing 21 may be approximately a C shape. The groove 21*a* may include a groove region 21*e*, and two groove regions 21*d* that are respectively located on two opposite sides of the groove region 21*e*. The groove region 21*e* is connected to the two groove regions 21*d*. The two groove regions 21*d* may be respectively used as two ends of the C shape. The groove region 21*e* may be a middle part of the C shape.

As shown in FIG. 55, a housing through hole 21*g* is provided in a bottom surface of each groove region 21*d*. The housing through hole 21*g* may have a specific distance from a side surface of the groove region 21*d*. The housing through hole 21*g* may pass through a bottom wall of the groove region 21*d* and is connected to the housing space 21*b* of the housing 21. In other words, the groove 21*a* is connected to the housing space 21*b* through the housing through hole 21*g*.

As shown in FIG. 55, two mounting grooves 21*h* may be provided on a bottom surface of the groove region 21*e*, and the two mounting grooves 21*h* may be located between two housing through holes 21*g*.

As shown in FIG. 55, a guiding part 21*f* may be further convexly disposed on a side surface of the groove region 21*e*, and the guiding part 21*f* may be, for example, semi-cylindrical. A guiding groove 21*i* may be further provided on the bottom surface of the groove region 21*e*. The guiding groove 21*i* is connected to the guiding part 21*f*. A side surface that is of the guiding groove 21*i* and that is close to the guiding part 21*f* may be a cylindrical surface, and the cylindrical surface may be tangential to a cylindrical surface of the guiding part 21*f*. A side that is of the guiding groove 21*i* and that is away from the guiding part 21*f* may be connected to the housing space 21*b*. Both the guiding part 21*f* and the guiding groove 21*i* may be located between the two mounting grooves 21*h*.

As shown in FIG. 55, connection holes 21*c* may be further provided in the housing 21. For example, there may be two connection holes 21*c*, and the two connection holes 21*c* are respectively located on two sides of the groove 21*a*. The connection holes 21*c* may be blind holes.

Figure 56:
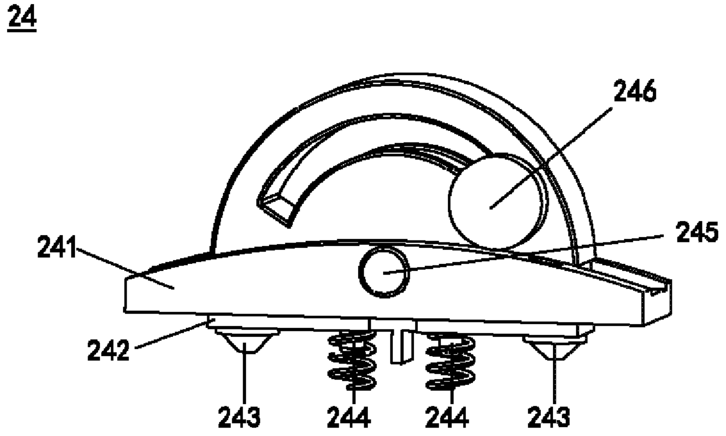
FIG. 56 is a schematic diagram of an assembly structure of a water-resistant assembly of the electronic device according to Embodiment 4.
Figure 57:
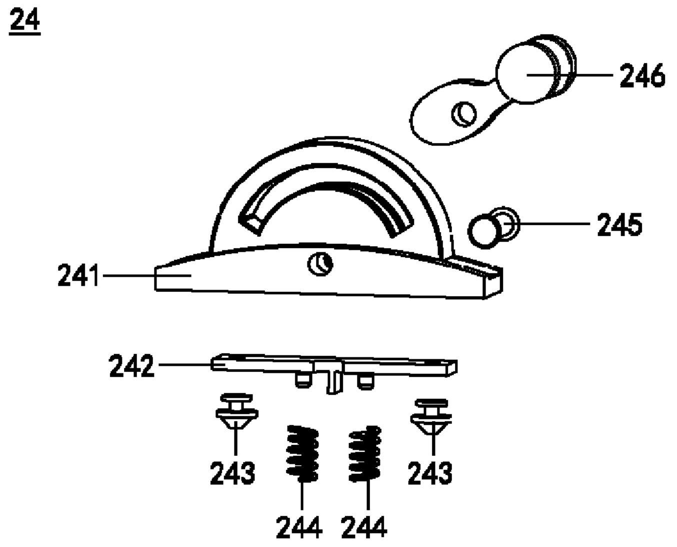
FIG. 57 is a schematic diagram of an exploded structure of the water-resistant assembly in FIG. 56.

As shown in FIG. 56 and FIG. 57, the water-resistant assembly 24 may include a bracket 241, a pin shaft 245, a switch 246, a clamping bar 242, sealing members 243, and elastic members 244.

Figure 58:
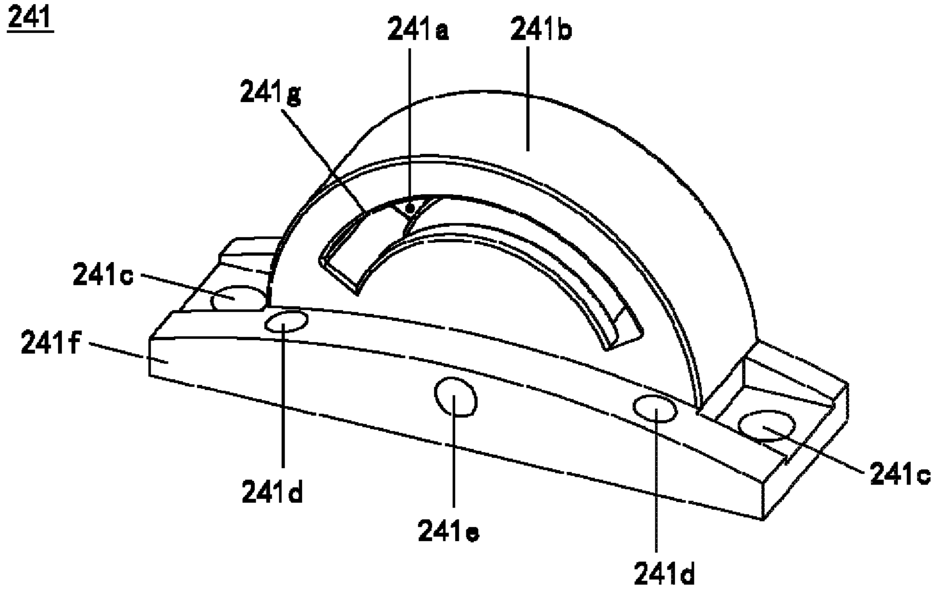
FIG. 58 is a schematic diagram of a structure of a bracket in the water-resistant assembly according to Embodiment 4.
Figure 59:
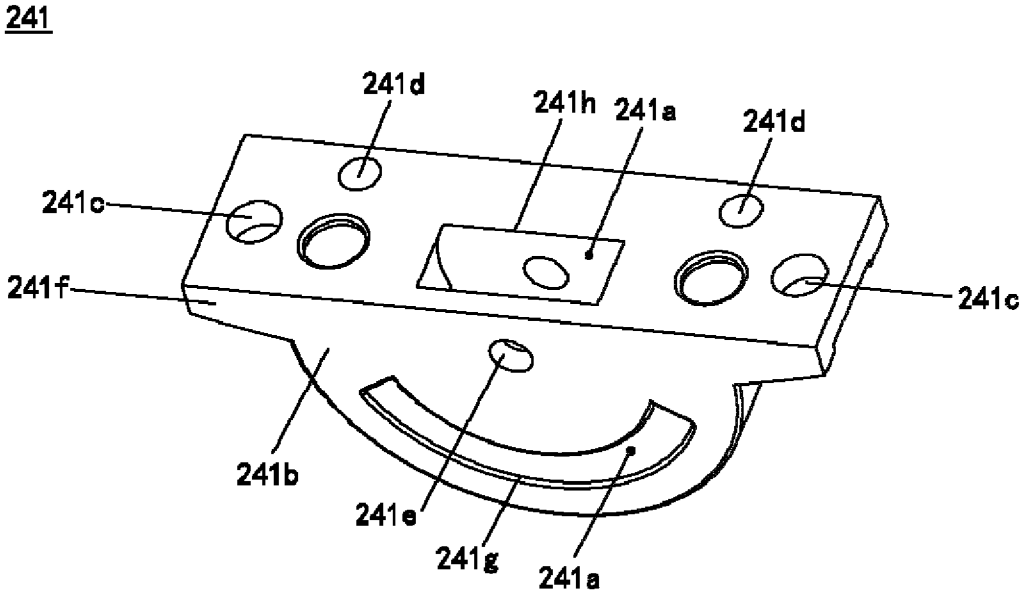
FIG. 59 is a schematic diagram of another structure of the bracket in the water-resistant assembly according to Embodiment 4.

As shown in FIG. 58 and FIG. 59, the bracket 241 may be approximately a hollow frame structure. The bracket 241 has an accommodation space 241*a*. The bracket 241 may include a bracket base 241*f* and a bracket matching part 241*b* that may be connected, for example, connected as a whole. An opening 241*h* may be provided in the bracket base 241*f*, the opening 241*h* may be approximately rectangular, and the opening 241*h* is connected to the accommodation space 241*a*. An opening 241*g* may be provided in the bracket matching part 241*b*, the opening 241*g* may be approximately arcuate, and the opening 241*g* is connected to the accommodation space 241*a*.

As shown in FIG. 58 and FIG. 59, the bracket base 241*f* may be approximately in a plate shape or a block shape. Connection holes 241*c*, bracket through holes 241*d*, and a matching hole 241*e* may be provided in the bracket base 241*f*. For example, there may be two connection holes 241*c*, and the two connection holes 241*c* may be respectively located at two ends of the bracket base 241*f*. The connection holes 241*c* are through holes. There may be two bracket through holes 241*d*, and the two bracket through holes 241*d* may be respectively located at the two ends of the bracket base 241*f*, and are both located between the two connection holes 241*c*. The bracket through holes 241*d* are through holes, and axes of the bracket through holes 241*d* may be basically consistent with those of the connection holes 241*c*. The matching hole 241*e* may be located between the two bracket through holes 241*d* and pass through the bracket base 241*f*. An axis of the matching hole 241*e* may be basically perpendicular to the axes of the bracket through holes 241*d*.

As shown in FIG. 58 and FIG. 59, the bracket matching part 241*b* may be approximately hollow and semi-cylindrical. The bracket matching part 241*b* may be located between the two connection holes 241*c* in the bracket base 241*f*.

As shown in FIG. 57, an overall shape of the pin shaft 245 may be approximately cylindrical or like a round rod. The two ends of the pin shaft 245 may be thicker, and a part between the two ends may be thinner. With reference to FIG. 57 and FIG. 58, the pin shaft 245 may match the matching hole 241*e*, the two ends of the pin shaft 245 may be exposed to the matching hole 241*e*, and the foregoing structure of the pin shaft 245 enables the pin shaft 245 to be reliably matched with the matching hole 241*e*, without being detached from the matching hole 241.

Figure 60:
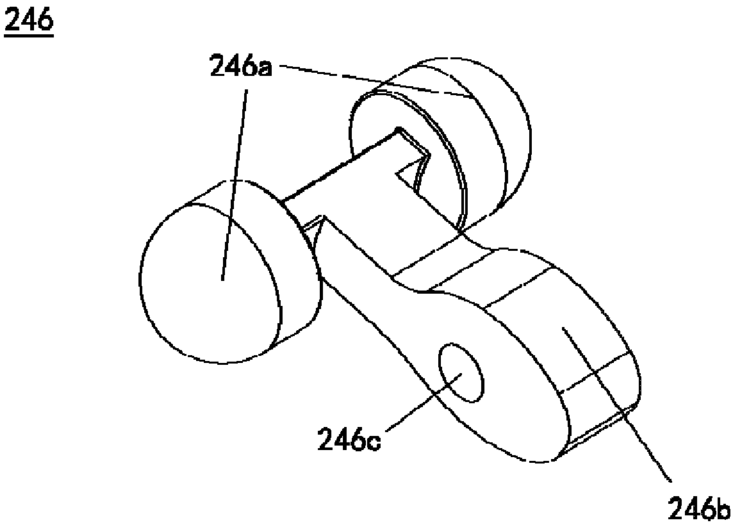
FIG. 60 is a schematic diagram of a structure of a switch in the water-resistant assembly according to Embodiment 4.

As shown in FIG. 60, the switch 246 may include force-applying parts 246*a* and a switch matching part 246*b* that may be connected as a whole.

The force-applying parts 246*a* may be approximately hemispherical structures. For example, there may be two force-applying parts 246*a*, and the two force-applying parts 246*a* may be respectively located on two sides of the switch matching part 246*b*. The force-applying parts 246*a* are used by a user to apply a force, so that the user can turn the switch 246. A pin hole 246*c* may be provided at one end that is of the switch matching part 246*b* and that is away from the force-applying parts 246*a*, and the pin hole 246*c* passes through the switch matching part 246*b*. An axis of the pin hole 246*c* may be approximately parallel to a direction of a connection line between the two force-applying parts 246*a*. A surface of one end that is of the switch matching part 246*b* and that is away from the force-applying parts 246*a* may include an arc surface. Distances between different positions on the arc surface and a center line of the pin hole 246*c* (which may be referred to as cam radii) are different. In other words, a cam structure may be formed at the one end that is of the switch matching part 246*b* and that is away from the force-applying parts 246*a*.

Figure 61:
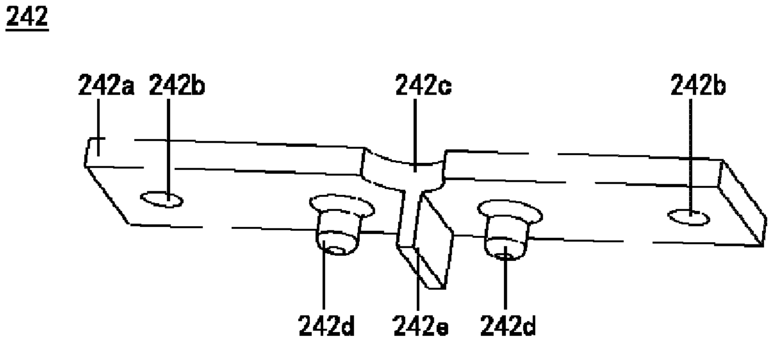
FIG. 61 is a schematic diagram of a structure of a clamping bar in the water-resistant assembly according to Embodiment 4.

As shown in FIG. 61, the clamping bar 242 may include a substrate 242*a*, elastic member limiting parts 242*d*, and a guiding part 242*e*.

As shown in FIG. 61, the substrate 242*a* may be approximately shaped like a flat plate. Mounting holes 242*b* may be provided in the substrate 242*a*. For example, there may be two mounting holes 242*b*, and the two mounting holes 242*b* may be respectively located at two ends of the substrate 242*a*. A guiding groove 242*c* may be further provided on an edge of the substrate 242*a*, and the guiding groove 242*c* may be, for example, a semicircular groove.

As shown in FIG. 61, the elastic member limiting parts 242*d* and the guiding part 242*e* are connected to a same side of the substrate 242*a*, and may be convexly disposed on a surface of the substrate 242*a* (a normal line of the surface is in a thickness direction of the substrate 242*a*). There may be two elastic member limiting parts 242*d*, and the elastic member limiting parts 242*d* may be approximately cylindrical. The guiding part 242*e* may be located between the two elastic member limiting parts 242*d*. The guiding part 242*e* may be approximately shaped like a flat plate. A side surface of the guiding part 242*e* may be smoothly connected to an inner surface of the guiding groove 242*c*.

Figure 62:
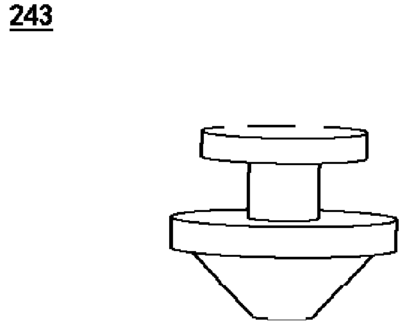
FIG. 62 is a schematic diagram of a structure of a sealing member in the water-resistant assembly according to Embodiment 4.

As shown in FIG. 62, the sealing members 243 may be rotary bodies, and one end (for example, a lower end from a perspective of FIG. 62) of an axis of each of the sealing members may be approximately conical. The sealing members 243 may be made of elastic sealing materials, for example, rubber or silica gel.

As shown in FIG. 57, the elastic members 244 may be, for example, springs or other components that can be elastically telescopic. There may be two elastic members 244.

The following describes an assembly structure of the water-resistant assembly 24 and an assembly structure including the water-resistant assembly 24 and the housing 21.

Figure 63:
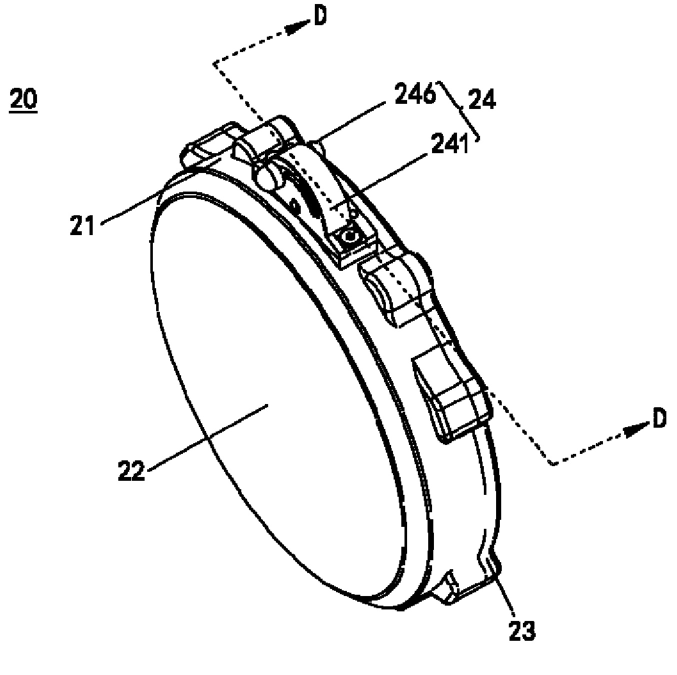
FIG. 63 is a schematic diagram of an assembly structure of the electronic device according to Embodiment 4.
Figure 64:
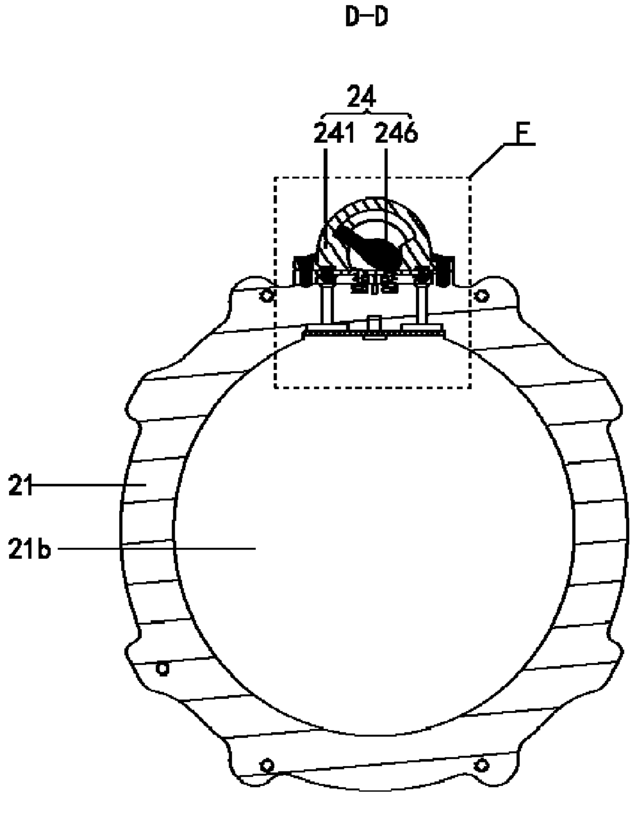
FIG. 64 is a schematic diagram of a D-D sectional structure of the structure shown in FIG. 63.
Figure 65:
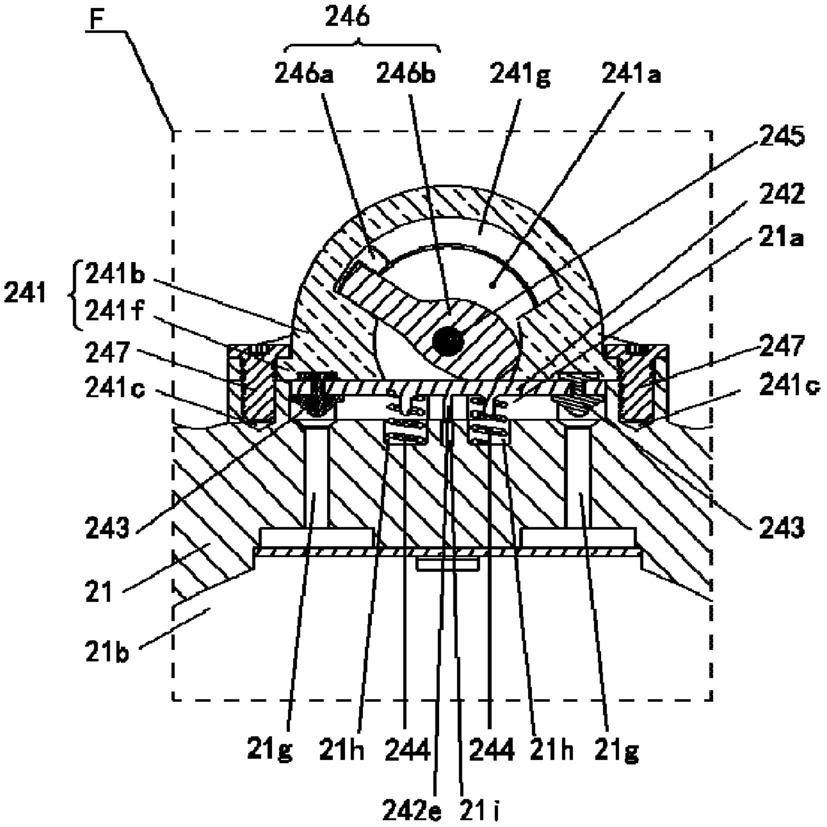
FIG. 65 is a schematic diagram of a partially enlarged structure at a position F in FIG. 64.

FIG. 63 is a schematic diagram of an assembly structure of the electronic device 20 from a perspective. FIG. 64 and FIG. 65 may represent an assembly structure of the water-resistant assembly 24 and an assembly state of the water-resistant assembly 24 and the housing 21. FIG. 64 is a schematic diagram of a D-D sectional structure of the electronic device 20 in FIG. 63, and FIG. 65 is a schematic diagram of a partially enlarged structure at a position F in FIG. 64.

A first water-resistant and breathable film and a second water-resistant and breathable film (not shown in FIG. 65) may be mounted in the housing space 21*b* of the housing 21. For example, the first water-resistant and breathable film may cover one end of a housing through hole 21*g* on the left, and the second water-resistant and breathable film may cover one end of a housing through hole 21*g* on the right. Both the first water-resistant and breathable film and the second water-resistant and breathable film are breathable and have specific water-resistant performance (can prevent liquid from permeating and prevent liquid from passing through). A microphone (not shown in FIG. 65) may also be mounted in the housing space 21*b*. For example, the microphone may correspond to the housing through hole 21*g* on the right.

A speaker and a controller (not shown in FIG. 65) may be further disposed in the electronic device 20, and specific positions of the speaker and the controller may be designed as required. A sound emitted by the speaker may be transmitted to outside of the electronic device 20. The housing through hole 21*g* on the left may serve as an air pressure balancing hole of the speaker. The controller may be a central processing unit or a microcontroller unit (MCU).

With reference to FIG. 55, FIG. 64, and FIG. 65, the water-resistant assembly 24 may be mounted on the housing 21 and cover the opening of the groove 21*a* of the housing 21. With reference to FIG. 55, FIG. 64, and FIG. 65, the bracket base 241*f* of the bracket 241 matches a surface on which the opening of the groove 21*a* is located. For example, the connection holes 241*c* in the bracket base 241*f* may be fixedly connected to the connection holes 21*c* in the housing 21 by using connecting members 247, and the connecting members 247 may be, for example, threaded connecting members (for example, screws or bolts). With reference to FIG. 55. FIG. 58, and FIG. 59, the bracket through holes 241*d* in the bracket base 241*f* correspond to and are connected to the groove regions 21*d* in the groove 21*a*. Further, the bracket matching part 241*b* of the bracket 241 is located outside the bracket 21*a*.

With reference to FIG. 64 and FIG. 65, the switch 246 may be rotatably mounted to the bracket 241 by using the pin shaft 245. The switch matching part 246*b* of the switch 246 may be located in the accommodation space 241*a* of the bracket 241. The force-applying parts 246*a* of the switch 246 may be exposed from the opening 241*g* of the bracket matching part 241*b*. With reference to FIG. 58. FIG. 60, and FIG. 65, the pin shaft 245 may match the pin hole 246*c* of the switch matching part 246*b* and the matching hole 241*e* of the bracket base 241*f*, so that the switch 246 can rotate around the pin shaft 245 in the accommodation space 241*a*. In a state shown in FIG. 65, the force-applying parts 246*a* may be at left limit positions, and the force-applying parts 246*a* may abut against the bracket 241.

As shown in FIG. 65, the clamping bar 242, the sealing members 243, and the elastic members 244 are encapsulated by the bracket 241 in the groove 21*a* of the housing 21. With reference to FIG. 61 and FIG. 65, the sealing members 243 may pass through the mounting holes 242*b* in the clamping bar 242, and be fixedly connected to the clamping bar 242. The sealing members 243 correspond to the housing through holes 21*g* in the housing 21, tips of the sealing members 243 may face the housing through holes 21*g*, and the sealing members 243 are spaced apart from openings of the housing through holes 21*g*. The elastic members 244 are located in the mounting grooves 21*h* of the housing 21. One end of each of the elastic members 244 abuts against the substrate 242*a* of the clamping bar 242, and is sleeved on the periphery of the elastic member limiting part 242*d*. The other end of the elastic member 244 abuts against a bottom surface of the mounting groove 21*h*. Due to elastic support from the elastic members 244, the clamping bar 242 can be in contact with and press against a part that is of the switch matching part 246*b* and that has a smaller cam radius, and the part of the switch matching part 246*b* and the force-applying parts 246*a* can be respectively located on two sides of the pin shaft 245, so that the switch 246 is kept in a balanced state under two opposite torques. The guiding part 242*e* of the clamping bar 242 can be aligned with the guiding groove 21*i* of the housing 21, and one end of the guiding part 242*e* is spaced apart from a bottom surface of the guiding groove 21*i*.

The water-resistant assembly 24 shown in FIG. 65 is in a turned-on state. In the turned-on state, with reference to FIG. 55. FIG. 58, and FIG. 65, one bracket through hole 241*d*, the groove 21*a*, and one housing through hole 21*g* are sequentially connected to form a first channel, and the first channel connects an external environment to the housing space 21*b*. The other bracket through hole 241*d*, the groove 21*a*, and the other housing through hole 21*g* are sequentially connected to form a second channel, and the second channel connects the external environment to the housing space 21*b*.

Therefore, a sound from the outside of the electronic device 20 can enter the electronic device 20 through the second channel and be picked up by the microphone. External air can also enter the electronic device 20 through the first channel, to balance air pressure inside and outside the electronic device 20. Because the first water-resistant and breathable film and the second water-resistant and breathable film exist, external liquid cannot enter the electronic device 20, so that the electronic device 20 can be breathable and water-resistant in a daily scenario.

Figure 66:
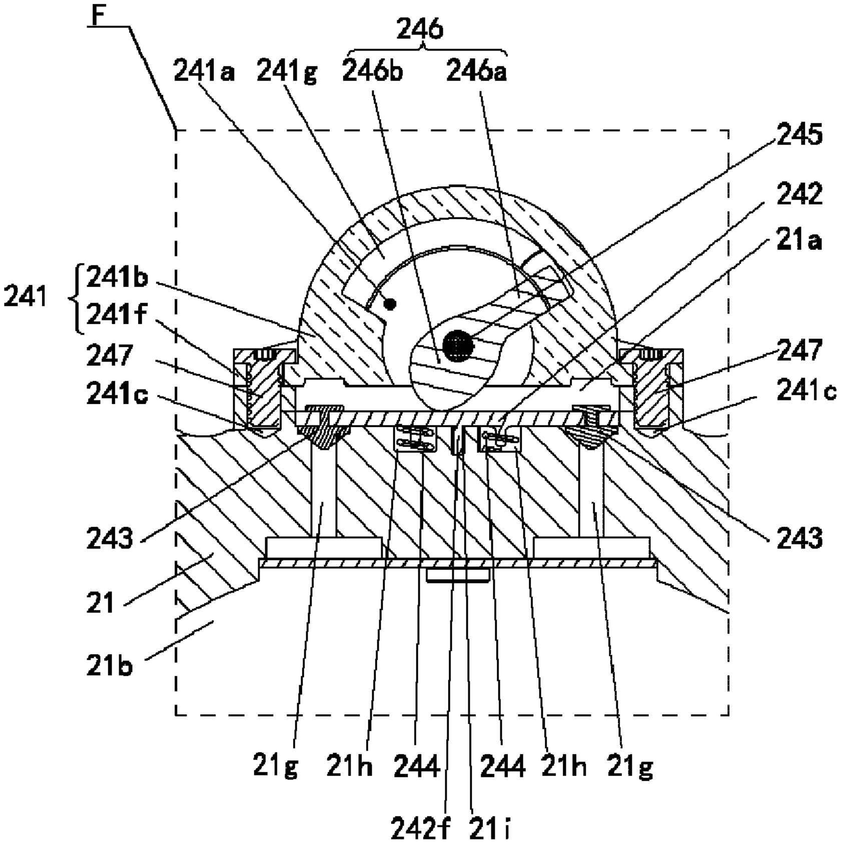
FIG. 66 is a schematic diagram of another sectional structure including the water-resistant assembly and the housing according to Embodiment 3.

Refer to FIG. 65. When the user rotates the switch 246 clockwise, the switch 246 rotates in the accommodation space 241*a*. The switch matching part 246*b* presses against the clamping bar 242, so that the clamping bar 242 drives the sealing members 243 to move toward the housing through holes 21*g*. In this process, the guiding part 242*e* moves toward the bottom surface of the guiding groove 21*i*, and the elastic members 244 are gradually compressed and shortened. As shown in FIG. 66, when a part that is of the switch matching part 246*b* and that has a larger cam radius is in contact with the clamping bar 242, the two sealing members 243 respectively press against the openings of the two housing through holes 21*g*, and block the two housing through holes 21*g*. At this time, the force-applying parts 246*a* may be at the left limit positions, and the force-applying parts 246*a* may abut against the bracket 241. A part that is of the switch matching part 246*b* and that is in contact with the clamping bar 242 and the force-applying parts 246*a* may be respectively located on the two sides of the pin shaft 245, so that the switch 246 is kept in a balanced state under two opposite torques.

The water-resistant assembly 24 shown in FIG. 66 is in a turned-off state. In the turned-off state, both the first channel and the second channel are obstructed, and outside of the housing 21 is disconnected from the housing space 21*b*, so that external liquid cannot enter the electronic device 20. Because the sealing members 243 have stable and reliable sealing performance, even if the external liquid has high pressure, it is difficult or impossible for the external liquid to enter the electronic device 20.

To use the electronic device 20 in a high water pressure scenario, the user may push the switch 246 in advance, so that the water-resistant assembly 24 is in the turned-off state, and then the user may carry the electronic device 20 into the high water pressure scenario. Because the water-resistant assembly 24 has blocked a large amount of high-pressure liquid, the first water-resistant and breathable film and the second water-resistant and breathable film do not need to withstand high pressure, and therefore are not prone to damage. Therefore, the electronic device 20 can operate reliably in the high water pressure scenario.

To sum up, the switch 246 can be turned to switch the water-resistant assembly 24 between the turned-on state and the turned-off state, so that the electronic device 20 can be breathable and water-resistant in the daily scenario, and the electronic device 20 can operate safely and reliably in the high water pressure scenario.

Same as Embodiment 1, in Embodiment 4, status detection of the water-resistant assembly 24 may be implemented by using a magnetic field sensor and a magnet, and prompt information is sent based on a status detection result of the water-resistant assembly 24. The magnetic field sensor and the magnet may be mounted at appropriate positions. For example, the magnetic field sensor may be mounted in the housing space 21*b*, and the magnet may be mounted on the clamping bar 242. And/or, status detection of the water-resistant assembly 24 may alternatively be implemented by using the microphone and the speaker (or by using a depth gauge), and prompt information is sent based on a status detection result of the water-resistant assembly 24. A specific principle is the same as that described above. Details are not described herein again.

In another embodiment, a status of the water-resistant assembly 24 may alternatively not be detected.

Embodiment 5

Figure 67:
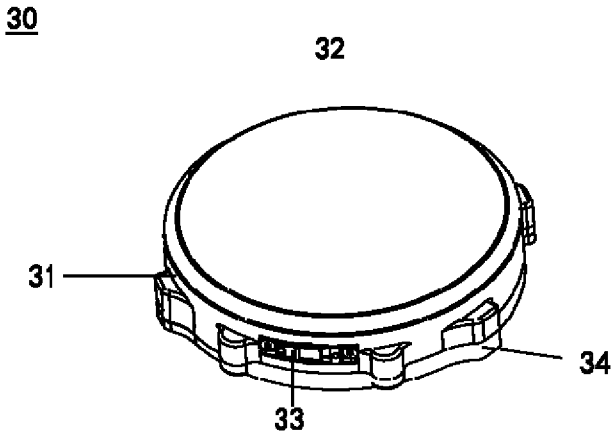
FIG. 67 is a schematic diagram of an assembly structure of an electronic device according to Embodiment 5.
Figure 68:
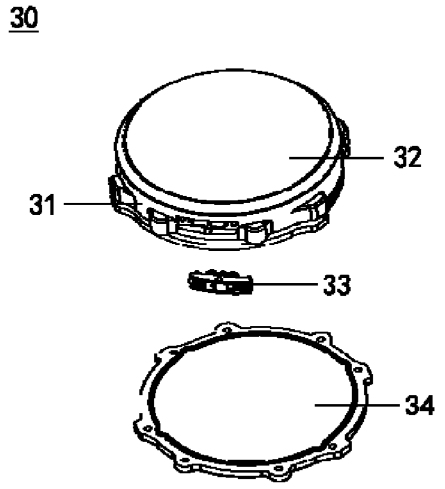
FIG. 68 is a schematic diagram of an exploded structure of the electronic device in FIG. 67.

As shown in FIG. 67 and FIG. 68, Embodiment 5 provides an electronic device 30. The electronic device 30 may be, for example, a smartwatch. The electronic device 30 may include a display 32, a housing 31 (may be referred to as, for example, a middle frame), a housing 34 (may be referred to as, for example, a rear housing), and a water-resistant assembly 33. The display 32 and the housing 34 are respectively mounted on two opposite sides of the housing 31. The display 32, the housing 31, and the housing 34 may enclose an inner cavity of the electronic device 30. The water-resistant assembly 33 may be mounted on the housing 31.

Figure 69:
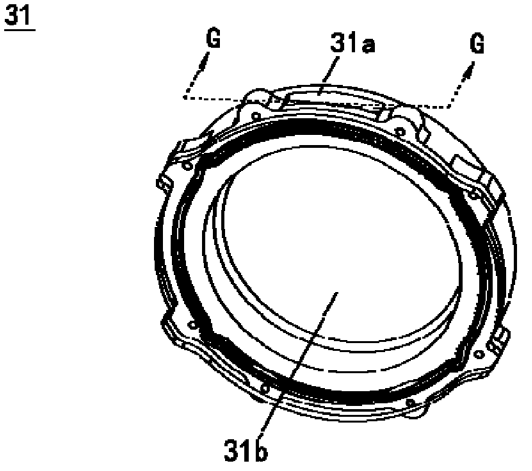
FIG. 69 is a schematic diagram of a structure of a housing of the electronic device according to Embodiment 5.

As shown in FIG. 68 and FIG. 69, structures of the housing 31 and the housing 11 are basically consistent. For example, the housing 31 may be approximately in a ring shape. The housing 31 has a housing space 31*b*, and the housing space 31*b* is a part of the inner cavity of the electronic device 30. A groove 31*a* is provided on the housing 31, and an opening of the groove 31*a* is located on an outer circumferential side surface of the housing 31.

Figure 70:
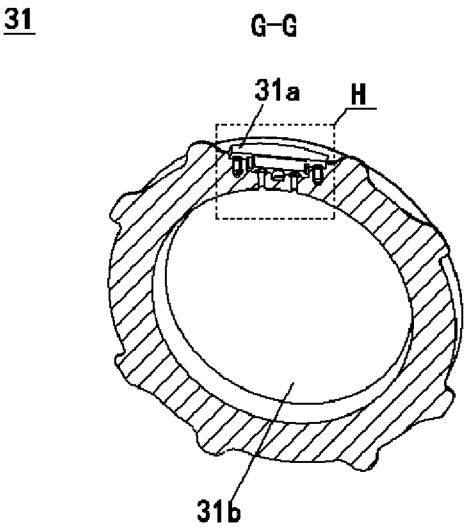
FIG. 70 is a schematic diagram of a G-G sectional structure of the housing shown in FIG. 69.
Figure 71:
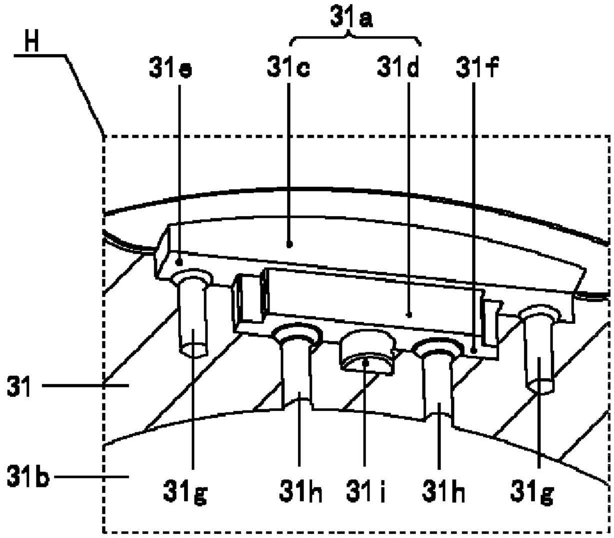
FIG. 71 is a schematic diagram of a partially enlarged structure at a position H in FIG. 70.

As shown in FIG. 69, FIG. 70, and FIG. 71, the groove 31*a* may be a stepped groove, the groove 31*a* may include a first groove 31*c* and a second groove 31*d*, and an opening of the first groove 31*c* may be greater than an opening of the second groove 31*d*.

As shown in FIG. 71, connection holes 31*g* may be provided in a bottom surface 31*e* of the first groove 31*c*, and the connection holes 31*g* may be blind holes. For example, there may be two connection holes 31*g*, and the two connection holes 31*g* are respectively located on two sides of the bottom surface 31.

As shown in FIG. 71, two housing through holes 31*h* may be provided in a bottom surface 31*f* of the second groove 31*d*. The two housing through holes 31*h* may be spaced apart from a side surface of the second groove 31*d*. The two housing through holes 31*h* may pass through a bottom wall of the second groove 31*d* and are connected to the housing space 31*b* of the housing 31. In other words, the groove 31*a* is connected to the housing space 11*b* through the two housing through holes 31*h*. A mounting groove 31*i* may be further provided on the bottom surface 31*f* of the second groove 31*d*, and the mounting groove 31*i* may be located between the two housing through holes 31*h*.

Figure 72:
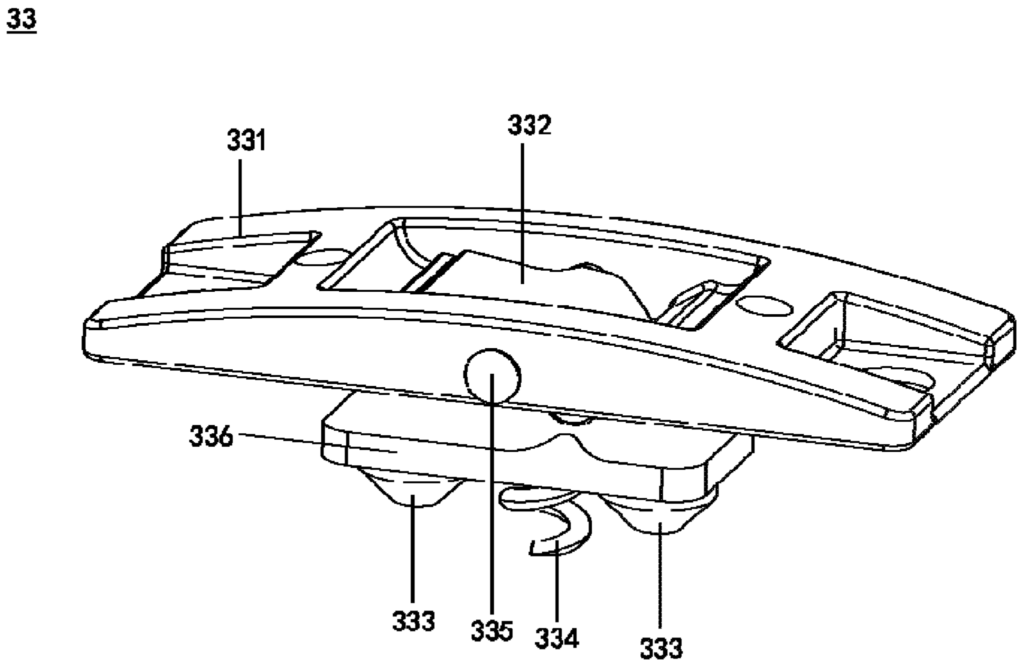
FIG. 72 is a schematic diagram of a structure of a water-resistant assembly of the electronic device according to Embodiment 5.
Figure 73:
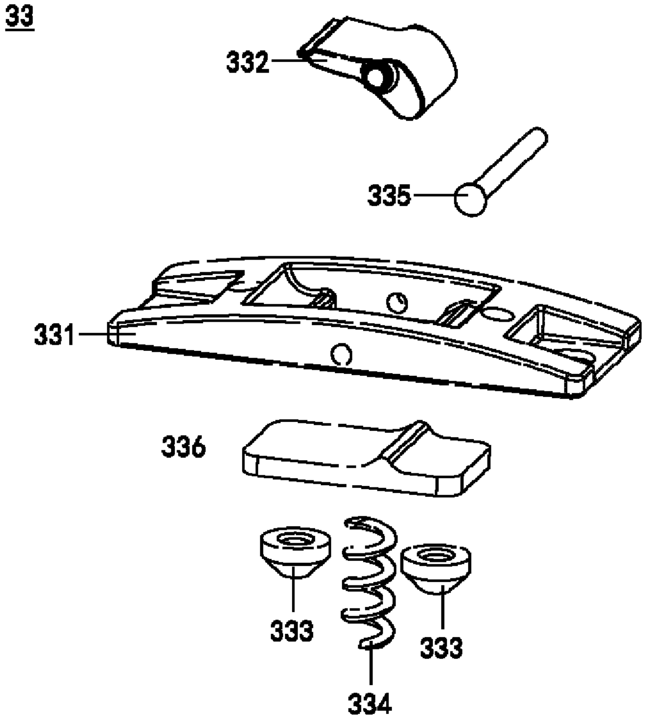
FIG. 73 is a schematic diagram of an exploded structure of the water-resistant assembly in FIG. 72.

As shown in FIG. 72 and FIG. 73, the water-resistant assembly 33 may include a bracket 331, a pin shaft 335, a switch 332, a clamping bar 336, sealing members 333, and an elastic member 334.

Figure 74:
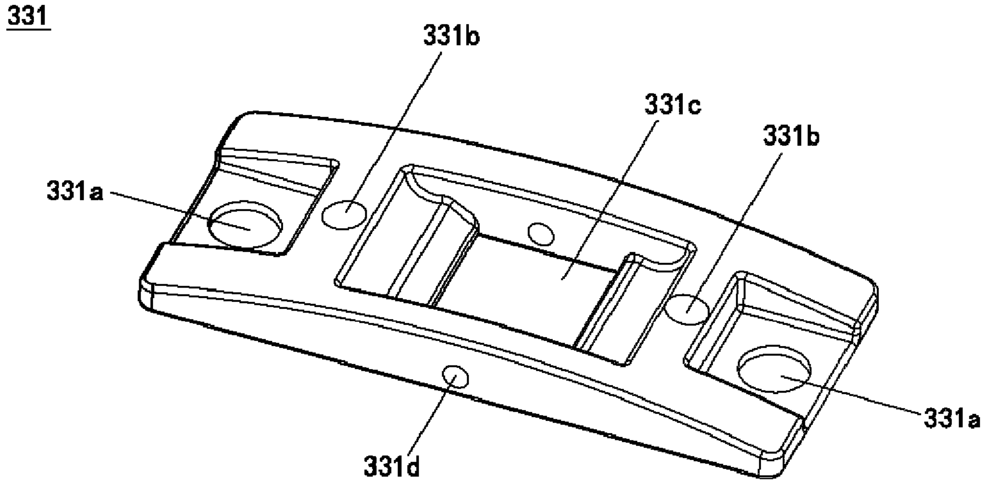
FIG. 74 is a schematic diagram of a structure of a bracket in FIG. 73.

As shown in FIG. 73 and FIG. 74, the bracket 331 may be approximately a hollow frame structure. Connection holes 331*a* may be provided in the bracket 331, and the connection holes 331*a* are through holes. For example, there may be two connection holes 331*a*, and the two connection holes 331*a* are respectively located at two ends of the bracket 331. The connection holes 331*a* are used to mount connecting members. Bracket through holes 331*b* may be further provided in the bracket 331, and the bracket through holes 331*b* are through holes. There may be two bracket through holes 331*b*, and the two bracket through holes 331*b* may be located between the two connection holes 331*a*. A region between the two bracket through holes 331*b* in the bracket 331 may be hollowed out to form an accommodation space 331*c*. A matching hole 331*d* may be provided in a wall of the accommodation space 331*c*. The matching hole 331*d* is also located between the two bracket through holes 331*b*. The matching hole 331*d* may be a round hole.

As shown in FIG. 73, the pin shaft 335 may be approximately cylindrical or shaped like a round rod. With reference to FIG. 73 and FIG. 74, the pin shaft 335 may match the matching hole 331*d* in the bracket 331.

Figure 75:
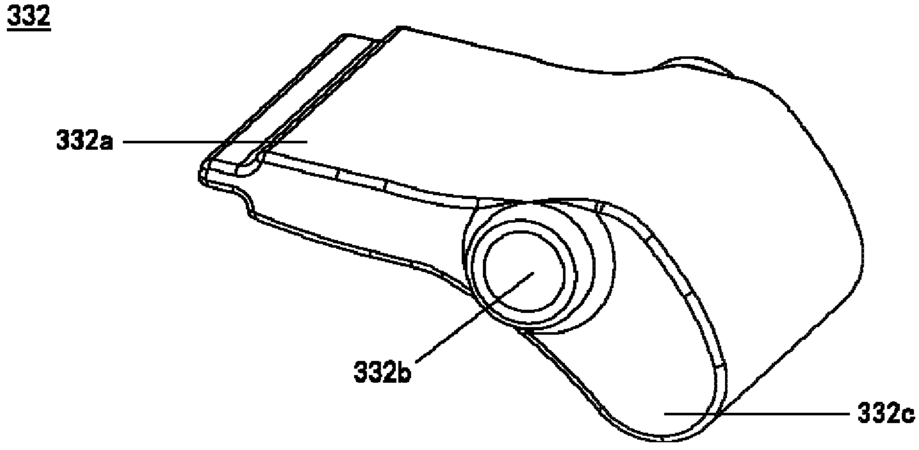
FIG. 75 is a schematic diagram of a structure of a switch in FIG. 73.

As shown in FIG. 75, the switch 332 may be approximately a curved plate structure. The switch 332 has a pin hole 332*b*, and the pin hole 332*b* is a through hole and may be roughly located in the middle of the switch 332. The pin hole 332*b* is used to match the pin shaft 335. The switch 332 may include a force-applying part 332*a* and a switch matching part 332*c* that may be connected as a whole. The force-applying part 332*a* is used by a user to apply a force, so that the user can turn the switch 332. The switch matching part 332*c* is used to match the clamping bar 336. A surface that is of the switch matching part 332*c* and that is away from the force-applying part 332*a* may include an arc surface. Distances between different positions on the arc surface and a center line of the pin hole 332*b* (which may be referred to as cam radii) are different. Therefore, it may be considered that the switch matching part 332*c* forms a cam.

Figure 76:
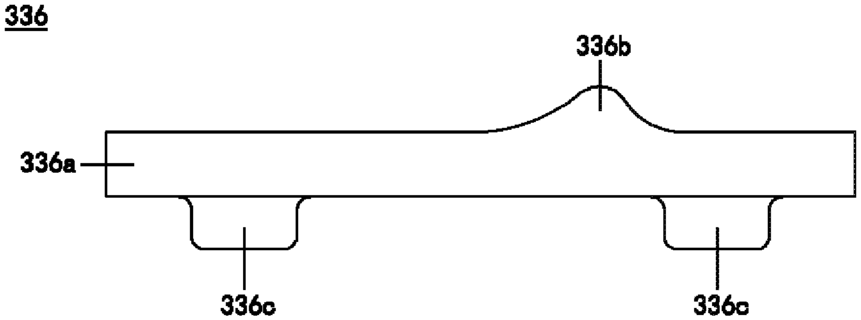
FIG. 76 is a schematic diagram of a structure of a clamping bar in FIG. 73.

As shown in FIG. 76, the clamping bar 336 may include a substrate 336*a*, sealing member mounting parts 336*c*, and a clamping bar matching part 336*b*. The substrate 336*a* may be approximately shaped like a flat plate. The sealing member mounting parts 336*c* and the clamping bar matching part 336*b* may be respectively located on two sides in a thickness direction of the substrate 336*a*. There may be two sealing member mounting parts 336*c*, and the sealing member mounting parts 336*c* may be approximately cylindrical. The sealing member mounting parts 336*c* are used to mount the sealing members 333. The clamping bar matching part 336*b* may be a convex hull or a protrusion having an arcuate surface. The clamping bar matching part 336*b* may match the cam on the switch matching part 332*c*.

As shown in FIG. 73, the sealing members 333 may be hollow rotary bodies, and one end (for example, a lower end from a perspective of FIG. 73) of an axis of each of the sealing members may be approximately conical. The sealing members 333 may be made of elastic sealing materials, for example, rubber or silica gel. The sealing members 333 may be sleeved on the sealing member mounting parts 336*c* described above.

As shown in FIG. 73, the elastic member 334 may be, for example, a spring or another component that can be elastically telescopic. The elastic member 334 is configured to provide resilience for the clamping bar 336.

The following describes an assembly structure of the water-resistant assembly 33 and an assembly structure including the water-resistant assembly 33 and the housing 31.

Figure 77:
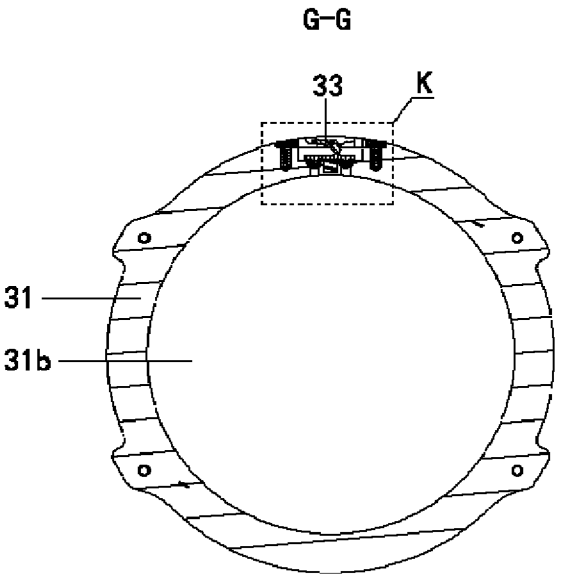
FIG. 77 is a schematic diagram of a sectional structure including the water-resistant assembly and the housing according to Embodiment 5.
Figure 78:
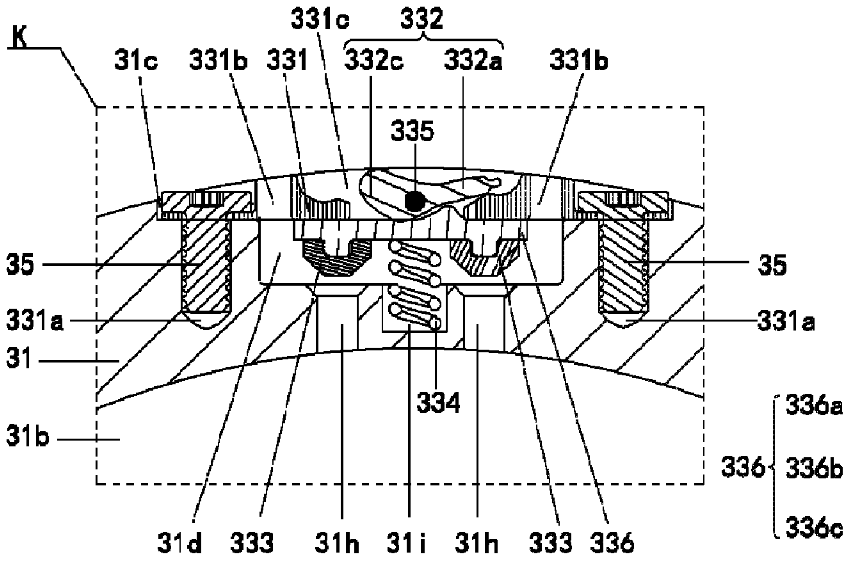
FIG. 78 is a schematic diagram of a partially enlarged structure at a position K in FIG. 77.

FIG. 77 and FIG. 78 may represent an assembly structure including the water-resistant assembly 33 and the housing 31, and an assembly structure of the water-resistant assembly 33. In FIG. 77 and FIG. 71, a same G-G cross section is used. FIG. 78 is a schematic diagram of a partially enlarged structure at a position K in FIG. 77.

A first water-resistant and breathable film and a second water-resistant and breathable film (not shown in FIG. 78) may be mounted in the housing space 31*b* of the housing 31. For example, the first water-resistant and breathable film may cover one end of a housing through hole 31*h* on the left, and the second water-resistant and breathable film may cover one end of a housing through hole 31*h* on the right. Both the first water-resistant and breathable film and the second water-resistant and breathable film are breathable and have specific water-resistant performance (can prevent liquid from permeating and prevent liquid from passing through). A microphone (not shown in FIG. 78) may also be mounted in the housing space 31*b*. The microphone may correspond to, for example, the housing through hole 31*h* on the right.

A speaker and a controller (not shown in FIG. 78) may be further disposed in the electronic device 30, and specific positions of the speaker and the controller may be designed as required. A sound emitted by the speaker may be transmitted to outside of the electronic device 30. The housing through hole 31*h* on the left may serve as an air pressure balancing hole of the speaker. The controller may be a central processing unit or a microcontroller unit (MCU).

With reference to FIG. 71. FIG. 72, and FIG. 78, the water-resistant assembly 33 may be mounted in the groove 31*a* of the housing 31.

With reference to FIG. 71. FIG. 74, and FIG. 78, the bracket 331 may be mounted in the first groove 31*c* of the groove 31*a*. For example, connecting members 35 (for example, screws or bolts) may be used to pass through the connection holes 331*a* in the bracket 331 and the connection holes 31*g* in the bottom wall of the first groove 31*c*, and fasten the bracket 331 in the first groove 31*c*. The bracket through holes 331*b* in the bracket 331 are connected to the second groove 31*d* of the groove 31*a*.

With reference to FIG. 77 and FIG. 78, the switch 332 may be mounted in the accommodation space 331*c* of the bracket 331 by using the pin shaft 335. With reference to FIG. 73 to FIG. 75 and FIG. 78, the pin shaft 335 may match the matching hole 331*d* in the bracket 331 and the pin hole 332*b* in the switch 332, so that the switch 332 can rotate around the pin shaft 335 in the accommodation space 331*c*. In a state shown in FIG. 78, the force-applying part 332*a* may be at a right limit position, and the force-applying part 332*a* may abut against the bracket 331.

With reference to FIG. 76, FIG. 77, and FIG. 78, the clamping bar 336, the sealing members 333, and the elastic member 334 of the water-resistant assembly 33 are encapsulated by the bracket 331 in the second groove 31*d* of the housing 31. With reference to FIG. 76 and FIG. 78, the sealing members 333 may be sleeved on the sealing member mounting parts 336*c* of the clamping bar 336 and fixedly connected to the clamping bar 336. The sealing members 333 correspond to the housing through holes 31*h* in the housing 31. Conical tips of the sealing members 333 may face the housing through holes 31*h*, and the sealing members 333 are spaced apart from openings of the housing through holes 31*h*. A part of the elastic member 334 is located in the mounting groove 31*i* of the housing 31, and the other part extends out of the mounting groove 31*i* and is located in the second groove 31*d*. Two ends of the elastic member 334 respectively abut against a bottom surface of the mounting groove 31*i* and the substrate 336*a* of the clamping bar 336. Due to elastic support from the elastic member 334, the substrate 336*a* of the clamping bar 336 can be in contact with and press against a part that is of the switch matching part 332*c* and that has a smaller cam radius, and the part of the switch matching part 332*c* and the force-applying parts 332*a* can be respectively located on two sides of the pin shaft 335, so that the switch 332 is kept in a balanced state under two opposite torques.

The water-resistant assembly 33 shown in FIG. 78 is in a turned-on state. In the turned-on state, as shown in FIG. 78, a bracket through hole 331*b* on the left, the second groove 31*d*, and the housing through hole 31*h* on the left are sequentially connected to form a first channel, and the first channel connects an external environment to the housing space 31*b*. A bracket through hole 331*b* on the right, the second groove 31*d*, and the housing through hole 31*h* on the right are sequentially connected to form a second channel, and the second channel connects the external environment to the housing space 31*b*.

Therefore, a sound from the outside of the electronic device 30 can enter the electronic device 30 through the second channel and be picked up by the microphone. External air can also enter the electronic device 30 through the first channel, to balance air pressure inside and outside the electronic device 30. Because the first water-resistant and breathable film and the second water-resistant and breathable film exist, external liquid cannot enter the electronic device 30, so that the electronic device 30 can be breathable and water-resistant in a daily scenario.

Figure 79:
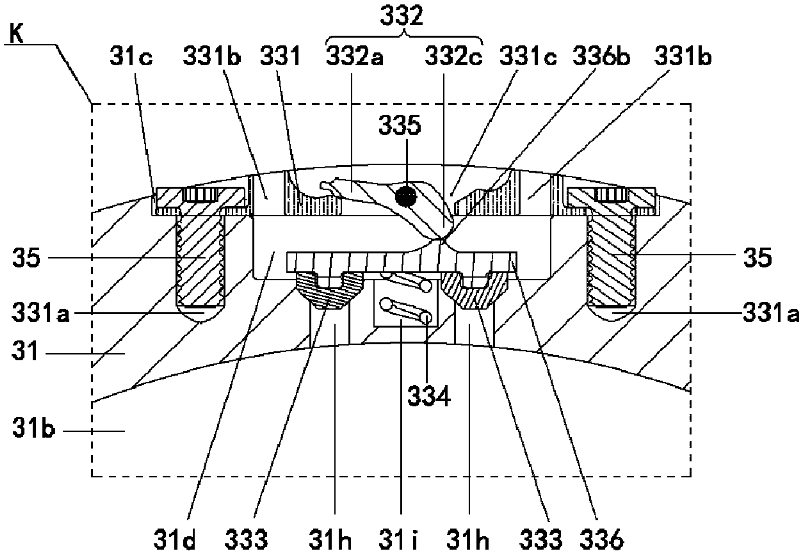
FIG. 79 is a schematic diagram of another sectional structure including the water-resistant assembly and the housing according to Embodiment 5.

Refer to FIG. 78. When the user rotates the switch 332 counterclockwise, the switch 332 rotates in the accommodation space 331*c*. The switch matching part 332*c* presses against the clamping bar 336, so that the clamping bar 336 drives the sealing members 333 to move toward the housing through holes 31*h*. In this process, the elastic member 334 is gradually compressed and shortened. As shown in FIG. 79, when a part that is of the switch matching part 332*c* and that has a larger cam radius is in contact with the clamping bar matching part 336*b*, the two sealing members 333 respectively press against the openings of the two housing through holes 31*h*, and block the two housing through holes 31*h*. At this time, the force-applying part 332*a* may be at the left limit position, and the force-applying part 332*a* may abut against the bracket 241. A part that is of the switch matching part 332*c* and that is in contact with the clamping bar 336 and the force-applying part 332*a* may be respectively located on the two sides of the pin shaft 335, so that the switch 332 is kept in a balanced state under two opposite torques.

The water-resistant assembly 33 shown in FIG. 79 is in a turned-off state. In the turned-off state, both the first channel and the second channel are obstructed, and outside of the housing 31 is disconnected from the housing space 31*b*, so that external liquid cannot enter the electronic device 30. Because the sealing members 333 have stable and reliable sealing performance, even if the external liquid has high pressure, it is difficult or impossible for the external liquid to enter the electronic device 30.

To use the electronic device 30 in a high water pressure scenario, the user may push the switch 332 in advance, so that the water-resistant assembly 33 is in the turned-off state, and then the user may carry the electronic device 30 into the high water pressure scenario. Because the water-resistant assembly 33 has blocked a large amount of high-pressure liquid, the first water-resistant and breathable film and the second water-resistant and breathable film do not need to withstand high pressure, and therefore are not prone to damage. Therefore, the electronic device 30 can operate reliably in the high water pressure scenario.

To sum up, the switch 332 can be turned to switch the water-resistant assembly 33 between the turned-on state and the turned-off state, so that the electronic device 30 can be breathable and water-resistant in the daily scenario, and the electronic device 30 can operate safely and reliably in the high water pressure scenario.

Same as Embodiment 1, in Embodiment 5, status detection of the water-resistant assembly 33 may be implemented by using a magnetic field sensor and a magnet, and prompt information is sent based on a status detection result of the water-resistant assembly 33. The magnetic field sensor and the magnet may be mounted at appropriate positions. For example, the magnetic field sensor may be mounted in the housing space 31*b*, and the magnet may be mounted on the clamping bar 336. And/or, status detection of the water-resistant assembly 33 may alternatively be implemented by using the microphone and the speaker (or by using a depth gauge), and prompt information is sent based on a status detection result of the water-resistant assembly 33. A specific principle is the same as that described above. Details are not described herein again.

In another embodiment, a status of the water-resistant assembly 33 may not be detected.

In addition, with reference to FIG. 78 to FIG. 79, the water-resistant assembly 33 does not basically protrude from the housing 31. When the switch 332 is rotated, the switch 332 does not basically protrude from the housing 31. This helps implement a hidden design of the water-resistant assembly, and improves appearance aesthetics of the electronic device 30. With reference to FIG. 76 and FIG. 79, the clamping bar 336 may have a clamping bar matching part 336*b* in a convex hull shape, so that the switch 332 may be short and in contact with the clamping bar 336. This helps implement the hidden design of the switch 332.

Embodiment 6

Figure 80:
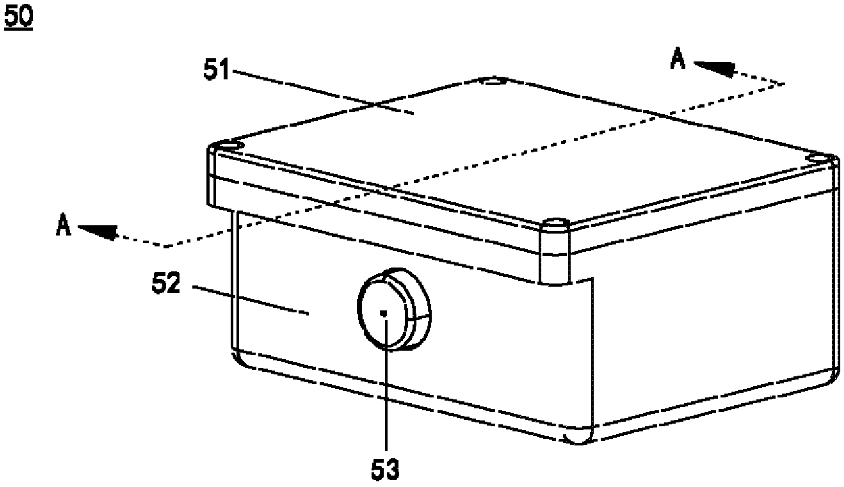
FIG. 80 is a schematic diagram of an assembly structure of an electronic device according to Embodiment 6.
Figure 81:
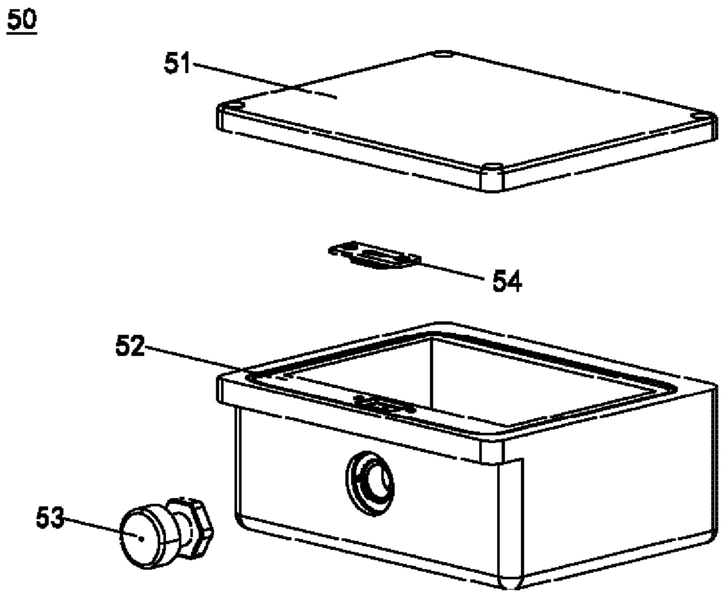
FIG. 81 is a schematic diagram of an exploded structure of the electronic device shown in FIG. 80.

As shown in FIG. 80 and FIG. 81, an electronic device 50 in Embodiment 6 may include a housing 51, a housing 52, a water-resistant assembly 53, and a water-resistant and breathable film 54. The housing 51 is mounted on one side of the housing 52, and the housing 51 and the housing 52 enclose an inner cavity of the electronic device 50. A microphone, a speaker, and a controller may be mounted in the inner cavity of the electronic device 50, and specific positions of the microphone, the speaker, and the controller may be designed as required. The controller may be a central processing unit or a microcontroller unit (MCU). Both the water-resistant assembly 53 and the water-resistant and breathable film 54 may be mounted on the housing 52.

Figure 82:
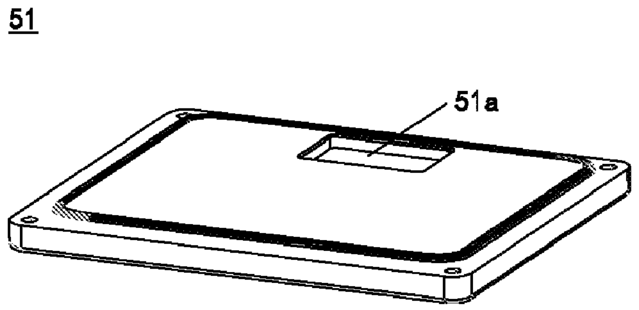
FIG. 82 is a schematic diagram of a structure of a housing of the electronic device according to Embodiment 6.

As shown in FIG. 81 and FIG. 82, for example, the housing 51 may be approximately shaped like a rectangular plate. A groove 51*a* is provided on a surface that is of the housing 51 and that is close to the inner cavity of the electronic device 50, and the groove 51*a* may be located at an edge of the housing 51.

Figure 83:
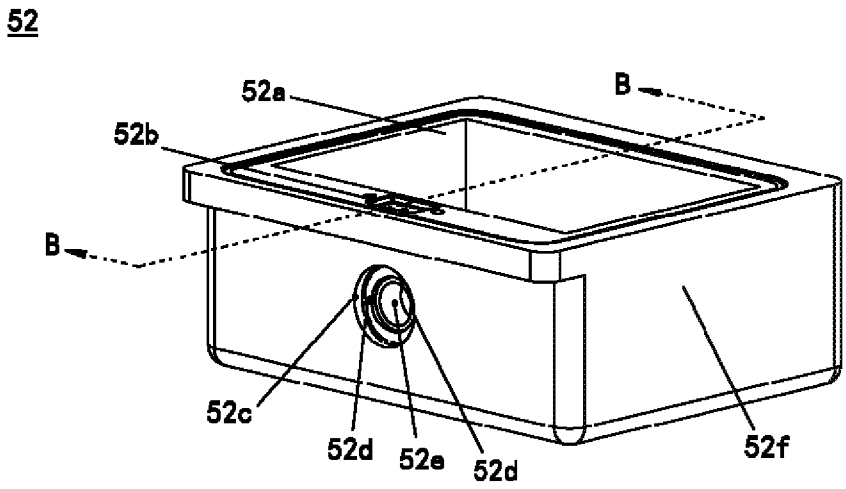
FIG. 83 is a schematic diagram of a structure of another housing of the electronic device according to Embodiment 6.
Figure 84:
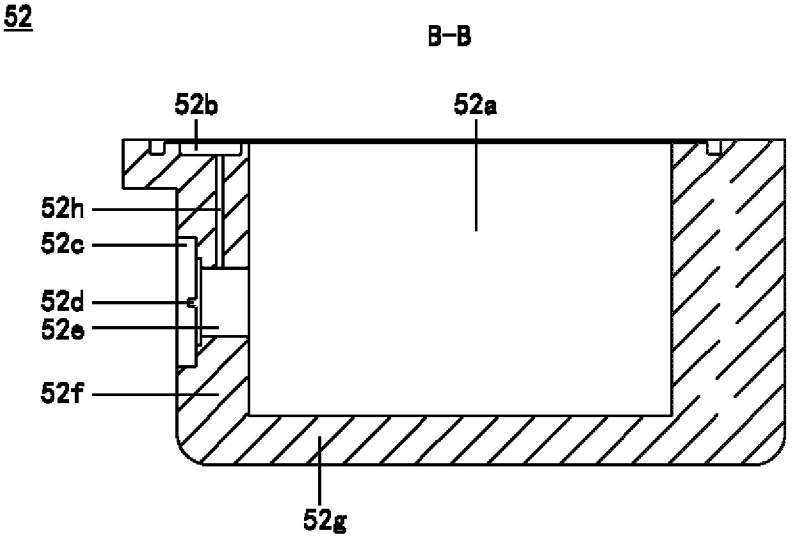
FIG. 84 is a schematic diagram of a B-B sectional structure of the housing shown in FIG. 83.

As shown in FIG. 83 and FIG. 84, the housing 52 may be approximately shaped like a square box having an opening. The housing 52 may include a circumferential side wall 52*f* and a bottom wall 52*g*. The circumferential side wall 52*f* and the bottom wall 52*g* enclose a housing space 52*a*, the housing space 53*a* is also a part of the inner cavity of the electronic device 50, and an opening of the housing space 52*a* is opposite to the bottom wall 52*g*.

As shown in FIG. 83 and FIG. 84, a groove 52*c* is provided on the circumferential side wall 52*f*, and an opening of the groove 52*c* faces outside of the housing space 52*a*. The groove 52*c* may be, for example, a circular stepped groove. Two bosses 52*d* may be provided on a bottom surface of a first groove (with a larger opening diameter) in the groove 52*c*, and the two bosses 52*d* may be respectively located at opposite ends of one diameter of the first groove. A through hole 52*e* may be provided in a bottom surface of a second groove (with a smaller opening diameter) in the groove 52*c*, and the through hole 52*e* is connected to the groove 52*c* and the housing space 52*a*.

As shown in FIG. 83 and FIG. 84, a breathable groove 52*b* is provided on a surface that is of the circumferential side wall 52*f* and that is far away from a bottom wall 42*h*, and the breathable groove 52*b* and the through hole 52*e* are located on a same side of the housing space 52*a*. A housing through hole 52*h* is provided in a bottom surface of the breathable groove 52*b*, and the housing through hole 52*h* is connected to the through hole 52*e*. For example, a center line of the housing through hole 52*h* may vertically intersect a center line of the through hole 52*e*.

Figure 85:
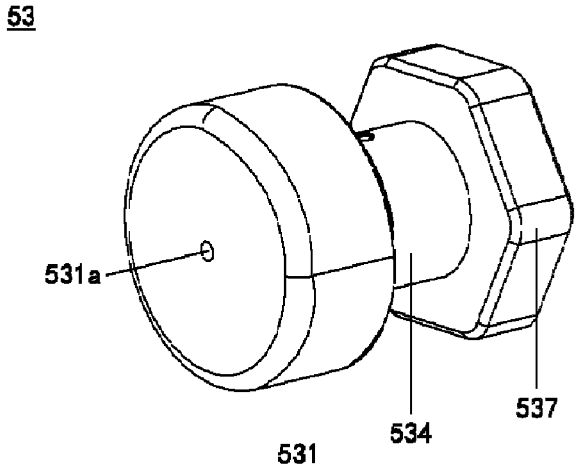
FIG. 85 is a schematic diagram of an assembly structure of a water-resistant assembly of the electronic device according to Embodiment 6.
Figure 86:
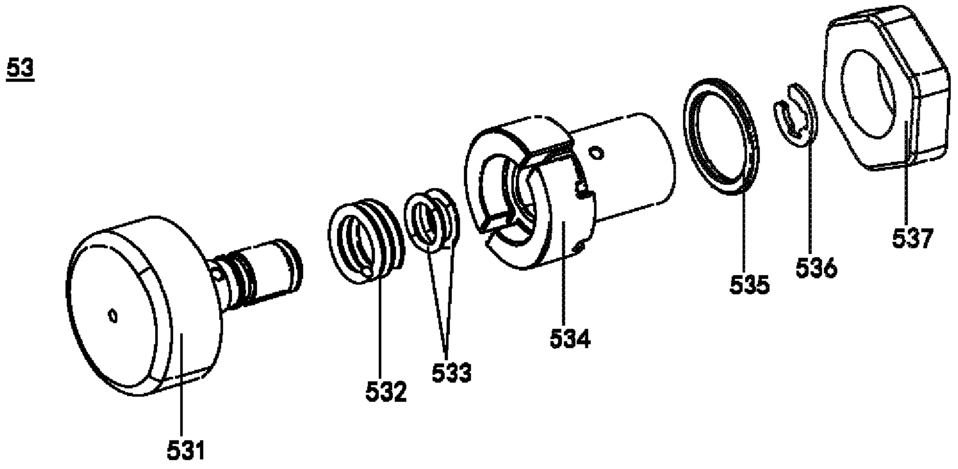
FIG. 86 is a schematic diagram of an exploded structure of the water-resistant assembly shown in FIG. 85.

As shown in FIG. 85 and FIG. 86, the water-resistant assembly 53 may include a switch 531, an elastic member 532, a switch sealing ring 533, a tube 534, a tube sealing ring 535, a switch limiting member 536, and a tube limiting member 537.

Figure 87:
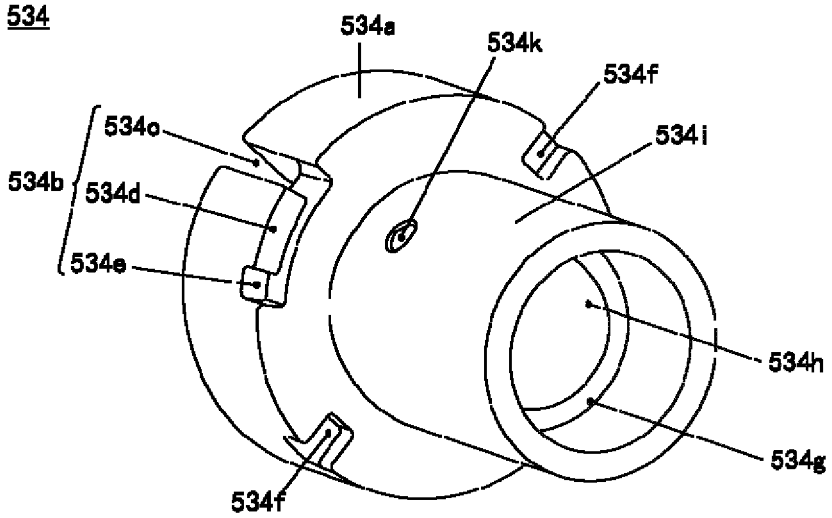
FIG. 87 is a schematic diagram of a structure of a tube in the water-resistant assembly according to Embodiment 6 from a perspective.
Figure 88:
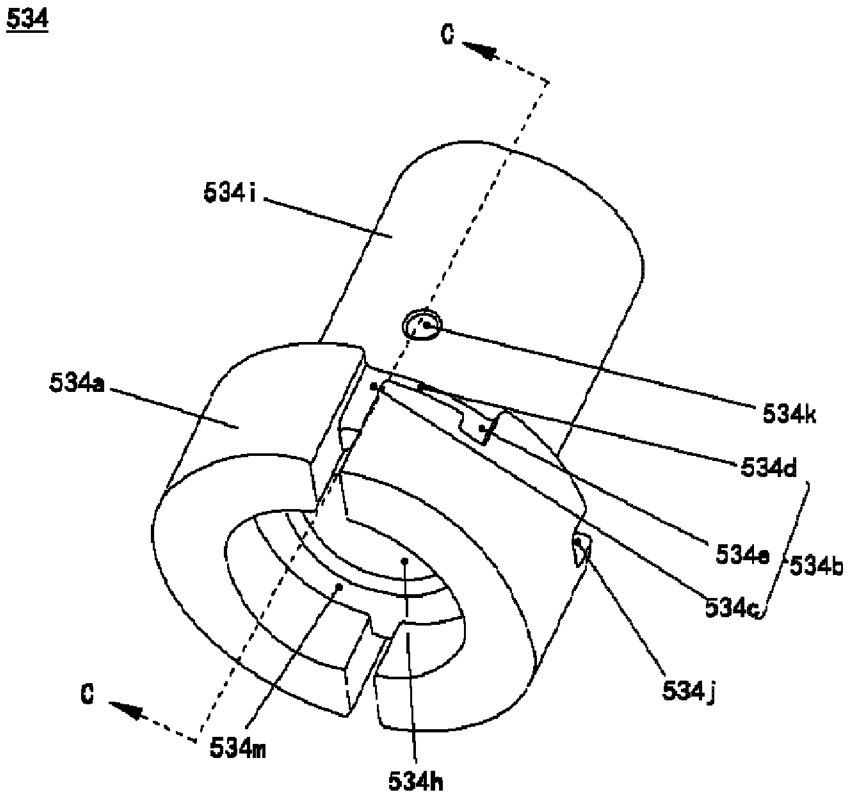
FIG. 88 is a schematic diagram of a structure of the tube in the water-resistant assembly according to Embodiment 6 from another perspective.
Figure 89:
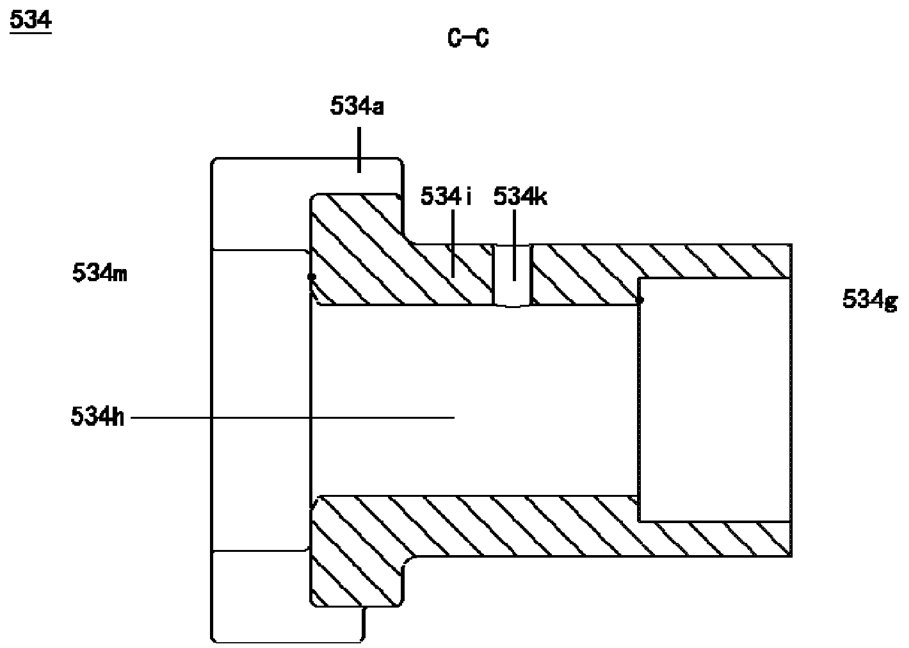
FIG. 89 is a schematic diagram of a C-C sectional structure of the tube shown in FIG. 88.

As shown in FIG. 87, FIG. 88, and FIG. 89, the tube 534 may be approximately shaped like a hollow rotary body. The tube 534 may include a head 534*a* and a tube body 534*i*, both of which may be connected as a whole. An outer diameter of the head 534*a* may be larger than that of the tube body 534*i*.

A matching groove 534*b* may be provided on an outer circumferential surface of the head 534*a*, and the matching groove 534*b* may include, for example, a first matching groove 534*c*, a second matching groove 534*d*, and a third matching groove 534*e* that are sequentially connected. The first matching groove 534*c*, the second matching groove 534*d*, and the third matching groove 534*e* may be roughly connected in an L shape. The first matching groove 534*c* may extend in an axial direction of the tube 534, the second matching groove 534*d* may extend in a circumferential direction of the tube 534, and the third matching groove 534*e* may extend in the axial direction of the tube 534. There may be two matching grooves 534*b* (only one matching groove 534*b* is shown in FIG. 87 and FIG. 88 due to a perspective reason), and the two matching grooves 534*b* may be roughly distributed at opposite ends of one diameter of the head 534*a*. Two positioning grooves 534*f* may be provided on a surface that is of the head 534*a* and that faces the tube body 534*i*, and the two positioning grooves 534*f* may be respectively located at opposite ends of one diameter of the head 534*a*. A side that is of the head 534*a* and that is far away from the tube body 534*i* may form a mounting groove 534*m*.

The tube body 534*i* has an accommodation hole 534*h* and an accommodation groove 534*g*. The accommodation hole 534*h* and the accommodation groove 534*g* may form a stepped hole, and an opening diameter of the accommodation groove 534*g* is larger than a diameter of the accommodation hole 534*h*. The accommodation hole 534*h* passes through a bottom surface of the mounting groove 534*m*, and the accommodation hole 534*h* is connected to the mounting groove 534*m* and the accommodation groove 534*g*. The mounting groove 534*m*, the accommodation hole 534*h*, and the accommodation groove 534*g* may constitute a tube inner cavity. A tube connection hole 534*k* is provided in a wall of the tube body 534*i*, and the tube connection hole 534*k* may be connected to the accommodation hole 534*h*. For example, a center line of the tube connection hole 534*k* may intersect vertically with that of the accommodation hole 534*h*.

Figure 90:
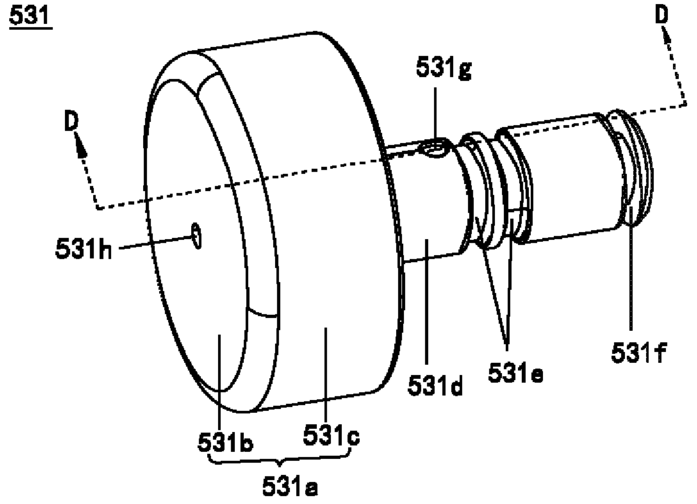
FIG. 90 is a schematic diagram of a structure of a switch in the water-resistant assembly according to Embodiment 6 from a perspective.
Figure 91:
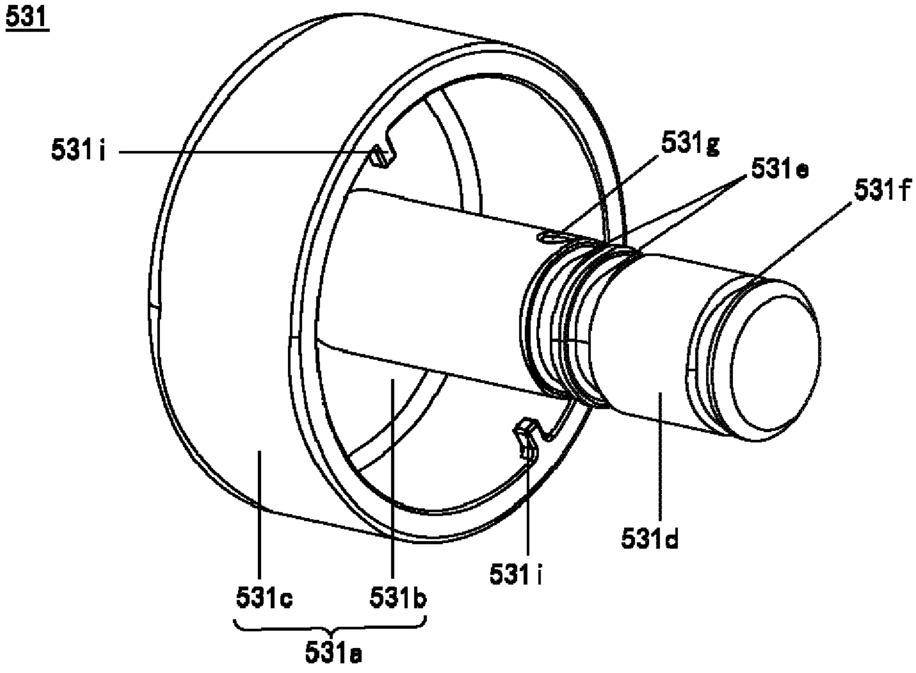
FIG. 91 is a schematic diagram of a structure of the switch in the water-resistant assembly according to Embodiment 6 from another perspective.
Figure 92:
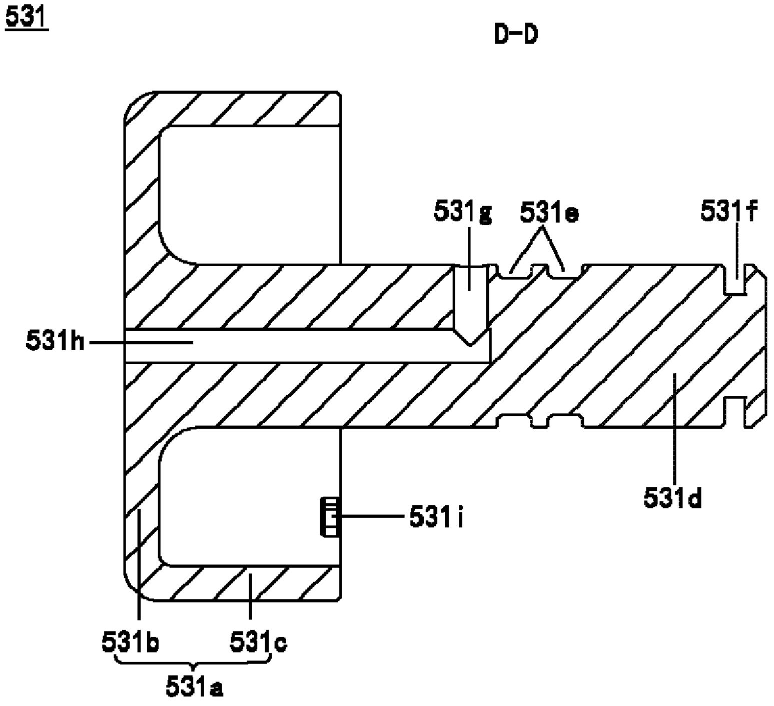
FIG. 92 is a schematic diagram of a D-D sectional structure of the switch shown in FIG. 90.

As shown in FIG. 90, FIG. 91, and FIG. 92, the switch 531 may be approximately shaped like a rotary body. The switch 531 may include a switch cap 531*a* and a switch lever 531*d*, which may be connected as a whole.

The switch cap 531*a* may be shaped like a circular cover having an opening. The switch cap 531*a* may include a bottom wall 531*b* and a circumferential side wall 531*c* surrounding a circumferential edge of the bottom wall 531*b*. Two matching protrusions 531*i* may be provided on an inner surface of the circumferential side wall 531*c*, and the two matching protrusions 531*i* may be respectively located at opposite ends of one diameter of the circumferential side wall 531*c*.

The switch lever 531*d* may be shaped like a round rod. One end of the switch lever 531*d* is connected to the bottom wall 531*b*, and the switch lever 531*d* is surrounded by and spaced from the circumferential side wall 531*c*. The switch lever 531*d* has an axial switch connection hole 531*h* and a radial switch connection hole 531*g*. A center line of the axial switch connection hole 531*h* may be in an axial direction of the switch lever 531*d*, and a center line of the radial switch connection hole 531*g* may be in a radial direction of the switch lever 531*d*. The radial switch connection hole 531*g* may be located at one end of the axial switch connection hole 531*h* and is connected to the axial switch connection hole 531*h*. One end that is of the axial switch connection hole 531*h* and that is away from the radial switch connection hole 531*g* may further pass through the bottom wall 531*b*. Two sealing grooves 531*e* may be provided on an outer circumferential surface of the switch lever 531*d*, each sealing groove 531*e* may surround an axis of the switch lever 531*d*, and the two sealing grooves 531*e* may be located on a side that is of the radial switch connection hole 531*g* and that is away from the bottom wall 531*b*. A limiting groove 531*f* may be provided on an outer circumferential surface of one end that is of the switch lever 531*d* and that is far away from the bottom wall 531*b*. The limiting groove 531*f* may surround the axis of the switch lever 531*d*.

As shown in FIG. 86, the elastic member 532 may be, for example, a spring or another component that can be elastically telescopic. The switch sealing ring 533 and the tube sealing ring 535 each may be made of an elastic sealing material, for example, rubber or silica gel. The limiting member 536 may be an annular structure having an opening, and the limiting member 536 may be, for example, an opening retaining ring.

Figure 93:
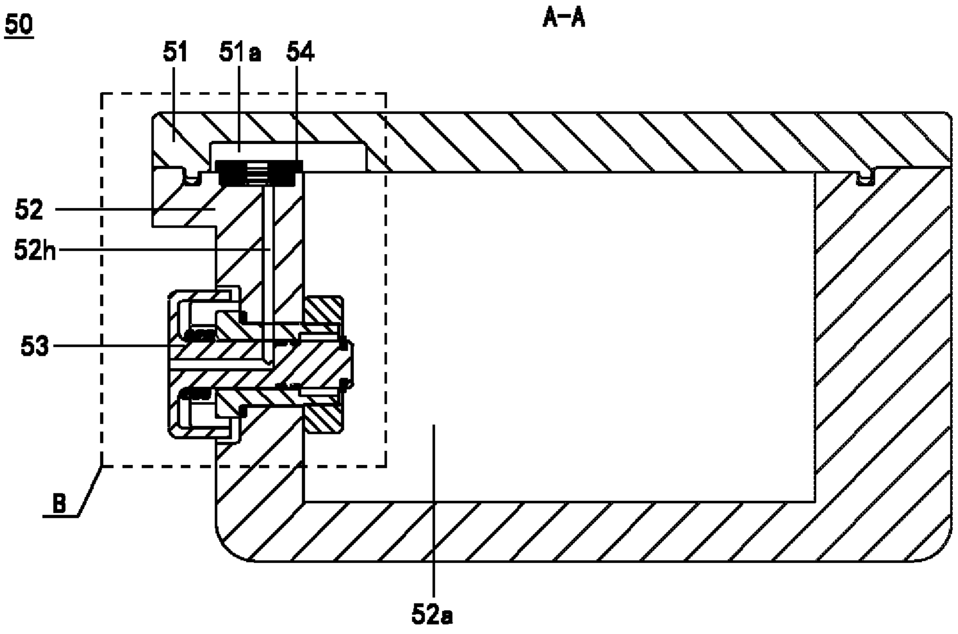
FIG. 93 is a schematic diagram of an A-A sectional structure of the electronic device shown in FIG. 80.
Figure 94:
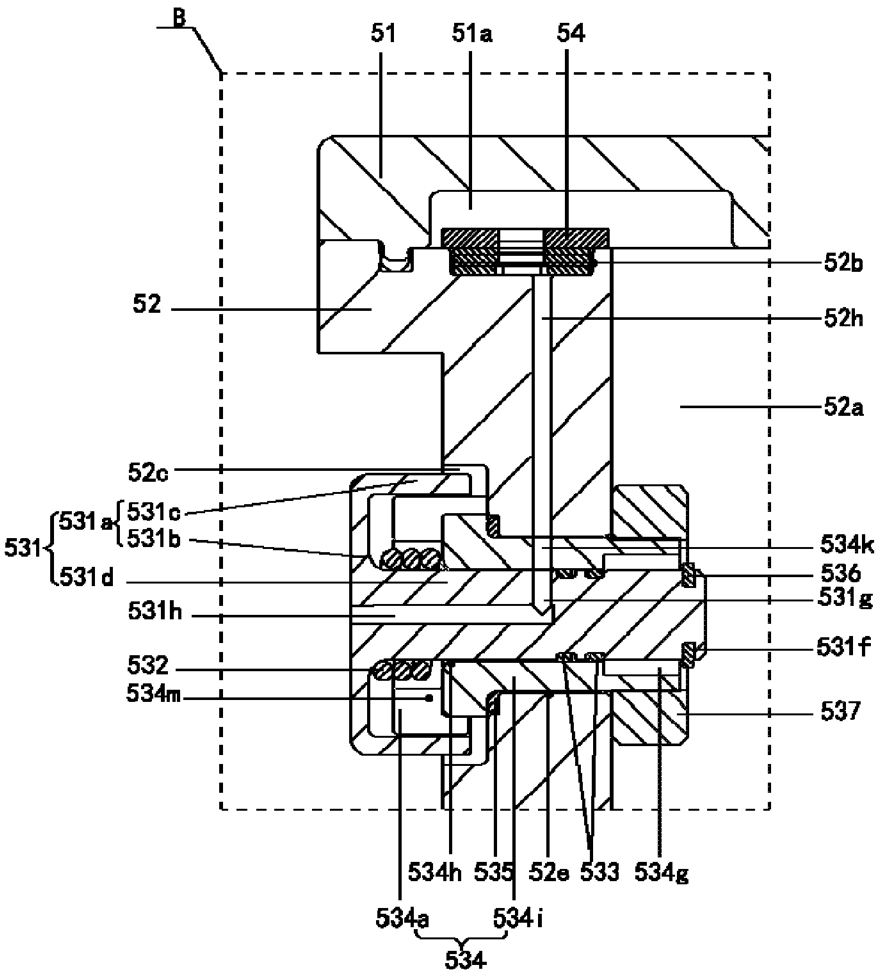
FIG. 94 is a schematic diagram of a partially enlarged structure at a position B in FIG. 93.

FIG. 93 shows a sectional assembly structure including the housing 51, the housing 52, and the water-resistant assembly 53, and FIG. 94 is a schematic diagram of a partially enlarged structure at a position B in FIG. 93.

As shown in FIG. 93 and FIG. 94, the housing 51 and the housing 52 are mounted, and the housing 51 covers the housing space 52*a* of the housing 52. The groove 51*a* of the housing 51 is connected to the housing space 52*a* of the housing 52. The groove 51*a* corresponds to the breathable groove 52*b*, and orthographic projection of the breathable groove 52*b* on the housing 51 may fall into the groove 51*a*. The water-resistant and breathable film 54 is mounted in the breathable groove 52*b* and spaced from the groove 51*a*.

With reference to FIG. 83. FIG. 87, and FIG. 94, a part of the head 534*a* of the tube 534 may be located in the first groove of the groove 52*c* and in contact with a bottom wall of the first groove. The two positioning grooves 534*f* of the head 534*a* may match the two bosses 52*d* in the first groove in one-to-one correspondence, so that the tube 534 can be positioned in the housing 52. The tube sealing ring 535 may be mounted in the second groove of the groove 52*c* and pressed between the head 534*a* and a bottom wall of the second groove, to provide a sealing function. The tube body 534*i* of the tube 534 may pass through the through hole 52*e* and extend into the housing space 52*a*. The tube connection hole 534*k* in the tube body 534*i* is connected to the housing through hole 52*h*. The tube limiting member 537 located in the housing space 52*a* may be sleeved on a periphery of the tube body 534*i* and fixedly connected to the tube body 534*i* (the tube limiting member 537 may be, for example, a nut, and the nut is in threaded connection to the tube body 534*i*). The tube limiting member 537 is in contact with an inner wall of the housing 52, so that the tube 534 can be fastened to the housing 52 by using the tube limiting member 537.

As shown in FIG. 94, the switch lever 531*d* of the switch 531 may be located in the accommodation hole 534*h* and the accommodation groove 534*g*, and the radial switch connection hole 531*g* is connected to the tube connection hole 534*k*. With reference to FIG. 90 and FIG. 94, two switch sealing rings 533 may be respectively correspondingly fitted into the two sealing grooves 531*e*, and the two switch sealing rings 533 may be in contact with an inner wall of the accommodation hole 534*h*. The limiting member 536 may be mounted into the limiting groove 531*f*, and the limiting member 536 may be specifically spaced from a bottom wall of the accommodation groove 534*g*. The switch cap 531*a* of the switch 531 may surround a periphery of the head 534*a*. The elastic member 532 is mounted in the mounting groove 534*m*, and opposite ends of the elastic member 532 respectively abut against a bottom wall of the mounting groove 534*m* and the bottom wall 531*b* of the switch cap 531*a*.

Figure 95:
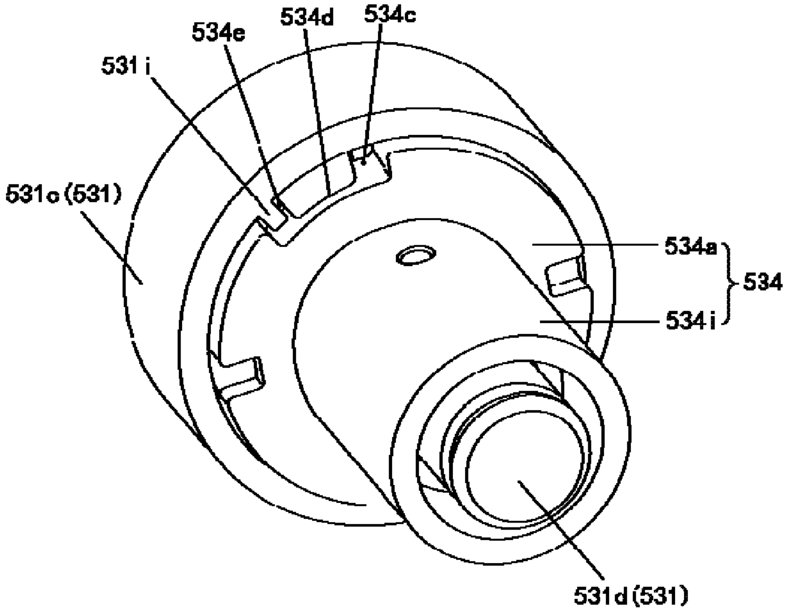
FIG. 95 is a schematic diagram of an assembly structure including the switch and the tube in the water-resistant assembly according to Embodiment 6.

Further, as shown in FIG. 95, the two matching protrusions 531*i* on the circumferential side wall 531*c* of the switch cap 531*a* can be respectively clamped into two third matching grooves 534*e* of the head 534*a* (only matching between one matching protrusion 531*i* and one third matching groove 534*e* is shown in FIG. 95 due to a perspective reason). With reference to FIG. 94 and FIG. 95, because the elastic member 532 exerts an elastic force on the switch cap 531*a*, the switch cap 531*a* tends to move toward outside of the housing space 52*a*. However, due to a limiting effect of the third matching groove 534*e* on the matching protrusion 531*i*, the switch cap 531*a* can be kept in a stationary state. In a state shown in FIG. 94, the switch 531 may be in a second limit position (or a right limit position).

The water-resistant assembly 53 in FIG. 94 is in a turned-on state. In the turned-on state, the axial switch connection hole 531*h*, the radial switch connection hole 531*g*, the tube connection hole 534*k*, and the housing through hole 52*h* are sequentially connected to form a channel that connects an external environment to the housing space 52*a*. Therefore, when the electronic device 50 operates in a daily scenario, a sound from outside of the electronic device 50 may enter the electronic device 50 through the channel and be picked up by the microphone. External air can also enter the electronic device 50 through the channel, to balance air pressure inside and outside the electronic device 50. Because the water-resistant and breathable film 54 exists, external liquid cannot enter the electronic device 50, so that the electronic device 50 can be breathable and water-resistant in the daily scenario.

Figure 96:
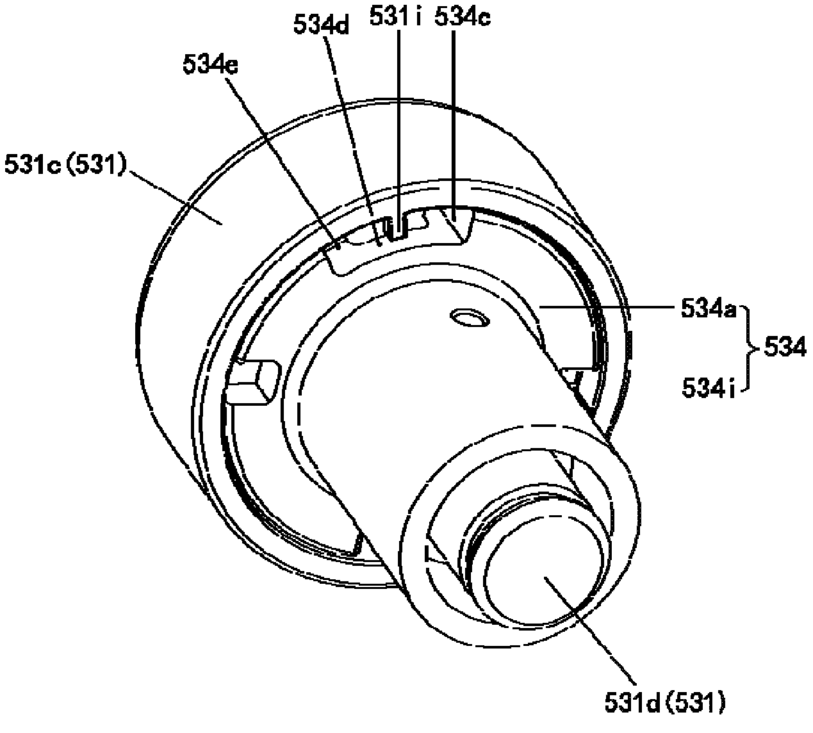
FIG. 96 is a schematic diagram of another assembly structure including the switch and the tube in the water-resistant assembly according to Embodiment 6.
Figure 97:
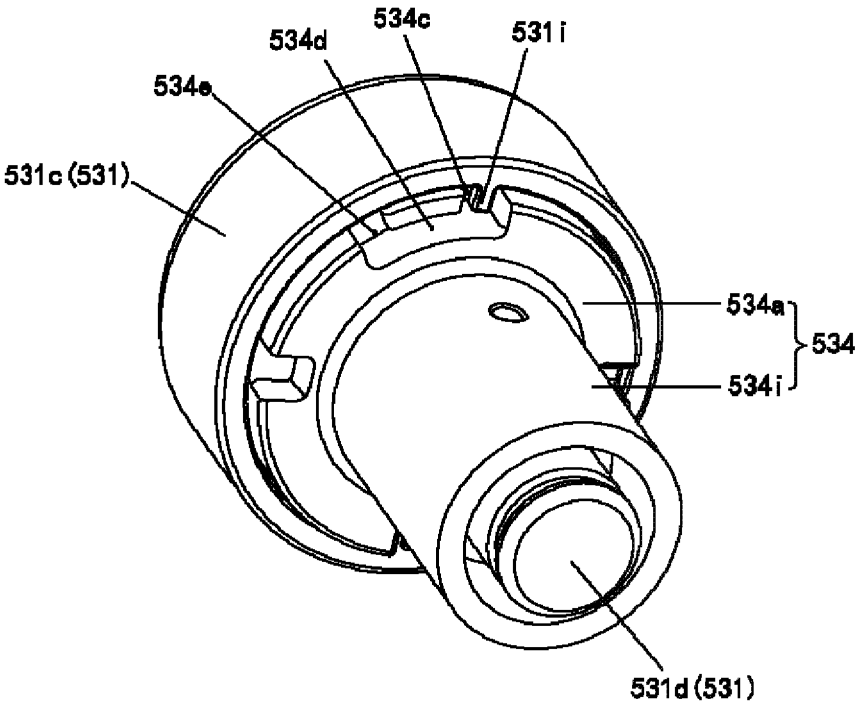
FIG. 97 is a schematic diagram of another assembly structure including the switch and the tube in the water-resistant assembly according to Embodiment 6.
Figure 98:
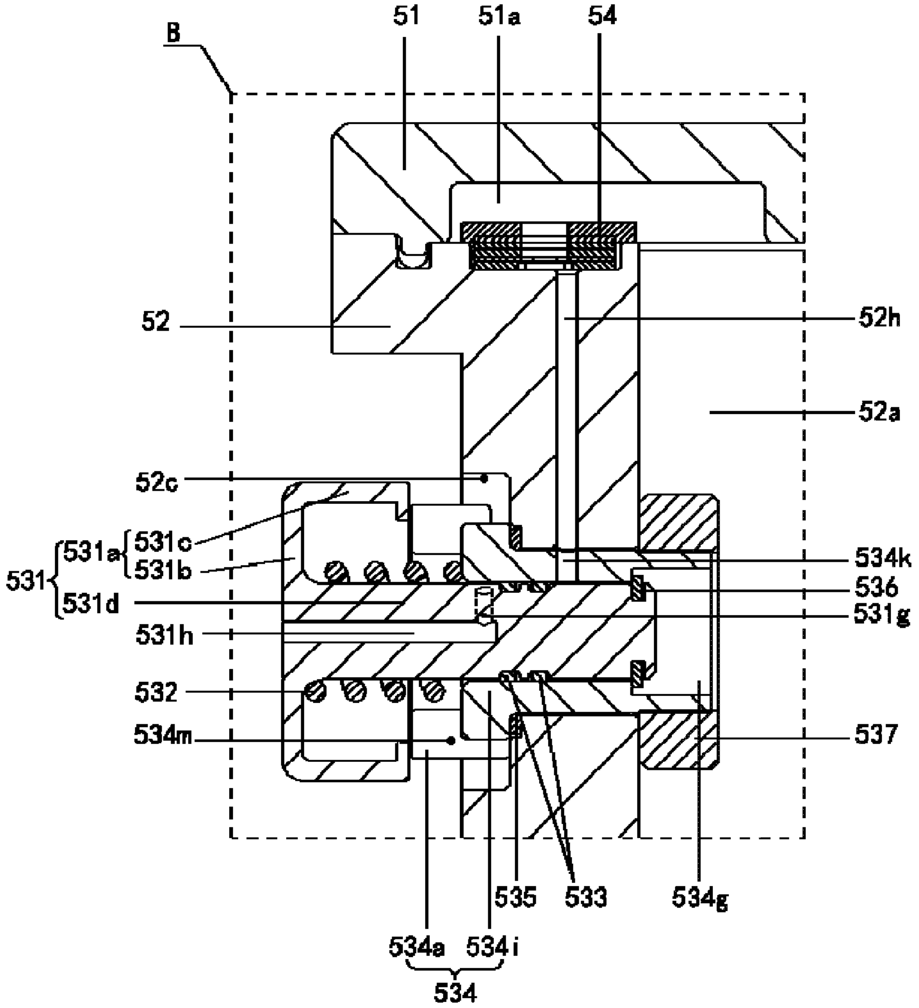
FIG. 98 is a schematic diagram of another sectional structure including the water-resistant assembly and the housing according to Embodiment 6.
Figure 99:
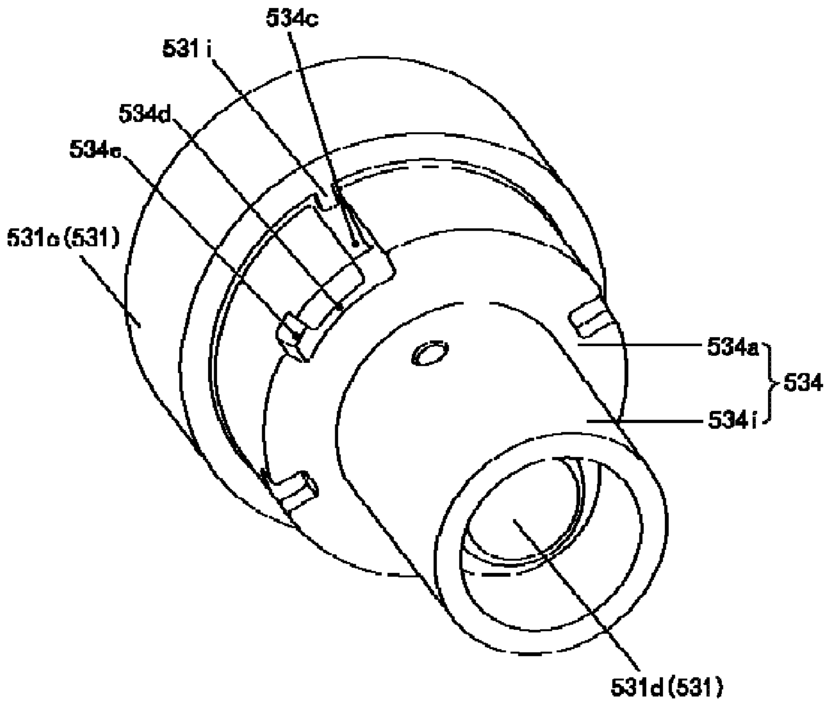
FIG. 99 is a schematic diagram of another assembly structure including the switch and the tube in the water-resistant assembly according to Embodiment 6.

With reference to FIG. 95. FIG. 96, and FIG. 97, a user may push the switch cap 531*a* in an axial direction of the switch cap 531*a* so that the matching protrusion 531*i* moves out of the third matching groove 534*e*, and then the user rotates the switch cap 531*a* so that the matching protrusion 531*i* moves from the second matching groove 534*d* to the first matching groove 534*c*. At this time, as shown in FIG. 98, the switch cap 531*a* moves to outside of the housing space 52*a* due to an elastic force of the elastic member 532, until the switch limiting member 536 abuts against a bottom surface of the accommodation groove 534*g*, and the switch 531 is in a first limit position (or referred to as a left limit position). With reference to FIG. 98 and FIG. 99, when the switch 531 is in the first limit position, the matching protrusion 531*i* is located at one end that is of the first matching groove 534*c* and that is far away from the second matching groove 534*d*.

As shown in FIG. 98, when the switch 531 is in the left limit position, the radial switch connection hole 531*g* is completely displaced from the tube connection hole 534*k*, and the center line of the radial switch connection hole 531*g* and the tube connection hole 534*k* form a spatial intersection angle. In addition, the two switch sealing rings 533 may be located between the radial switch connection hole 531*g* and the tube connection hole 534*k*. In this way, the channel is obstructed and the water-resistant assembly 53 may be in a turned-off state.

Refer to FIG. 98. In the turned-off state, when the electronic device 50 enters a high water pressure scenario, liquid flows from the axial switch connection hole 531*h* to the radial switch connection hole 531*g*. When the liquid penetrates into an assembly gap between the switch lever 531*d* and the tube body 534*i*, the liquid is blocked by the switch sealing ring 533 and cannot continue to penetrate in a direction of the housing space 52*a*. In addition, because the tube sealing ring 535 exists, the liquid cannot enter the housing space 52*a* from the groove 52*c*. Therefore, in the turned-off state, regardless of a path, the liquid cannot enter the inner cavity of the electronic device 50.

In Embodiment 6, the radial switch connection hole 531*g* is displaced from the tube connection hole 534*k*, and a permeation path of the liquid is blocked by the switch sealing ring 533 and the tube sealing ring 535 to block a large amount of high-pressure liquid, so that the water-resistant and breathable film 54 does not need to withstand high pressure and therefore is not prone to damage. Therefore, the electronic device 50 can operate reliably in the high water pressure scenario.

It can be understood that, after the electronic device 50 leaves the high water pressure scenario and enters a daily scenario, with reference to FIG. 95 and FIG. 98, the user may first push the switch cap 531*a* and then rotate the switch cap 531*a*, so that the matching protrusion 531*i* moves from the first matching groove 534*c* to the third matching groove 534*e* again and is clamped with the third matching groove 534*e*, to enable the water-resistant assembly 53 in the turned-on state. The switch cap 531*a* is pushed and rotated to switch the water-resistant assembly 53 between the turned-on state and the turned-off state, so that the electronic device 50 can be breathable and water-resistant in the daily scenario, and the electronic device 50 can operate safely and reliably in the high water pressure scenario.

Same as Embodiment 1, in Embodiment 6, status detection of the water-resistant assembly 53 may be implemented by using a magnetic field sensor and a magnet, and prompt information is sent based on a status detection result of the water-resistant assembly 53. The magnetic field sensor and the magnet may be mounted at appropriate positions. For example, the magnetic field sensor may be mounted in the housing space 52*a*, and the magnet may be mounted on one end that is of the switch lever 531*d* and that is far away from the switch cap 531*a*. And/or, status detection of the water-resistant assembly 53 may alternatively be implemented by using the microphone and the speaker (or by using a depth gauge), and prompt information is sent based on a status detection result of the water-resistant assembly 53. A specific principle is the same as that described above. Details are not described herein again.

In another embodiment, a status of the water-resistant assembly 53 may not be detected.

Embodiment 7

Figure 100:
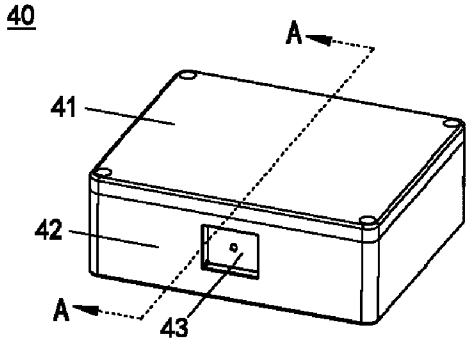
FIG. 100 is a schematic diagram of an assembly structure of an electronic device according to Embodiment 7.
Figure 101:
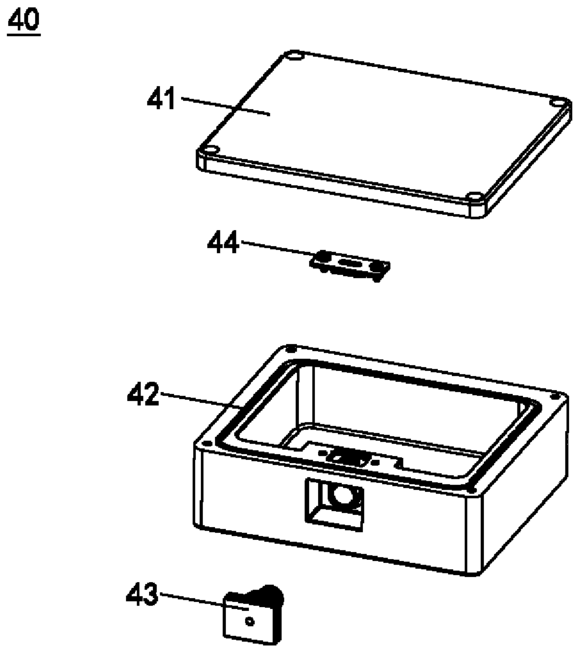
FIG. 101 is a schematic diagram of an exploded structure of the electronic device shown in FIG. 100.

As shown in FIG. 100 and FIG. 101, an electronic device 40 in Embodiment 7 may include a housing 41, a housing 42, a water-resistant assembly 43, and a water-resistant and breathable film 44. The housing 41 is mounted on one side of the housing 42, and the housing 41 and the housing 42 may enclose an inner cavity of the electronic device 40. A microphone, a speaker, and a controller may be mounted in the inner cavity of the electronic device 40, and specific positions of the microphone, the speaker, and the controller may be designed as required. The controller may be a central processing unit or a microcontroller unit (MCU). Both the water-resistant assembly 43 and the water-resistant and breathable film 44 may be mounted on the housing 42.

Figure 102:
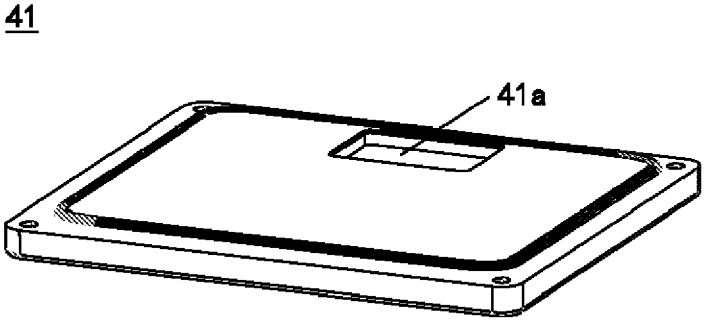
FIG. 102 is a schematic diagram of a structure of a housing of the electronic device according to Embodiment 7.

As shown in FIG. 102, the housing 41 may be approximately shaped like a rectangular plate. A groove 41*a* is provided on a surface that is of the housing 41 and that is close to the inner cavity of the electronic device 40, and the groove 41*a* may be located at an edge of the housing 41.

Figure 103:
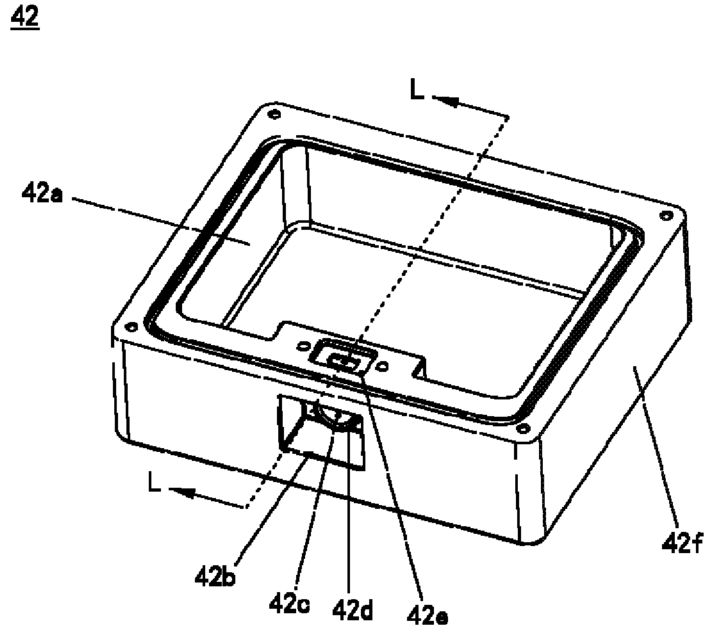
FIG. 103 is a schematic diagram of a structure of another housing of the electronic device according to Embodiment 7.
Figure 104:
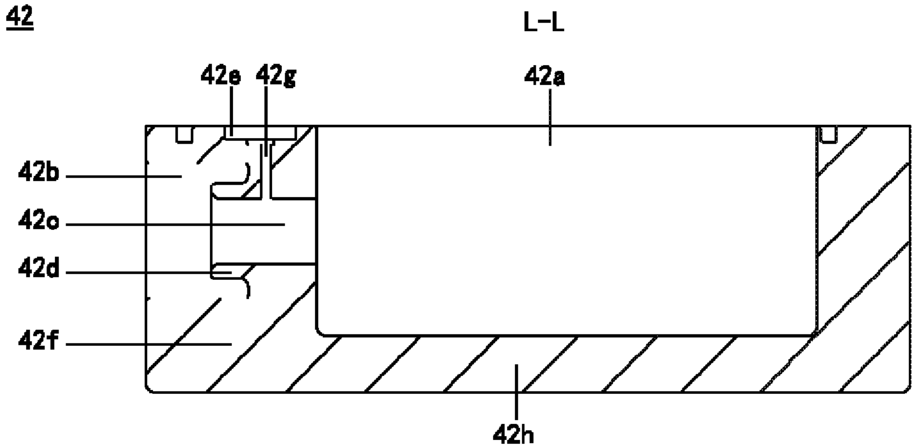
FIG. 104 is a schematic diagram of an L-L sectional structure of the housing shown in FIG. 103.

As shown in FIG. 103 and FIG. 104, the housing 42 may be approximately a square box having an opening. The housing 42 may include a circumferential side wall 42*f* and a bottom wall 42*h*. The circumferential side wall 42*f* and the bottom wall 42*h* enclose a housing space 42*a*, the housing space 42*a* is also a part of the inner cavity of the electronic device 40, and an opening of the housing space 42*a* is opposite to the bottom wall 42*h*.

As shown in FIG. 103 and FIG. 104, a groove 42*b* is provided on the circumferential side wall 42*f*, and an opening of the groove 42*b* faces outside of the housing space 42*a*. For example, the groove 42*b* may be a rectangular groove. A bottom surface of the groove 42*b* may form a boss 42*d*, the boss 42*d* is approximately cylindrical, and a height of the boss 42*d* does not exceed a groove depth of the groove 42*b*. A through hole 42*c* is provided inside the boss 42*d*, and the through hole 42*c* is connected to the groove 42*b* and the housing space 42*a*.

As shown in FIG. 103 and FIG. 104, a breathable groove 42*e* is provided on a surface that is of the circumferential side wall 42*f* and that is far away from a bottom wall 42*h*, and the breathable groove 42*e* and the through hole 42*c* are located on a same side of the housing space 42*a*. A housing through hole 42*g* is provided in a bottom surface of the breathable groove 42*e*, and the housing through hole 42*g* is connected to the through hole 42*c*. For example, a center line of the housing through hole 42*g* may vertically intersect a center line of the through hole 42*c*.

Figure 105:
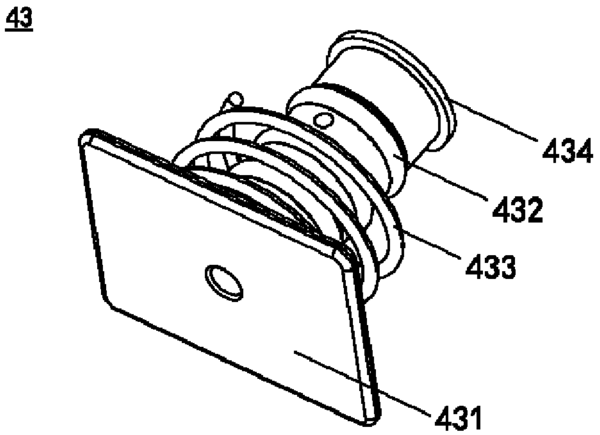
FIG. 105 is a schematic diagram of a structure of a water-resistant assembly of the electronic device according to Embodiment 7.
Figure 106:
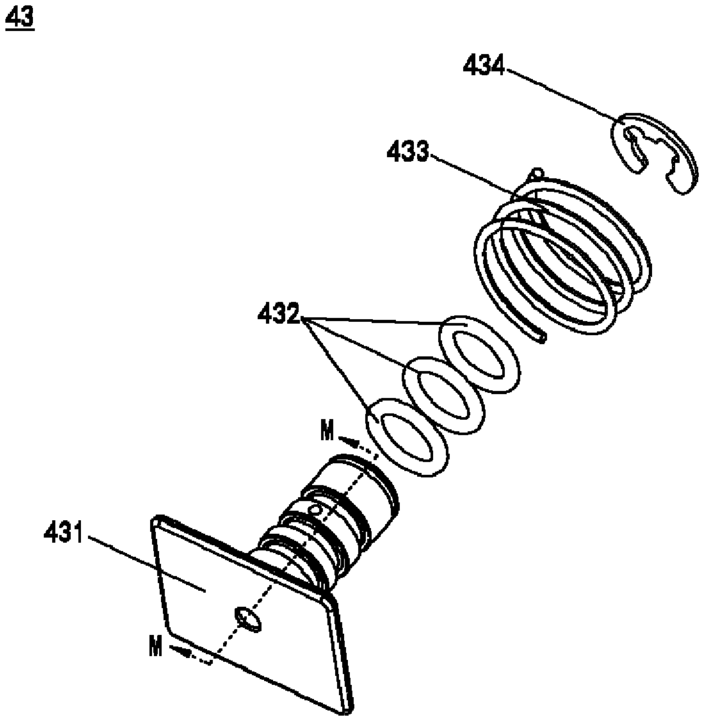
FIG. 106 is a schematic diagram of an exploded structure of the water-resistant assembly shown in FIG. 105.

As shown in FIG. 105 and FIG. 106, the water-resistant assembly 43 may include a switch 431, a sealing ring 432, an elastic member 433, and a limiting member 434.

Figure 107:
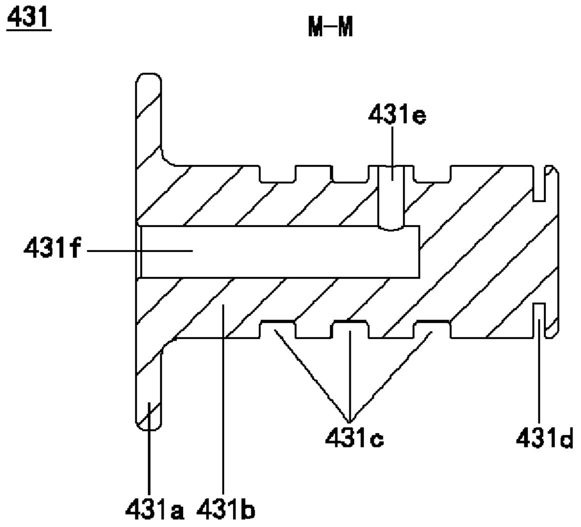
FIG. 107 is a schematic diagram of an M-M sectional structure of a switch in FIG. 106.

As shown in FIG. 106 and FIG. 107, the switch 431 may include a switch plate 431*a* and a switch lever 431*b*, and the switch plate 431*a* is connected to one end of the switch lever 431*b*. The switch plate 431*a* may be approximately shaped like a rectangular plate, the switch lever 431*b* may be approximately shaped like a round rod, and an axis of the switch lever 431*b* may be perpendicular to the switch plate 431*a*.

As shown in FIG. 107, a connection hole 431*f* is provided in a surface that is of the switch plate 431*a* and that is far away from the switch lever 431*b*, and the connection hole 431*f* extends into the switch lever 431*b* in an axial direction of the switch lever 431*b*, but does not pass through the switch lever 431*b*. A connection hole 431*e* is provided in a circumferential surface of the switch lever 431*b*. The connection hole 431*e* is connected to the connection hole 431*f*. For example, axes of the connection hole 431*e* and the connection hole 431*f* may intersect vertically.

As shown in FIG. 107, the circumferential surface of the switch lever 431*b* has sealing grooves 431*c*, and the sealing grooves 431*c* surrounds the axis of the switch lever 431*b*. There may be a plurality of sealing grooves 431*c*, for example, three. The plurality of sealing grooves 431*c* are spaced apart from each other. Each of two sides of the connection hole 431*e* may have at least one sealing groove 431*c*. For example, from a perspective of FIG. 107, there are two sealing grooves 431*c* on the left of the connection hole 431*e*, and there is one sealing groove 431*c* on the right of the connection hole 431.

As shown in FIG. 107, a circumferential surface of one end that is of the switch lever 431*b* and that is far away from the switch plate 431*a* has a limiting groove 431*d*, and the limiting groove 431*d* may surround the axis of the switch lever 431*b*.

As shown in FIG. 106, the elastic member 433 may be, for example, a spring or another component that can be elastically telescopic.

As shown in FIG. 106, the sealing ring 432 may be in a ring shape. The sealing ring 432 may be made of an elastic sealing material, for example, rubber or silica gel. A quantity of sealing rings 432 may correspond to a quantity of sealing grooves 431*c*. For example, there are three sealing rings 432. Refer to FIG. 106 and FIG. 107. One sealing ring 432 is correspondingly mounted in one sealing groove 431*c*.

As shown in FIG. 106, the limiting member 434 may be an annular structure with an opening, and the limiting member 434 may be, for example, an open retaining ring.

Figure 108:
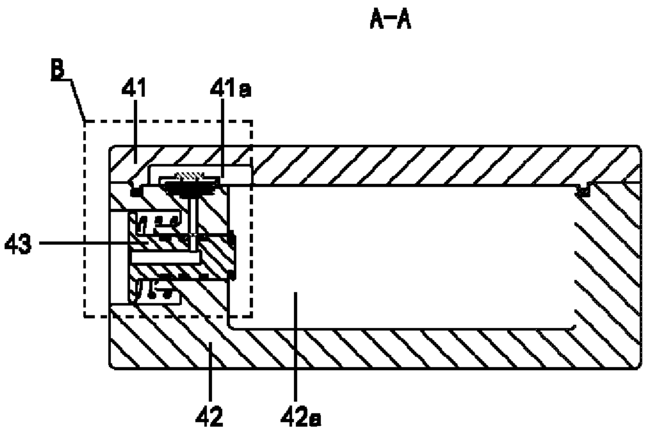
FIG. 108 is a schematic diagram of an A-A sectional structure of the electronic device shown in FIG. 100.
Figure 109:
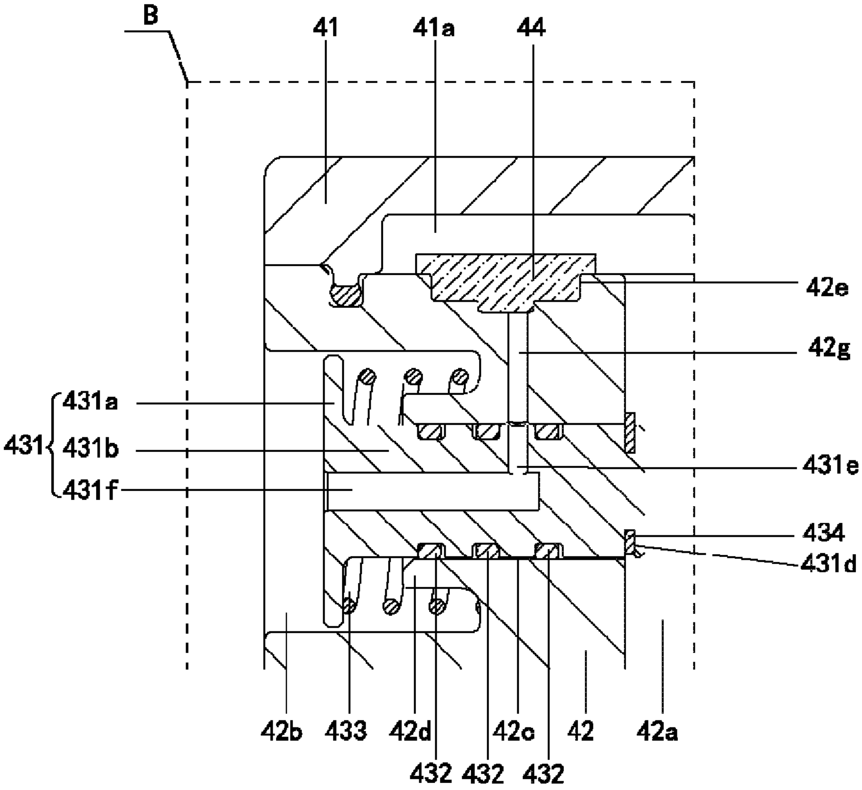
FIG. 109 is a schematic diagram of a partially enlarged structure at a position B in FIG. 108.

FIG. 108 and FIG. 109 may represent an assembly structure of the water-resistant assembly 43 and an assembly state of the water-resistant assembly 43 and the housing 42. FIG. 108 is a schematic diagram of an A-A sectional structure of the electronic device 40 in FIG. 100, and FIG. 109 is a schematic diagram of a partially enlarged structure at a position B in FIG. 108.

As shown in FIG. 108 and FIG. 109, the housing 41 and the housing 42 are mounted, and the housing 41 covers the housing space 42*a* of the housing 42. The groove 41*a* of the housing 41 is connected to the housing space 42*a* of the housing 42. The groove 41*a* corresponds to the breathable groove 42*e*, and orthographic projection of the breathable groove 42*e* on the housing 41 may fall into the groove 41*a*. The water-resistant and breathable film 44 is mounted in the breathable groove 42*e* and spaced from the groove 41*a*.

As shown in FIG. 109, the switch 431 may be mounted in the through hole 42*c* of the housing 42. The switch plate 431*a* and a part of the switch lever 431*b* are located in the groove 42*b* of the housing 42, and the other part of the switch lever 431*b* passes through the through hole 42*c* and extends into the housing space 42*a* of the housing 42. Matching between the switch plate 431*a* and the groove 42*b* allows the switch 431 to move in the through hole 42*c*, but cannot rotate. In a state shown in FIG. 109, the switch 431 is spaced from the boss 42*d*, and the switch 431 is in a first limit position (or referred to as a left limit position).

As shown in FIG. 109, the limiting member 434 may be clamped into the limiting groove 431*d* of the switch lever 431*b* and in contact with the housing 42. Because an outer diameter of the limiting member 434 is greater than an inner diameter of the through hole 42*c* of the housing 42, the limiting member 434 can prevent the switch 431 from being detached from the through hole 42*c*. The elastic member 433 is sleeved on a periphery of the boss 42*d*. One end of the elastic member 433 presses against a bottom surface of the groove 42*b*, and the other end is in contact with a surface that is of the switch plate 431*a* and that is far away from the switch lever 431*b*.

In the state shown in FIG. 109, the water-resistant assembly 43 is in a turned-on state. In the turned-on state, the connection hole 431*e* is aligned with and connected to the housing through hole 42*g*. The connection hole 431*f*, the connection hole 431*e*, the housing through hole 42*g*, and the groove 41*a* form a channel. Therefore, a sound from outside of the electronic device 40 can enter the electronic device 40 through the channel and be picked up by the microphone. External air can also enter the electronic device 40 through the channel, to balance air pressure inside and outside the electronic device 40. Because the water-resistant and breathable film 44 exists, external liquid cannot enter the electronic device 40, so that the electronic device 40 can be breathable and water-resistant in a daily scenario.

When the electronic device 40 enters a high water pressure scenario, as shown in FIG. 109, liquid entering the groove 42*b* exerts rightward pressure on the switch plate 431*a*, causing the switch 431 to move toward the housing space 42*a*. As the switch 431 moves, the connection hole 431*e* is gradually displaced from the housing through hole 42*g*.

Figure 110:
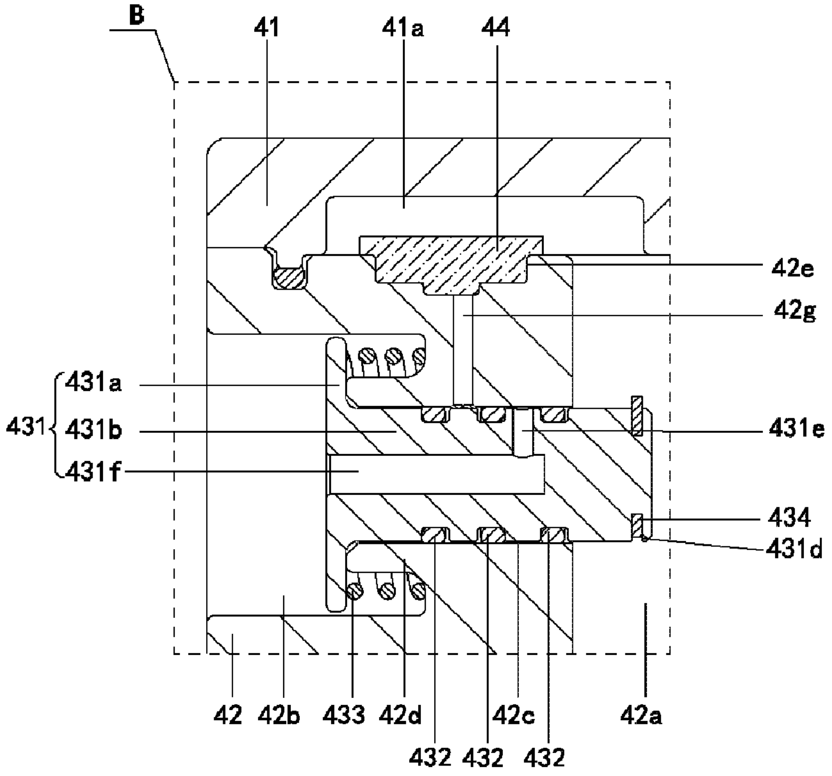
FIG. 110 is a schematic diagram of another sectional assembly structure including the housing and the water-resistant assembly according to Embodiment 7.

As shown in FIG. 110, until the switch plate 431*a* presses against the boss 42*d* and the connection hole 431*e* is completely displaced from the housing through hole 42*g*, the channel is obstructed. In this case, the switch 431 moves to a second limit position (or referred to as a right limit position). In addition, there is one sealing ring 432 on the left of the housing through hole 42*g*. After entering an assembly gap between an inner wall of the through hole 42*c* and the switch lever 431*b*, liquid in the groove 42*b* is prevented by the sealing ring 432 on the left of the housing through hole 42*g* from entering the housing through hole 42*g*. There is one sealing ring 432 on the left of the connection hole 431*e* and one sealing ring 432 on the right of the connection hole 431*e*. After entering the assembly gap between the inner wall of the through hole 42*c* and the switch lever 431*b*, liquid in the connection hole 431*e* is prevented by the two sealing rings 432 on the left and right sides of the connection hole 431*e* from entering the housing through hole 42*g* and the housing space 42*a*. Therefore, regardless of a path, the liquid cannot enter the inner cavity of the electronic device 40.

In a state shown in FIG. 110, the water-resistant assembly 43 is in a turned-off state. In the turned-off state, the channel is obstructed, and outside of the housing 42 is disconnected from the housing space 42*a*, so that external liquid cannot enter the electronic device 40. The connection hole 431*e* is displaced from the housing through hole 42*g* under hydraulic pressure, and a permeation path of the liquid is blocked by the sealing ring 432 to block a large amount of high-pressure liquid, so that the water-resistant and breathable film 44 does not need to withstand high pressure and therefore is not prone to damage. Therefore, the electronic device 40 can operate reliably in the high water pressure scenario.

It can be understood that, after the electronic device 40 leaves the high water pressure scenario and enters a daily scenario, the switch 431 automatically restores to the first limit position, and the water-resistant assembly 43 automatically restores to the turned-on state.

To sum up, the water-resistant assembly 43 of the electronic device 40 can automatically switch between the turned-on state and the turned-off state under different pressure, so that the electronic device 40 can be breathable and water-resistant in the daily scenario, and the electronic device 40 can operate safely and reliably in the high water pressure scenario.

Same as Embodiment 1, in Embodiment 7, status detection of the water-resistant assembly 43 may be implemented by using a magnetic field sensor and a magnet, and prompt information is sent based on a status detection result of the water-resistant assembly 43. The magnetic field sensor and the magnet may be mounted at appropriate positions. For example, the magnetic field sensor may be mounted in the housing space 42*a*, and the magnet may be mounted on one end that is of the switch lever 431*b* and that is far away from the switch plate 431*a*. And/or, status detection of the water-resistant assembly 43 may alternatively be implemented by using the microphone and the speaker (or by using a depth gauge), and prompt information is sent based on a status detection result of the water-resistant assembly 43. A specific principle is the same as that described above. Details are not described herein again.

In another embodiment, a status of the water-resistant assembly 43 may not be detected.

Embodiment 8

Figure 111:
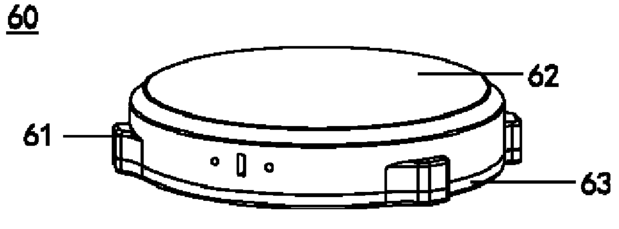
FIG. 111 is a schematic diagram of an assembly structure of an electronic device according to Embodiment 8.
Figure 112:
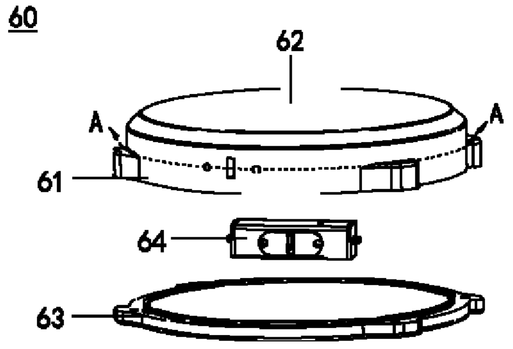
FIG. 112 is a schematic diagram of an exploded structure of the electronic device shown in FIG. 111.

As shown in FIG. 111 and FIG. 112, an electronic device 60 in Embodiment 8 may be, for example, a smartwatch, and the electronic device 60 may include a display 62, a housing 61, a housing 63, and a water-resistant assembly 64.

The display 62 and the housing 63 are respectively mounted on opposite sides of the housing 61. The display 62, the housing 61, and the housing 63 may enclose an inner cavity of the electronic device 60. A microphone, a speaker, a controller, a first water-resistant and breathable film, and a second water-resistant and breathable film may be mounted in the inner cavity of the electronic device 60. Specific positions of the microphone, the speaker, and the controller may be designed as required. The controller may be a central processing unit or a microcontroller unit (MCU). The first water-resistant and breathable film and the second water-resistant and breathable film may be mounted outside the water-resistant assembly 64 (further descriptions are provided below). The water-resistant assembly 64 may be mounted inside the housing 61.

Figure 113:
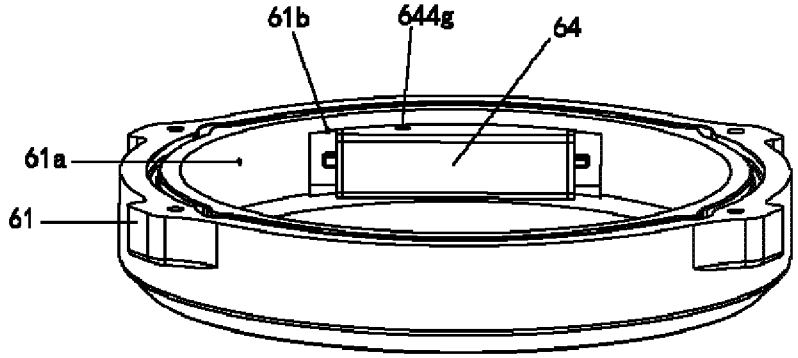
FIG. 113 is a schematic diagram of an assembly structure including a housing and a water-resistant assembly of the electronic device according to Embodiment 8.
Figure 114:
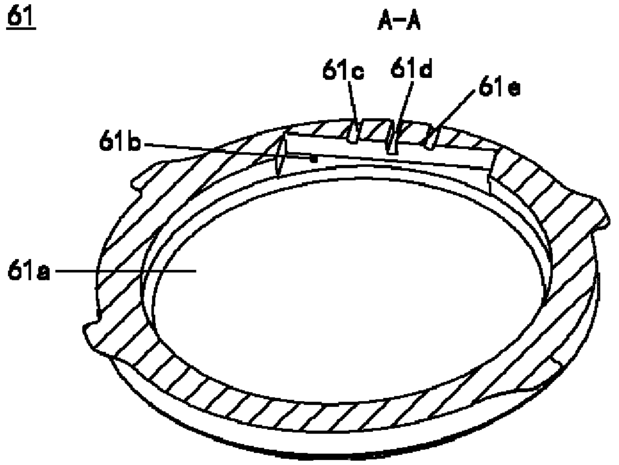
FIG. 114 is a schematic diagram of an A-A sectional structure of the housing shown in FIG. 112.

As shown in FIG. 113 and FIG. 114, the housing 61 may be roughly in a ring shape. The housing 61 has a housing space 61*a*, and the housing space 61*a* is a part of the inner cavity of the electronic device 60. A mounting groove 61*b* is provided on an inner surface of the housing 61, an opening of the mounting groove 61*b* faces an inner side of the housing space 61*a*, and the mounting groove 61*b* is connected to the housing space 61*a*. The water-resistant assembly 64 may be fastened to the mounting groove 61*b*, and a part of the water-resistant assembly 64 may be exposed from the mounting groove 61*b*. A first housing through hole 61*e*, a housing liquid inlet hole 61*d*, and a second housing through hole 61*c* may be further provided on a groove wall that is of the mounting groove 61*b* and that is far away from the opening of the mounting groove 61*b*. The first housing through hole 61*e* and the second housing through hole 61*c* may be respectively located on two sides of the housing liquid inlet hole 61*d*. The first housing through hole 61*e*, the housing liquid inlet hole 61*d*, and the second housing through hole 61*c* pass through the groove wall of the mounting groove 61*b*.

Figure 115:
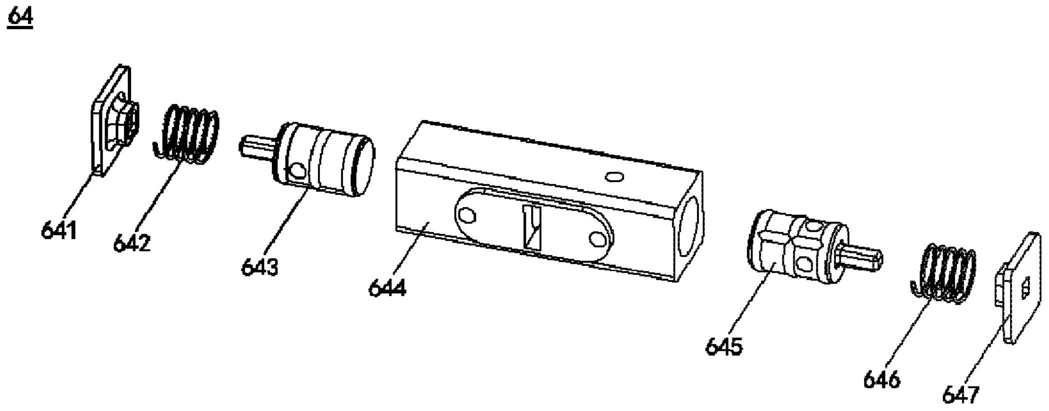
FIG. 115 is a schematic diagram of an exploded structure of the water-resistant assembly according to Embodiment 8.

As shown in FIG. 115, the water-resistant assembly 64 may include an accommodation housing 644, a first switch 643, a first elastic member 642, a first end cover 641, a second switch 645, a second elastic member 646, and a second end cover 647. Detailed descriptions are provided below.

Figure 116:
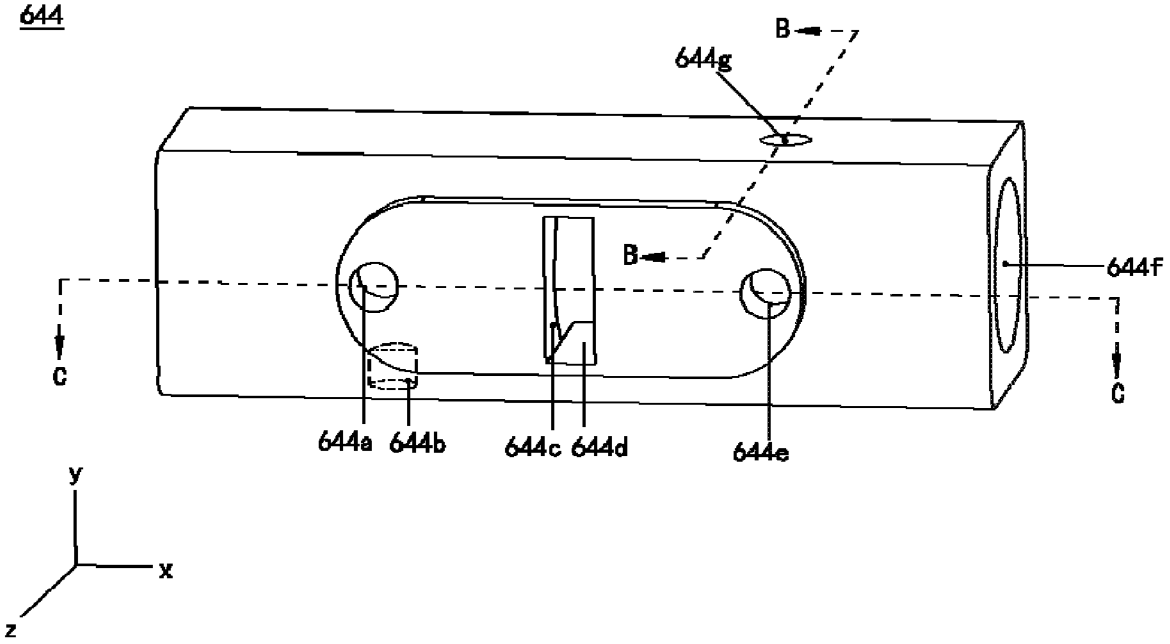
FIG. 116 is a schematic diagram of a structure of an accommodation housing in FIG. 115.
Figure 117:
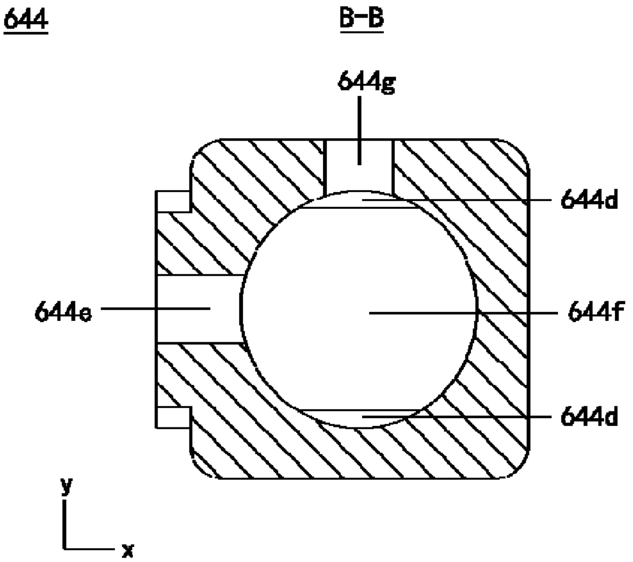
FIG. 117 is a schematic diagram of a B-B sectional structure of the accommodation housing shown in FIG. 116.

As shown in FIG. 116, the accommodation housing 644 may be roughly a hollow square cylinder. The accommodation housing 644 has an accommodation hole 644*f*. A center line of the accommodation hole 644*f* may be in an x-axis direction shown in FIG. 116, and two ends of the accommodation hole 644*f* pass through the accommodation housing 644. A limiting boss 644*d* is provided on an inner wall of the accommodation hole 644*f*. Because the limiting boss 644*d* has a small height, the limiting boss 644*d* may divide the accommodation hole 644*f* into two regions, but the two regions are connected. As shown in FIG. 117, there may be two limiting bosses 644*d*, and the two limiting bosses 644*d* may be symmetrically distributed and may be respectively located at two ends of one diameter (in a y-axis direction) of the accommodation hole 644*f*. In another embodiment, only one limiting boss may be provided.

As shown in FIG. 116, an accommodation housing liquid inlet hole 644*c*, a first accommodation housing through hole 644*a*, and a second accommodation housing through hole 644*e* are provided on one side of the accommodation housing 644. The first accommodation housing through hole 644*a* and the second accommodation housing through hole 644*e* are respectively located on two sides of the accommodation housing liquid inlet hole 644*c*. Center lines of the accommodation housing liquid inlet hole 644*c*, the first accommodation housing through hole 644*a*, and the second accommodation housing through hole 644*e* may be in a z-axis direction shown in FIG. 116. Each of the accommodation housing liquid inlet hole 644*c*, the first accommodation housing through hole 644*a*, and the second accommodation housing through hole 644*e* connects outside of the accommodation housing 644 to the accommodation hole 644*f*. The accommodation housing liquid inlet hole 644*c* may correspond to the two limiting bosses 644*d*, and projection of a top surface of each limiting boss 644*d* (a surface far away from the inner wall of the accommodation hole 644*f*) in the z-axis direction may fall within projection of the accommodation housing liquid inlet hole 644*c* in the z-axis direction.

As shown in FIG. 116 and FIG. 117, a fourth accommodation housing through hole 644*g* may be provided on an upper side of the accommodation housing 644, a center line of the fourth accommodation housing through hole 644*g* may be in the y-axis direction shown in FIG. 116, and the fourth accommodation housing through hole 644*g* connects the outside of the accommodation housing 644 to the accommodation hole 644*f*. The fourth accommodation housing through hole 644*g* and the second accommodation housing through hole 644*e* may be located on the right of the accommodation housing liquid inlet hole 644*c*.

Figure 118:
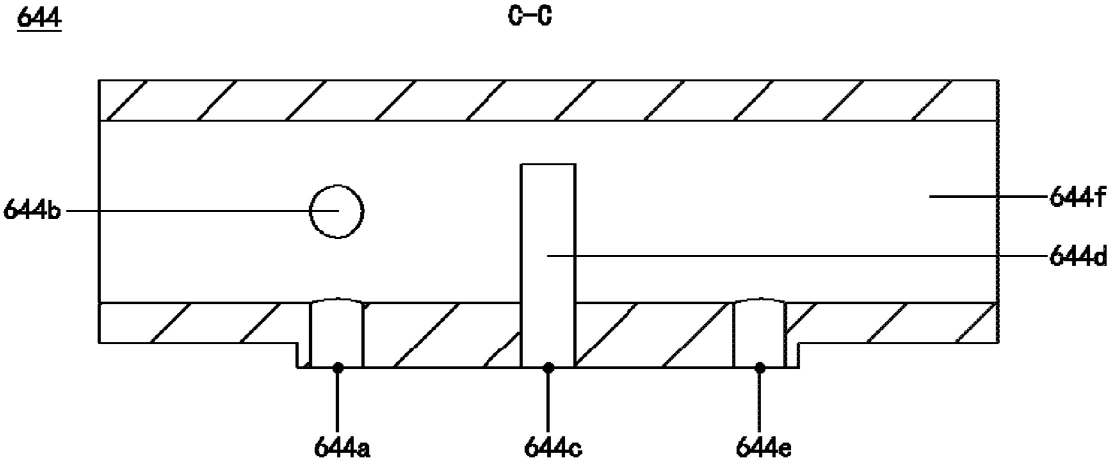
FIG. 118 is a schematic diagram of a C-C sectional structure of the accommodation housing shown in FIG. 116.

As shown in FIG. 116 and FIG. 118, a third accommodation housing through hole 644*b* may be provided on a lower side of the accommodation housing 644, a center line of the third accommodation housing through hole 644*b* may be in the y-axis direction shown in FIG. 116, and the third accommodation housing through hole 644*b* connects the outside of the accommodation housing 644 to the accommodation hole 644*f*. The third accommodation housing through hole 644*b* and the first accommodation housing through hole 644*a* may be located on the left of the accommodation housing liquid inlet hole 644*c*.

In Embodiment 8, structures of the first switch 643 and the second switch 645 may be consistent. The following uses the second switch 645 as an example for description.

Figure 119:
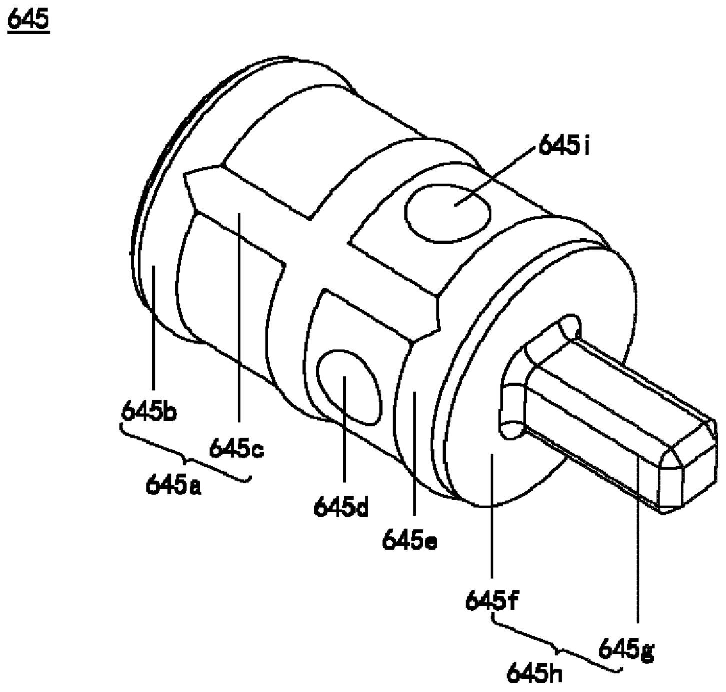
FIG. 119 is a schematic diagram of a structure of a second switch shown in FIG. 115.

As shown in FIG. 119, the second switch 645 may include a second switch guiding post 645*h* and a second sealing member 645*a*.

As shown in FIG. 119, the second switch guiding post 645*h* may include a second body part 645*f* and a second guiding part 645*g*. The second body part 645*f* may be roughly cylindrical. A second connection hole 645*d* and a fourth connection hole 645*i* may be provided in a circumferential surface of the second body part 645*f*. The second connection hole 645*d* and the fourth connection hole 645*i* may be connected, and center lines of the second connection hole 645*d* and the fourth connection hole 645*i* may vertically intersect. The second guiding part 645*g* may be roughly shaped like a rectangular post, and the second guiding part 645*g* may be connected to one bottom surface of the second body part 645*f*.

As shown in FIG. 119, the second sealing member 645*a* may be fastened to the circumferential surface of the second body part 645*f* and protrude relative to the circumferential surface of the second body part 645*f*. The second sealing member 645*a* may include a plurality of circumferential parts 645*b* and a plurality of axial parts 645*c*. A quantity of circumferential parts 645*b* and axial parts 645*c* may be designed as required. For example, there are three circumferential parts 645*b* and two axial parts 645*c*. The circumferential parts 645*b* surround the second body part 645*f* in a circumferential direction, and adjacent circumferential parts 645*b* are spaced apart. The axial parts 645*c* extend in an axial direction of the second body part 645*f*, and adjacent axial parts 645*c* are spaced apart. Each axial part 645*c* is cross-connected to all of the circumferential parts 645*b*. Therefore, all of the axial parts 645*c* are longitudinally crossed with all of the circumferential parts 645*b*, and a plurality of regions are separated on the circumferential surface of the second body part 645*f*. In this embodiment, each region may be referred to as a sealing region. An opening of the second connection hole 645*d* is located in one sealing region, and an opening of the fourth connection hole 645*i* is located in another adjacent sealing region.

The second sealing member 645*a* may be made of an elastic sealing material, for example, rubber or silica gel.

As shown in FIG. 115, the first elastic member 642 and the second elastic member 646 each may be a spring. In another embodiment, the spring may alternatively be replaced by another component that can provide an elastic force.

In Embodiment 8, structures of the first end cover 641 and the second end cover 647 may be consistent. The following uses the first end cover 641 as an example for description.

Figure 120:
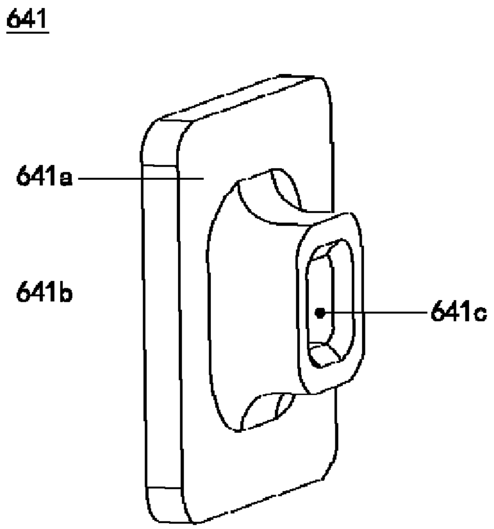

As shown in FIG. 120, the first end cover 641 may include a cover plate 641*a* and a matching part 641*b* convexly disposed on the cover plate 641. The first end cover 641 may further have a through hole 641*c*, and the through hole 641*c* may pass through the cover plate 641 and the matching part 641*b*.

Figure 121:
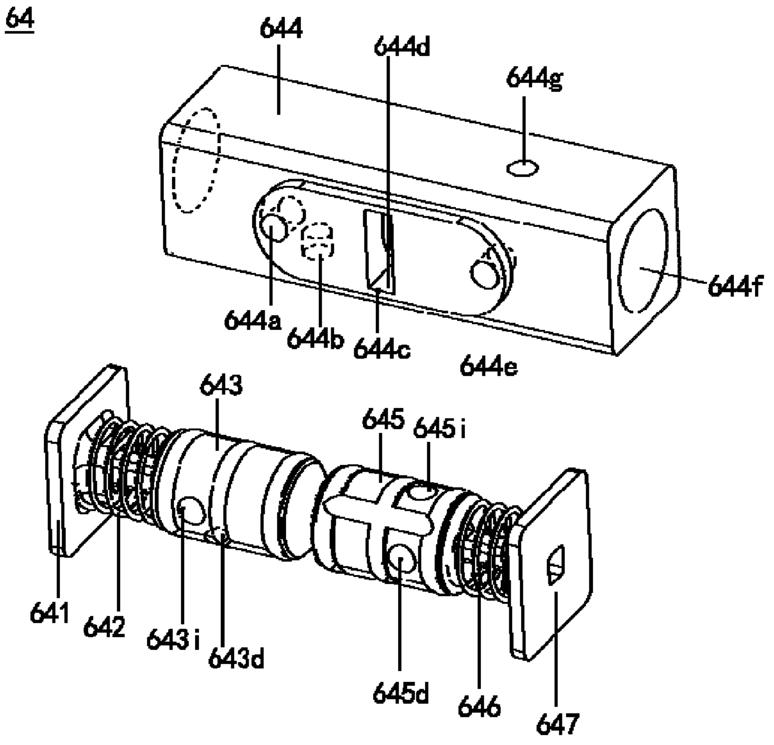

FIG. 121 is a schematic diagram of an exploded structure of the water-resistant assembly 64. To clearly express a positional relationship between the accommodation housing 644 and other components, components other than the accommodation housing 644 are displayed in an assembly manner, and the accommodation housing 644 is displayed in an exploded manner.

As shown in FIG. 121, both the first switch 643 and the second switch 645 may be mounted in the accommodation hole 644*f* of the accommodation housing 644, and are respectively located on two sides of the limiting boss 644*d*. The limiting boss 644*d* may play a limiting function in the first switch 643 and the second switch 645. A first body part in the first switch 643 and a second body part in the second switch 645 may be disposed oppositely, and a first guiding part in the first switch 643 and a second guiding part in the second switch 645 may be disposed back to back. Both a first sealing member in the first switch 643 and the second sealing member in the second switch 645 may be in sliding contact with the inner wall of the accommodation hole 644*f*.

Refer to FIG. 121. A first connection hole 643*i* in the first switch 643 may be connected to the first accommodation housing through hole 644*a*, and center lines of the first connection hole 643*i* and the first accommodation housing through hole 644*a* may basically coincide. A third connection hole 643*d* in the first switch 643 may be connected to the third accommodation housing through hole 644*b*, and center lines of the third connection hole 643*d* and the third accommodation housing through hole 644*b* may basically coincide. Similarly, the second connection hole 645*d* in the second switch 645 may be connected to the second accommodation housing through hole 644*e*, and center lines of the second connection hole 645*d* and the second accommodation housing through hole 644*e* may basically coincide. The fourth connection hole 645*i* in the second switch 645 may be connected to the fourth accommodation housing through hole 644*g*, and center lines of the fourth connection hole 645*i* and the fourth accommodation housing through hole 644*g* may basically coincide.

Refer to FIG. 121. The first end cover 641 is fastened to a left end of the accommodation housing 644. With reference to FIG. 120 and FIG. 121, the cover plate 641*a* in the first end cover 641 covers a left opening of the accommodation hole 644*f*, and the matching part 641*b* in the first end cover 641 extends into the accommodation hole 644*f*. The first elastic member 642 may be sleeved on a periphery of the matching part 641*b*, one end of the first elastic member 642 may abut against the cover plate 641*a*, and the other end may abut against the first body part in the first switch 643. Similarly, the second end cover 647 is fastened to a right end of the accommodation housing 644. A cover plate in the second end cover 647 covers a right opening of the accommodation hole 644*f*, and a matching part in the second end cover 647 extends into the accommodation hole 644*f*. The second elastic member 646 may be sleeved on a periphery of the matching part in the second end cover 647, one end of the second elastic member 646 may abut against the cover plate in the second end cover 647, and the other end may abut against the second body part in the second switch 645.

Figure 122:
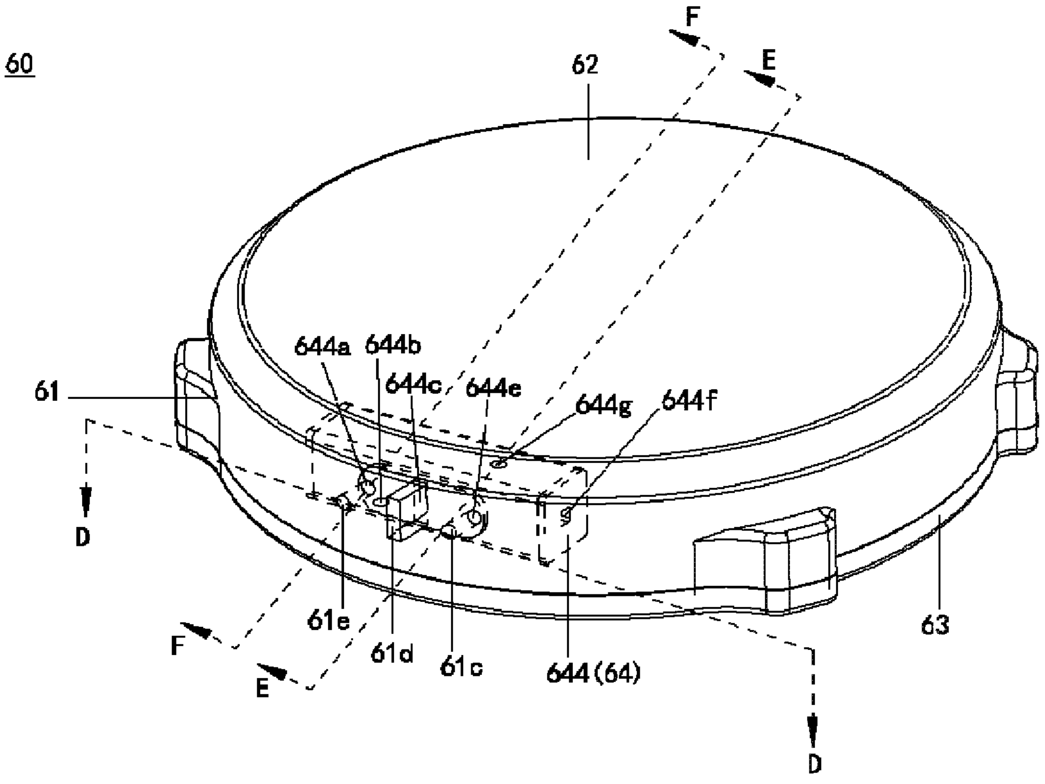
Figure 123:
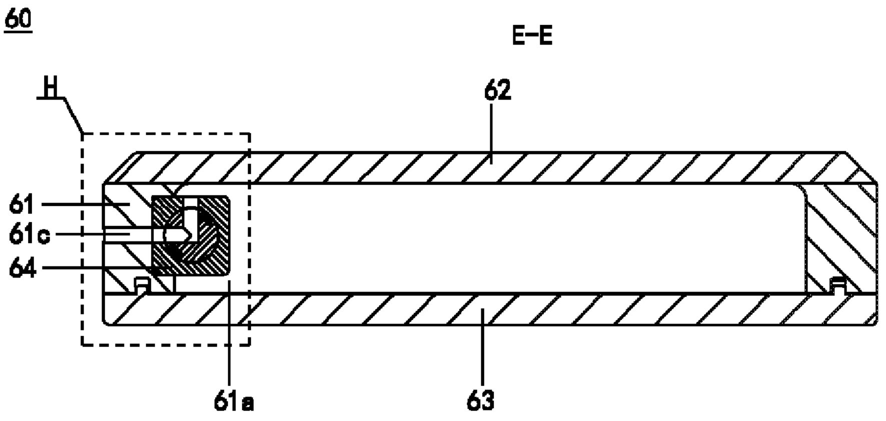
Figure 124:
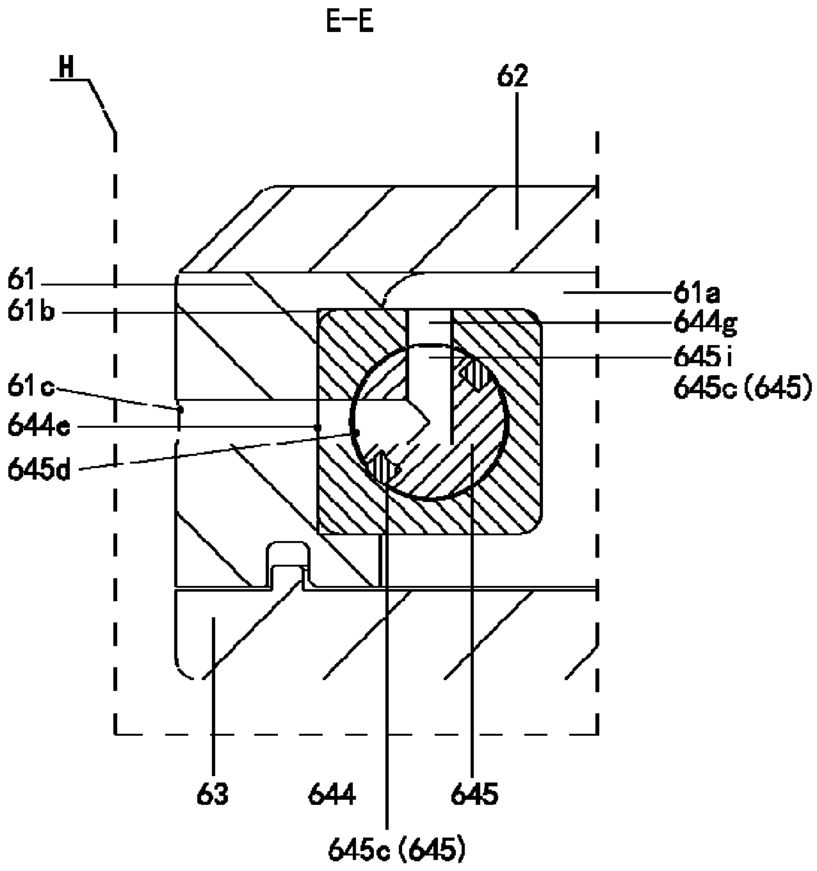
Figure 125:
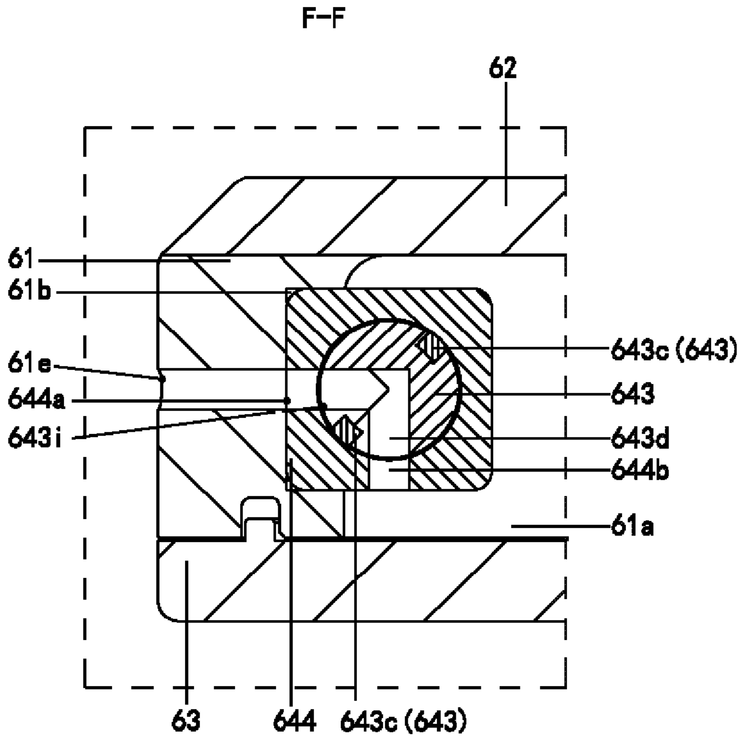

FIG. 122 may represent an assembly structure including the water-resistant assembly 64 and the housing 61. The water-resistant assembly 64 located in the housing 61 is shown by a dashed line. FIG. 123 is an E-E sectional view of the structure shown in FIG. 122, and FIG. 124 is a partial enlarged view at a position H in FIG. 123. FIG. 125 is a partial enlarged view of an F-F sectional structure of FIG. 122.

With reference to FIG. 113 and as described above, a part of the accommodation housing 644 is fastened to the mounting groove 61*b* of the housing 61. With reference to FIG. 113 and FIG. 124, a part that is of the accommodation housing 644 and that is provided with the fourth accommodation housing through hole 644*g* may be exposed outside the mounting groove 61*b* and located in the housing space 61*a* of the housing 61. As shown in FIG. 125, a part that is of the accommodation housing 644 and that is provided with the third accommodation housing through hole 644*b* may be exposed outside the mounting groove 61*b* and located in the housing space 61*a* of the housing 61. Therefore, both the fourth accommodation housing through hole 644*g* and the third accommodation housing through hole 644*b* are connected to the housing space 61*a*.

Refer to FIG. 125. For example, the first water-resistant and breathable film may be fastened to a lower surface of the accommodation housing 644, and block an opening of the third accommodation housing through hole 644*b*. For example, a first microphone may be disposed close to the first water-resistant and breathable film. Refer to FIG. 124. For example, the second water-resistant and breathable film may be fastened to an upper surface of the accommodation housing 644, and block an opening of the fourth accommodation housing through hole 644*g*. For example, the microphone may be disposed close to the second water-resistant and breathable film.

Figure 126:
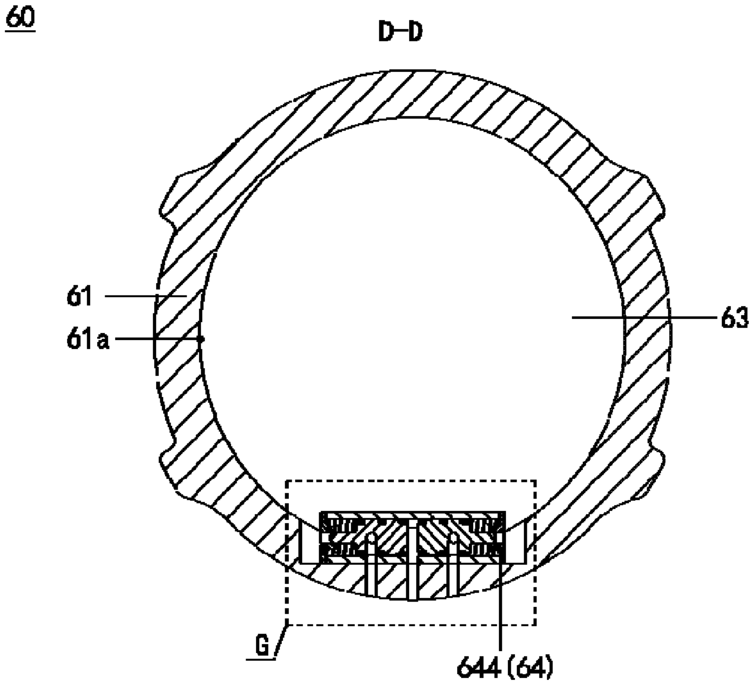
Figure 127:
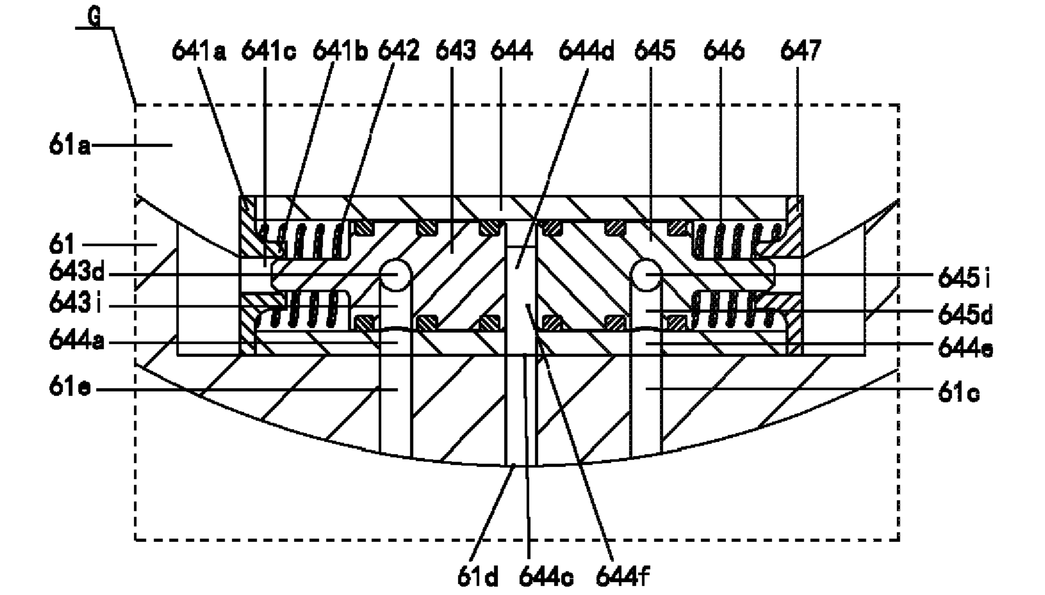

FIG. 126 is a D-D sectional view of FIG. 122, and FIG. 127 is a schematic diagram of a partially enlarged structure at a position G in FIG. 126. As shown in FIG. 127, the first housing through hole 61*e* is connected to the first accommodation housing through hole 644*a*, and center lines of the first housing through hole 61*e* and the first accommodation housing through hole 644*a* may basically coincide. The housing liquid inlet hole 61*d* is connected to the accommodation housing liquid inlet hole 644*c*, and the accommodation housing liquid inlet hole 644*c* is connected to the accommodation hole 644*f*. The second housing through hole 61*c* is connected to the second accommodation housing through hole 644*e*, and center lines of the second housing through hole 61*c* and the second accommodation housing through hole 644*e* may basically coincide.

Based on the foregoing descriptions and with reference to FIG. 125 and FIG. 127, it can be learned that the first housing through hole 61*e*, the first accommodation housing through hole 644*a*, the first connection hole 643*i*, the third connection hole 643*d*, and the third accommodation housing through hole 644*b* are sequentially connected to form a first channel. The first channel connects outside of the electronic device 60 to the housing space 61*a*. The first channel may serve as, for example, an air pressure balancing channel of the speaker. Similarly, based on the foregoing descriptions and with reference to FIG. 124 and FIG. 127, it can be learned that the second housing through hole 61*c*, the second accommodation housing through hole 644*e*, the second connection hole 645*d*, the fourth connection hole 645*i*, and the fourth accommodation housing through hole 644*g* are sequentially connected to form a second channel. The second channel connects the outside of the electronic device 60 to the housing space 61*a*. For example, the second channel may serve as a sound pickup channel of the microphone.

In Embodiment 8, it may be considered that the water-resistant assembly 64 in FIG. 121 to FIG. 127 is in a turned-on state. In the turned-on state, when the electronic device 60 operates in a daily scenario, a sound from the outside of the electronic device 60 may enter the electronic device 60 through the second channel and be picked up by the microphone. External air can also enter the electronic device 60 through the first channel, to balance air pressure inside and outside the electronic device 60. Because the first water-resistant and breathable film and the second water-resistant and breathable film exist, external liquid cannot enter the electronic device 60, so that the electronic device 60 can be breathable and water-resistant in the daily scenario.

When the electronic device 60 enters a high water pressure scenario, as shown in FIG. 127, liquid sequentially enters the housing liquid inlet hole 61*d*, the accommodation housing liquid inlet hole 644*c*, and the accommodation hole 644*f*. The liquid entering the accommodation hole 644*f* respectively pushes the first switch 643 to the left and the second switch 645 to the right, so that the first connection hole 643*i* is gradually displaced from the first accommodation housing through hole 644*a*, and the second connection hole 645*d* is gradually displaced from the second accommodation housing through hole 644*e*. During movement of the first switch 643 and the second switch 645, the first elastic member 642 and the second elastic member 646 are gradually compressed.

Figure 128:
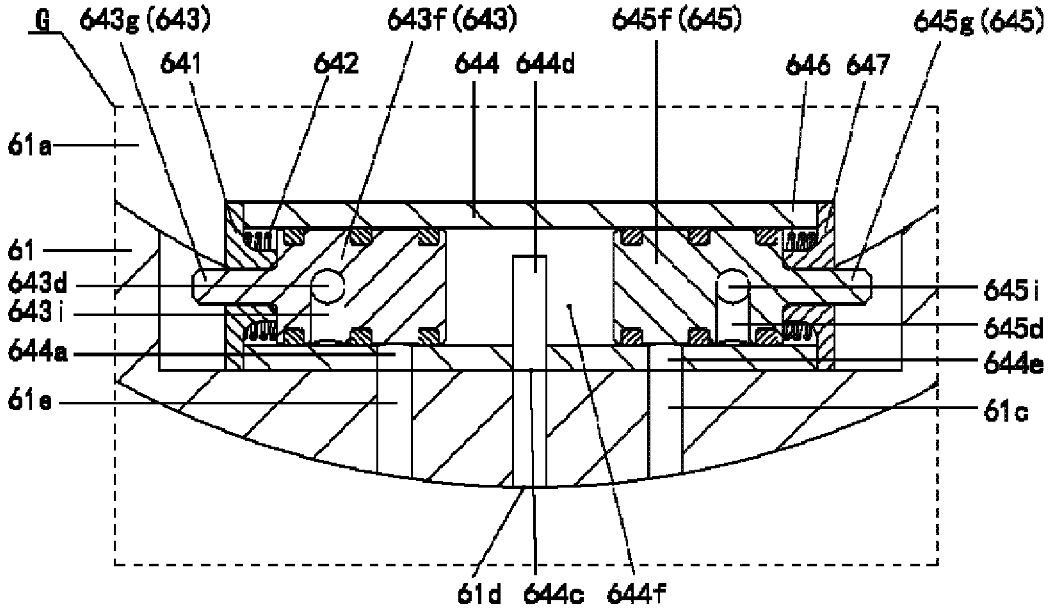
Figure 129:
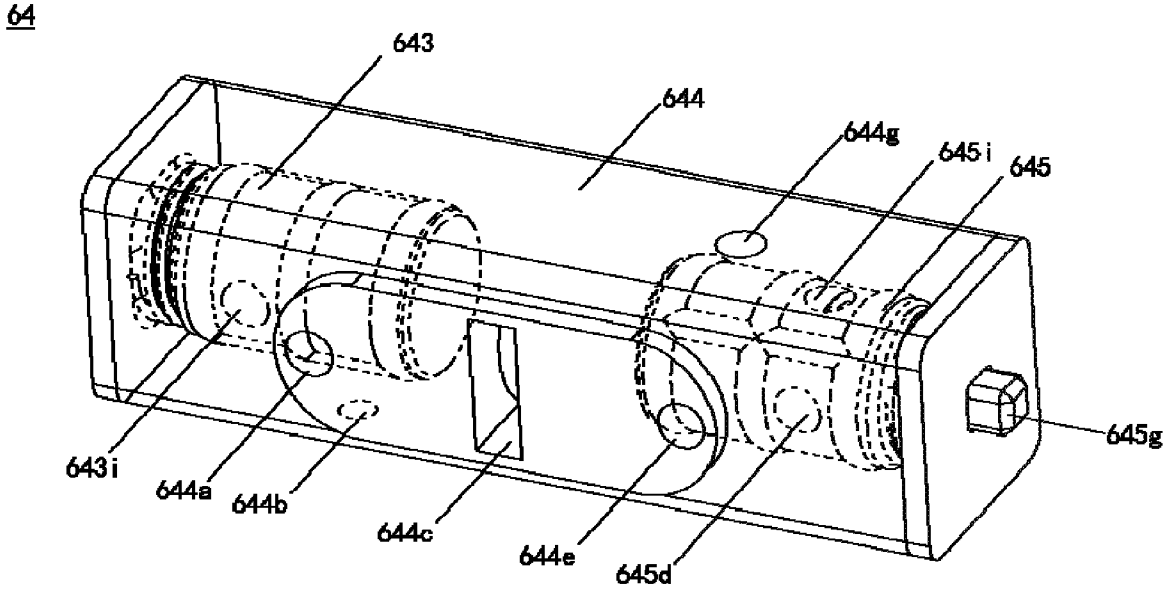

A same view representation is used in FIG. 128 and FIG. 127. FIG. 128 is a sectional view of a status of the water-resistant assembly 64, where the status is displayed after the first switch 643 moves to a left limit position and the second switch 645 moves to a right limit position. FIG. 129 is a perspective view of a status of the water-resistant assembly 64 in FIG. 128.

As shown in FIG. 128 and FIG. 129, after the first switch 643 moves to the left limit position, a first guiding part 643*g* of the first switch 643 may pass through the first end cover 641, and a first body part 643*f* of the first switch 643 may press against the first end cover 641. The first connection hole 643*i* is completely displaced from the first accommodation housing through hole 644*a*, and projection of the first accommodation housing through hole 644*a* in a direction of the center line of the first accommodation housing through hole 644*a* and the first connection hole 643*i* are respectively located in different sealing regions of the first switch 643. In addition, the projection of the first accommodation housing through hole 644*a* in the direction of the center line of the first accommodation housing through hole 644*a* and projection of the third accommodation housing through hole 644*b* in a direction of the center line of the third accommodation housing through hole 644*b* also fall into different sealing regions of the first switch 643. For ease of description below, a sealing region into which the projection of the first accommodation housing through hole 644*a* in the direction of the center line of the first accommodation housing through hole 644*a* falls may be referred to as a first sealing region.

Similarly, as shown in FIG. 128 and FIG. 129, after the second switch 645 moves to the right limit position, the second guiding part 645*g* of the second switch 645 may extend out of the second end cover 647, and the second body part 645*f* of the second switch 645 may press against the second end cover 647. The second connection hole 645*d* is completely displaced from the second accommodation housing through hole 644*e*, and projection of the second accommodation housing through hole 644*e* in a direction of the center line of the second accommodation housing through hole 644*e* and the second connection hole 645*d* are respectively located in different sealing regions of the second switch 645. In addition, the projection of the second accommodation housing through hole 644*e* in the direction of the center line of the second accommodation housing through hole 644*e* and projection of the fourth accommodation housing through hole 644*g* in a direction of the center line of the fourth accommodation housing through hole 644*g* also fall into different sealing regions of the second switch 645. For ease of description below, a sealing region into which the projection of the second accommodation housing through hole 644*e* in the direction of the center line of the second accommodation housing through hole 644*e* falls may be referred to as a second sealing region.

With reference to FIG. 128 and FIG. 129, after liquid enters the first accommodation housing through hole 644*a* through the first housing through hole 61*e*, the liquid enters the first sealing region. A sealing material surrounding the first sealing region obstructs flow paths of the liquid in all directions, so that the liquid can only stay in the first sealing region, but cannot penetrate into the first connection hole 643*i* and the third accommodation housing through hole 644*b*, and therefore cannot enter the housing space 61*a*. In other words, the first channel is obstructed so that the liquid cannot enter the housing space 61*a* along the first channel.

Similarly, with reference to FIG. 128 and FIG. 129, after liquid enters the second accommodation housing through hole 644*e* through the second housing through hole 61*c*, the liquid enters the second sealing region. A sealing material surrounding the second sealing region obstructs flow paths of the liquid in all directions, so that the liquid can only stay in the second sealing region, but cannot penetrate into the second connection hole 645*d* and the fourth accommodation housing through hole 644*g*, and therefore cannot enter the housing space 61*a*. In other words, the second channel is obstructed so that the liquid cannot enter the housing space 61*a* along the second channel.

In a state shown in FIG. 128 and FIG. 129, the water-resistant assembly 64 is in a turned-off state. In the turned-off state, both the first channel and the second channel are obstructed, and the outside of the housing 61 is disconnected from the housing space 61*a*, so that the external liquid cannot enter the electronic device 60. The first connection hole 643*i* is displaced from the first accommodation housing through hole 644*a* under hydraulic pressure, the second connection hole 645*d* is displaced from the second accommodation housing through hole 644*e* under hydraulic pressure, and a penetration path of the liquid is blocked by using the sealing region to block a large amount of high-pressure liquid, so that the first water-resistant and breathable film and the second water-resistant and breathable film do not need to withstand high pressure, and therefore are not prone to damage. Therefore, the electronic device 60 can operate reliably in the high water pressure scenario.

It can be understood that, after the electronic device 60 leaves the high water pressure scenario and enters a daily scenario, the first switch 643 and the second switch 645 automatically restore to be in contact with the limiting boss 644*d*, and the water-resistant assembly 64 automatically restores to the turned-on state.

To sum up, the water-resistant assembly 64 of the electronic device 60 can automatically switch between the turned-on state and the turned-off state under different pressure, so that the electronic device 60 can be breathable and water-resistant in the daily scenario, and the electronic device 60 can operate safely and reliably in the high water pressure scenario.

Same as Embodiment 1, in Embodiment 8, status detection of the water-resistant assembly 64 may be implemented by using a magnetic field sensor and a magnet, and prompt information is sent based on a status detection result of the water-resistant assembly 64. The magnetic field sensor and the magnet may be mounted at appropriate positions. For example, the magnetic field sensor may be mounted in the housing space 61*a*, and the magnet may be mounted on the first switch 643 and/or the second switch 645. And/or, status detection of the water-resistant assembly 64 may alternatively be implemented by using the microphone and the speaker (or by using a depth gauge), and prompt information is sent based on a status detection result of the water-resistant assembly 64. A specific principle is the same as that described above. Details are not described herein again.

In another embodiment, a status of the water-resistant assembly 64 may not be detected.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A water-resistant assembly of an electronic device, wherein the water-resistant assembly is mounted to a housing of the electronic device, and the housing has a housing through hole that connects inside to outside of the housing;

the water-resistant assembly comprises a switch, a clamping bar, a sealing member, and an elastic member; after the water-resistant assembly is mounted to the housing, the switch, the clamping bar, the sealing member, and the elastic member are sequentially disposed from the outside to the inside of the housing; two ends of the elastic member respectively press against the clamping bar and the housing; and the sealing member, the housing through hole, and a water-resistant and breathable film on a side that is of the housing through hole and that is far away from the sealing member are disposed opposite to each other; and the switch is capable of moving in a first direction under an external force, so that the clamping bar moves in a second direction under a joint action of the switch and the elastic member, so as to drive the sealing member to approach and block the housing through hole or keep the sealing member away from the housing through hole.

2. The water-resistant assembly according to claim 1, wherein the first direction is perpendicular or parallel to the second direction; and the switch is capable of moving in the first direction under the external force.

3. The water-resistant assembly according to claim 2, wherein the first direction is perpendicular to the second direction; and the clamping bar has a clamping bar slope, and the switch is in sliding contact with the clamping bar slope.

4. The water-resistant assembly according to claim 3, wherein the clamping bar has a limiting groove; and based on the switch being translated to a first limit position in the first direction, the sealing member approaches and blocks the housing through hole, and the switch is clamped into the limiting groove, so that the switch is locked at the first limit position.

5. The water-resistant assembly according to claim 3, wherein the water-resistant assembly comprises a limiting post, and the limiting post is mounted to the housing; and a limiting groove is provided on a surface that is of the switch and that faces the limiting post; and based on the switch being translated to a first limit position in the first direction, the sealing member approaches and blocks the housing through hole, and the limiting groove is clamped with the limiting post, so that the switch is locked at the first limit position.

6. The water-resistant assembly according to claim 5, wherein after the limiting post is mounted to the housing, the limiting post is capable of moving relative to the housing in the second direction; and in a process in which the switch is translated to the first limit position in the first direction, the switch is capable of pressing the limiting post toward the housing until the limiting groove is clamped with the limiting post.

7. The water-resistant assembly according to claim 6, wherein the water-resistant assembly comprises a loading frame and a limiting post elastic member;

the loading frame is mounted to the housing, and is located between the housing and the switch; and the loading frame has an accommodation groove, a bottom wall of the accommodation groove faces the switch, and an accommodation through hole connected to the accommodation groove is provided in the bottom wall;

the limiting post comprises a post body and a limiting skirt that surrounds an outer circumferential surface of the post body, a part of the post body is accommodated in the accommodation groove, one end of the post body is exposed from the accommodation through hole, and the limiting skirt is accommodated in the accommodation groove and is in contact with the bottom wall;

the limiting post elastic member is located in the accommodation groove, and the limiting post elastic member presses against the limiting skirt and applies an elastic force to the limiting skirt; and in the process in which the switch is translated to the first limit position in the first direction, the switch is capable of squeezing the end, to press the limiting post toward the housing until the limiting groove is clamped with the end.

8. The water-resistant assembly according to claim 3, wherein the switch has a switch slope, and the switch slope is in sliding contact with the clamping bar slope.

9. The water-resistant assembly according to claim 1, wherein the switch is capable of rotating in the first direction under the external force, and the clamping bar is in sliding contact with the switch.

10. The water-resistant assembly according to claim 9, wherein the switch has a cam surface, cam radii of positions on the cam surface are different, and the cam surface is in sliding contact with the clamping bar; and in a process in which the switch rotates in the first direction, the cam radii of the positions that are on the cam surface and that are in sequential contact with the clamping bar gradually increase, so that the sealing member approaches and blocks the housing through hole;

or the cam radii of the positions that are on the cam surface and that are in sequential contact with the clamping bar gradually decrease, so that the sealing member is far away from the housing through hole.

11. The water-resistant assembly according to claim 10, wherein the water-resistant assembly comprises a bracket and a pin shaft; a partial region of the bracket is hollowed out to form an accommodation space, and the bracket is fastened to the housing; and the pin shaft passes through the accommodation space and is fastened to the bracket, and the pin shaft passes through the switch and is rotatably connected to the switch; and based on the switch rotating in the first direction to a limit position, the switch is in contact with the bracket, and a position that is on the switch and in contact with the bracket and a position that is on the switch and in contact with the clamping bar are respectively located on two sides of the pin shaft.

12. The water-resistant assembly according to claim 1, wherein based on the switch moving in the first direction until the sealing member is enabled to approach and block the housing through hole, at least a part of a projection of a force-bearing position on the clamping bar along a center line of the housing through hole falls into the housing through hole, wherein a force is exerted on the force-bearing position to cause the clamping bar to move in the second direction.

13. The water-resistant assembly according to claim 1, wherein the water-resistant assembly comprises the bracket, and the bracket is fastened to the housing, to mount the entire water-resistant assembly to the housing.

14. A water-resistant assembly of an electronic device, wherein the water-resistant assembly is mounted to a housing of the electronic device, wherein the housing has a housing through hole, and the housing through hole is connected to inside of the housing through a water-resistant and breathable film;

the water-resistant assembly comprises a tube, a switch, and a switch sealing ring; the tube has a tube inner cavity and a tube connection hole connected to the tube inner cavity; the switch is capable of being movably mounted into the tube inner cavity, and the switch has a switch connection hole connected to outside of the switch; and the switch sealing ring is fastened to a periphery of the switch, is located in the tube inner cavity, and presses against a cavity wall of the tube inner cavity; and after the water-resistant assembly is mounted to the housing, the tube connection hole is connected to one end that is of the housing through hole and that is far away from the water-resistant and breathable film; and the switch is configured to move relative to the tube under an external force, so that the switch connection hole is connected to the tube connection hole, or the switch connection hole is displaced from the tube connection hole and the switch sealing ring is blocked between the switch connection hole and the tube connection hole.

15. The water-resistant assembly according to claim 14, wherein the switch has an axial switch connection hole and a radial switch connection hole, the axial switch connection hole intersects the radial switch connection hole, and the axial switch connection hole is connected to the radial switch connection hole and the outside of the switch; and the switch is configured to move relative to the tube under the external force, so that the radial switch connection hole is connected to the tube connection hole, or the radial switch connection hole is displaced from the tube connection hole and the switch sealing ring is blocked between the radial switch connection hole and the tube connection hole.

16. The water-resistant assembly according to claim 15, wherein the tube is shaped as a rotary body, the tube includes a first matching groove, a second matching groove, and a third matching groove that are sequentially connected, the first matching groove, the second matching groove, and the third matching groove are connected in an L shape, the first matching groove extends in an axial direction of the tube, the second matching groove extends in a circumferential direction of the tube, and the switch has a matching protrusion;

in a process in which the switch is configured to move to a first limit position relative to the tube, the matching protrusion sequentially moves in the third matching groove, the second matching groove, and the first matching groove; and in a process in which the switch moves in a reverse direction to a second limit position relative to the tube, the matching protrusion sequentially moves in the first matching groove, the second matching groove, and the third matching groove; and based on the switch being located at the first limit position, the radial switch connection hole is displaced from the tube connection hole, and the switch sealing ring is blocked between the radial switch connection hole and the tube connection hole; and based on the switch being located at the second limit position, the radial switch connection hole is connected to the tube connection hole.

17. The water-resistant assembly according to claim 16, wherein the tube comprises a head and a tube body that are connected, the head and the tube body enclose the tube inner cavity, the first matching groove, the second matching groove, and the third matching groove are provided on the head, the tube connection hole is provided in the tube body, the tube body is configured to pass through and be fastened to the housing, and the head is located outside the housing.

18. The water-resistant assembly according to claim 17, wherein the water-resistant assembly comprises a tube sealing ring, and the tube sealing ring is configured to seal a gap between the head and the housing.

19. The water-resistant assembly according to claim 17, wherein an accommodation groove is provided at one end that is of the tube body and that is far away from the head, and the accommodation groove is a part of the tube inner cavity;

the water-resistant assembly comprises a switch limiting member, the switch limiting member is fastened to a part that is of the switch and that is close to the accommodation groove, and the switch limiting member protrudes from an outer circumferential surface of the switch; and based on the switch moving to the first limit position, the switch limiting member presses against a bottom wall of the accommodation groove; and based on the switch moving to the second limit position, a part of the switch is located in the accommodation groove, and the switch limiting member is spaced from the bottom wall of the accommodation groove.

20. The water-resistant assembly according to claim 14, wherein the water-resistant assembly comprises an elastic member, and two opposite ends of the elastic member respectively press against the switch and the tube.

* * * * *